(12) United States Patent
Suzuki

(10) Patent No.: US 6,906,363 B2
(45) Date of Patent: Jun. 14, 2005

(54) SEMICONDUCTOR DEVICE AND METHOD OF FABRICATING SAME

(75) Inventor: Hisamitsu Suzuki, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 344 days.

(21) Appl. No.: 10/156,408

(22) Filed: May 28, 2002

(65) Prior Publication Data

US 2004/0195586 A1 Oct. 7, 2004

(30) Foreign Application Priority Data

May 25, 2001 (JP) ........................................ 2001-157313

(51) Int. Cl.[7] ........................ H01L 29/80; H01L 31/112
(52) U.S. Cl. ........................ 257/273; 257/370; 257/378
(58) Field of Search .............................. 257/197, 205, 257/350, 361, 273, 370, 374, 378

(56) References Cited

U.S. PATENT DOCUMENTS

| 4,892,837 A | 1/1990 | Kudo |
| 6,476,452 B2 * | 11/2002 | Suzuki ........................ 257/378 |

FOREIGN PATENT DOCUMENTS

| EP | 0 349 107 | 1/1990 |
| EP | 0 409 370 | 1/1991 |
| JP | 51-49889 | 12/1976 |
| JP | 4-022133 | 1/1992 |
| JP | 5-160141 | 6/1993 |
| JP | 5-198526 | 8/1993 |
| JP | 6-077241 | 3/1994 |
| JP | 2002-252294 | 9/2000 |
| JP | 2001-118858 | 4/2001 |

OTHER PUBLICATIONS

European Search Report dated Nov. 25, 2004.

* cited by examiner

*Primary Examiner*—Hoai Pham
(74) *Attorney, Agent, or Firm*—Katten Muchin Zavis Rosenman

(57) ABSTRACT

A semiconductor device raises the maximum oscillation frequency $f_{max}$ of the bipolar transistor. The stopper dielectric layer is formed on the substrate to cover the transistor section and the isolation dielectric. The interlayer dielectric layer is formed on the stopper dielectric layer. The base contact plug, which is formed in the interlayer dielectric layer, is located over the isolation dielectric in such a way as to contact the graft base region near its bottom end corner. Therefore, the base contact needs not to entirely overlap with the graft base region, which means that the graft base region can be narrowed without increasing the base resistance $R_b$ and that the collector-base capacitance $C_{cb}$ is reduced. Also, electrical short circuit between the graft base region and the collector region can be effectively suppressed by the stopper dielectric layer.

10 Claims, 43 Drawing Sheets

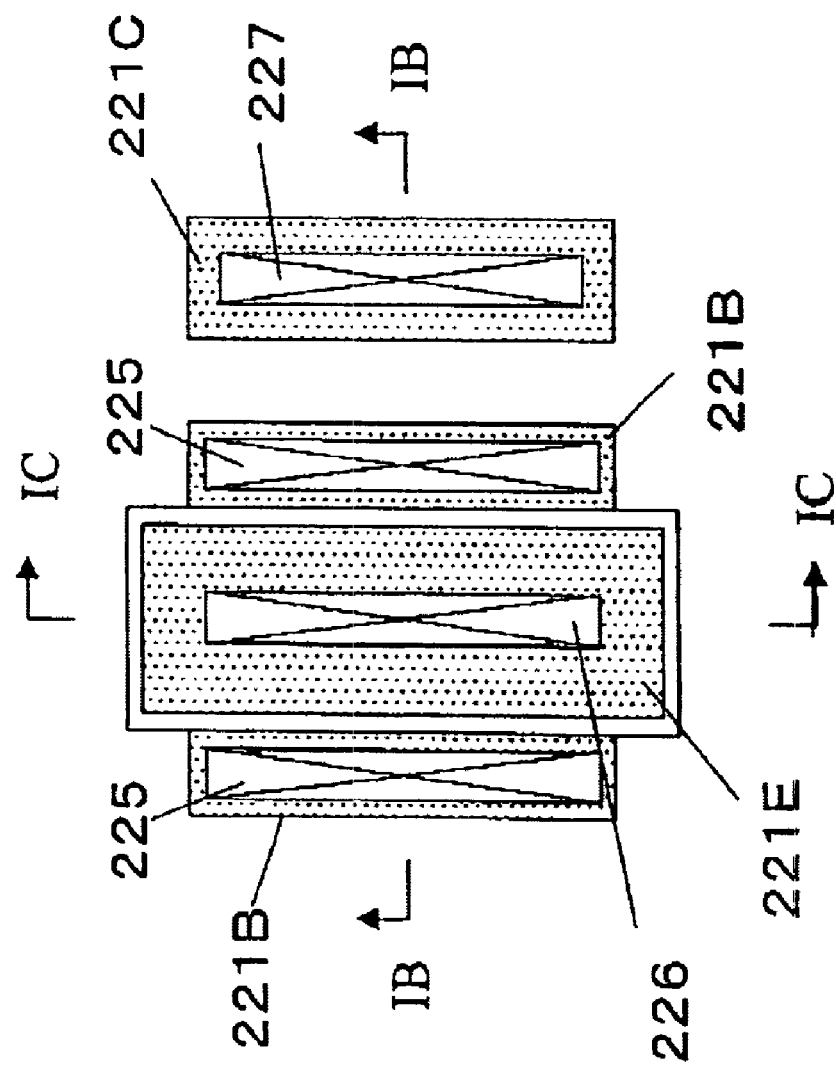

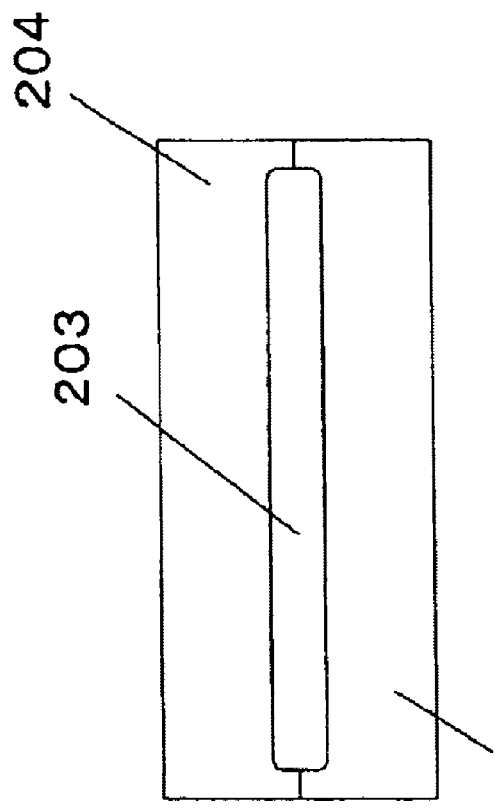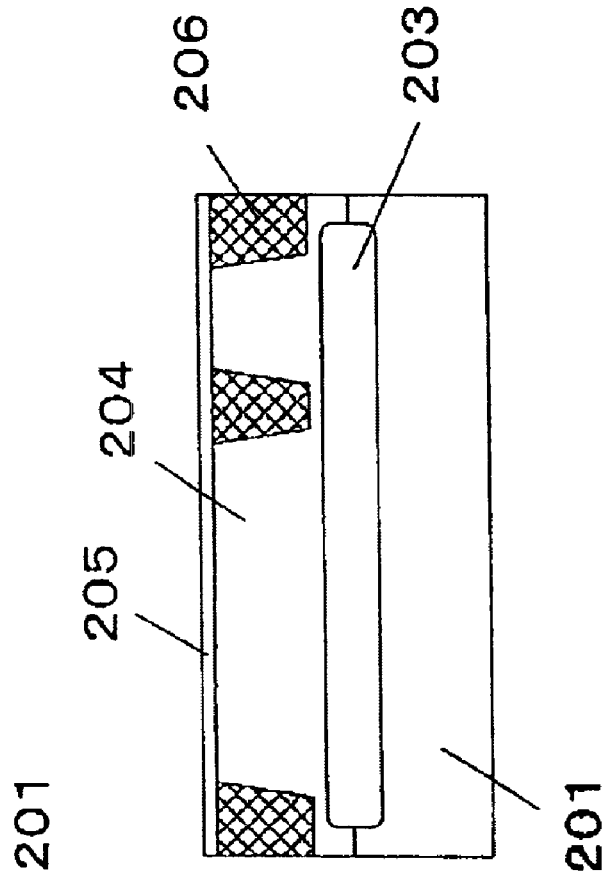
FIG. 2A PRIOR ART
FIG. 2B PRIOR ART

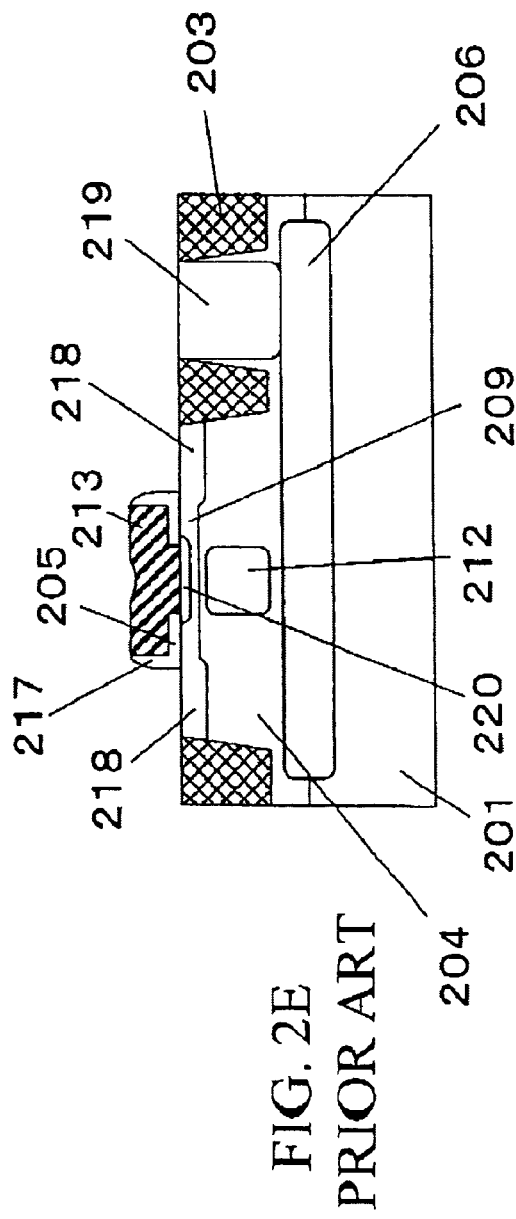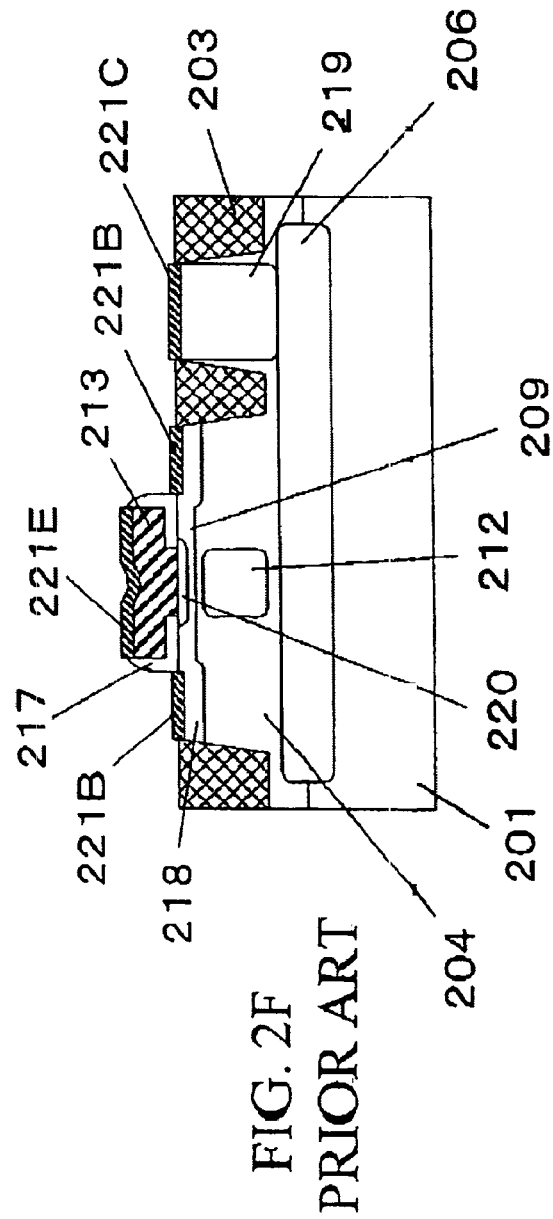
FIG. 2E PRIOR ART
FIG. 2F PRIOR ART

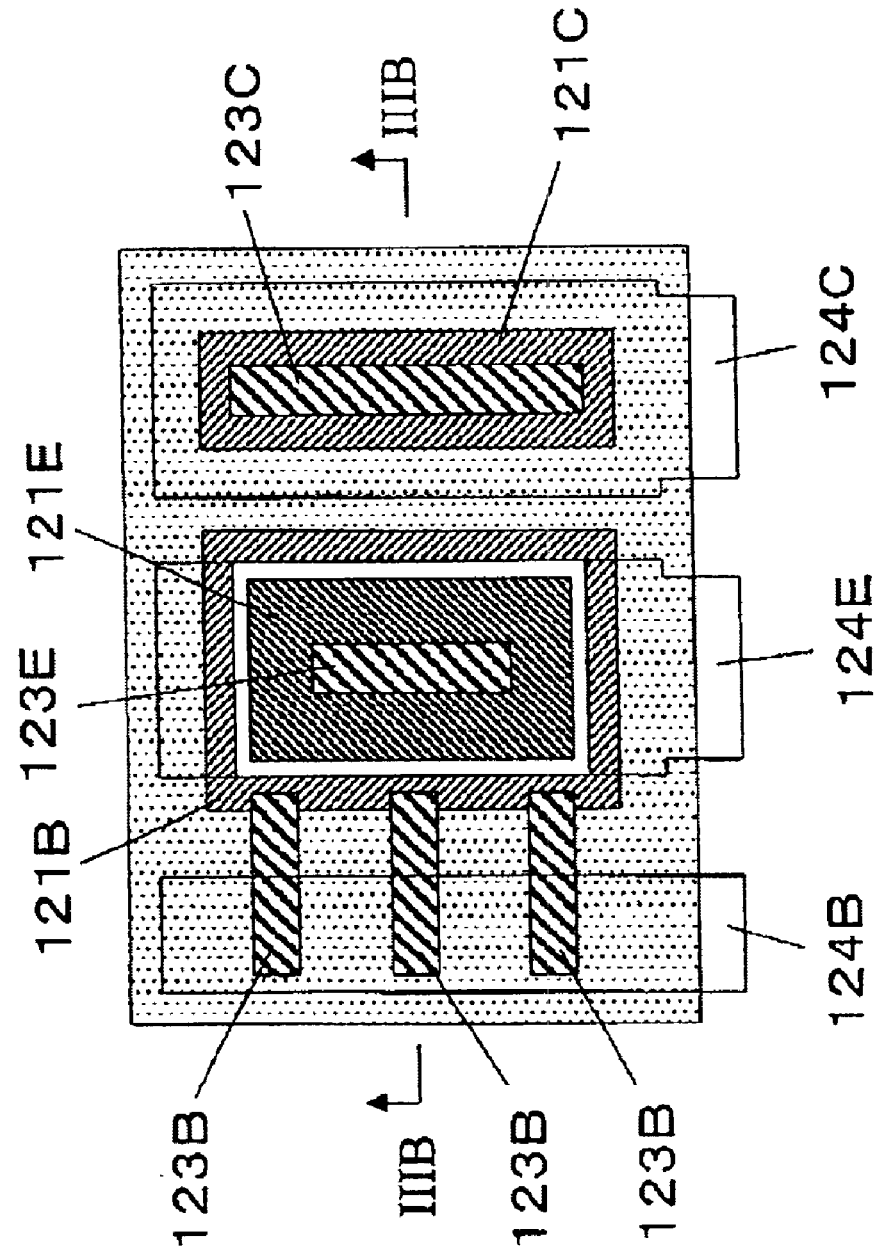

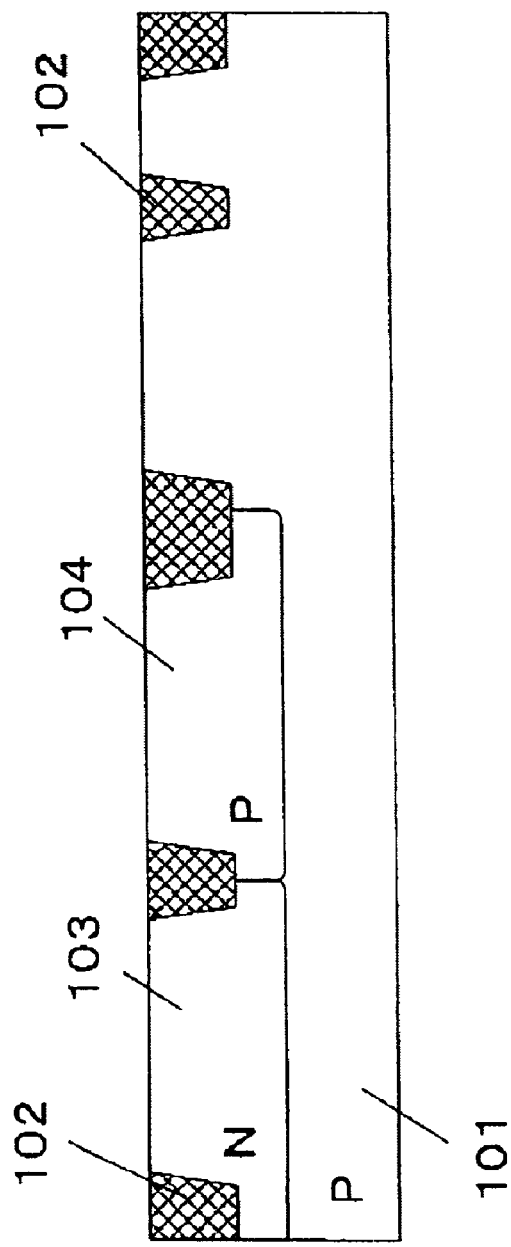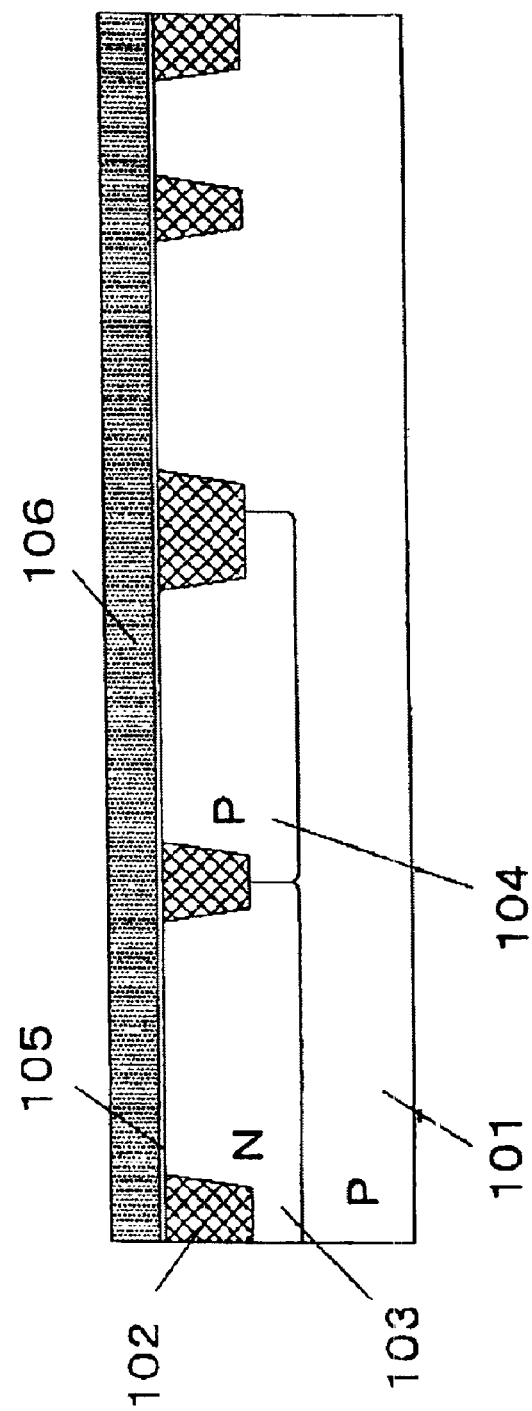
FIG.4A
FIG.4B

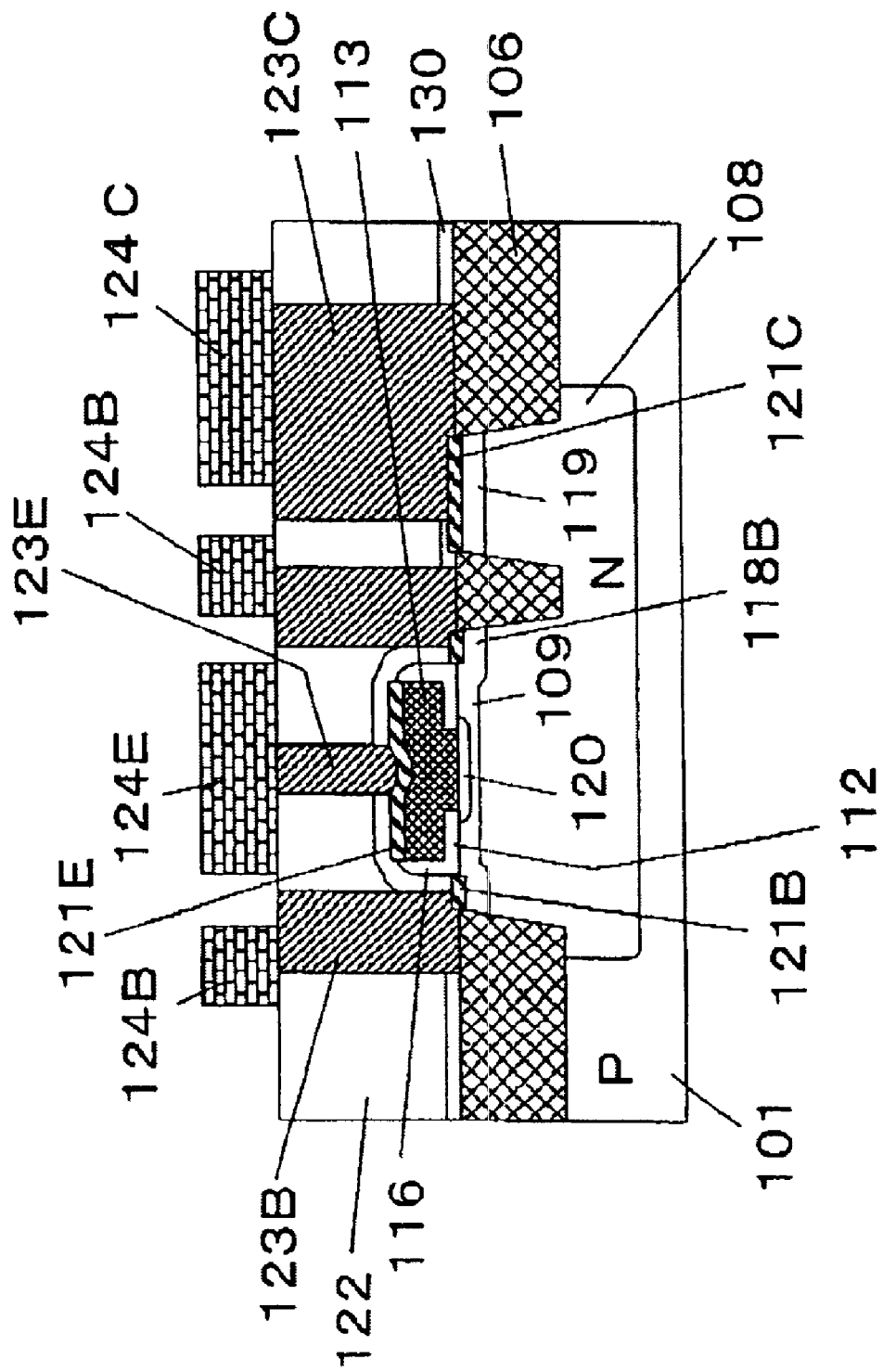

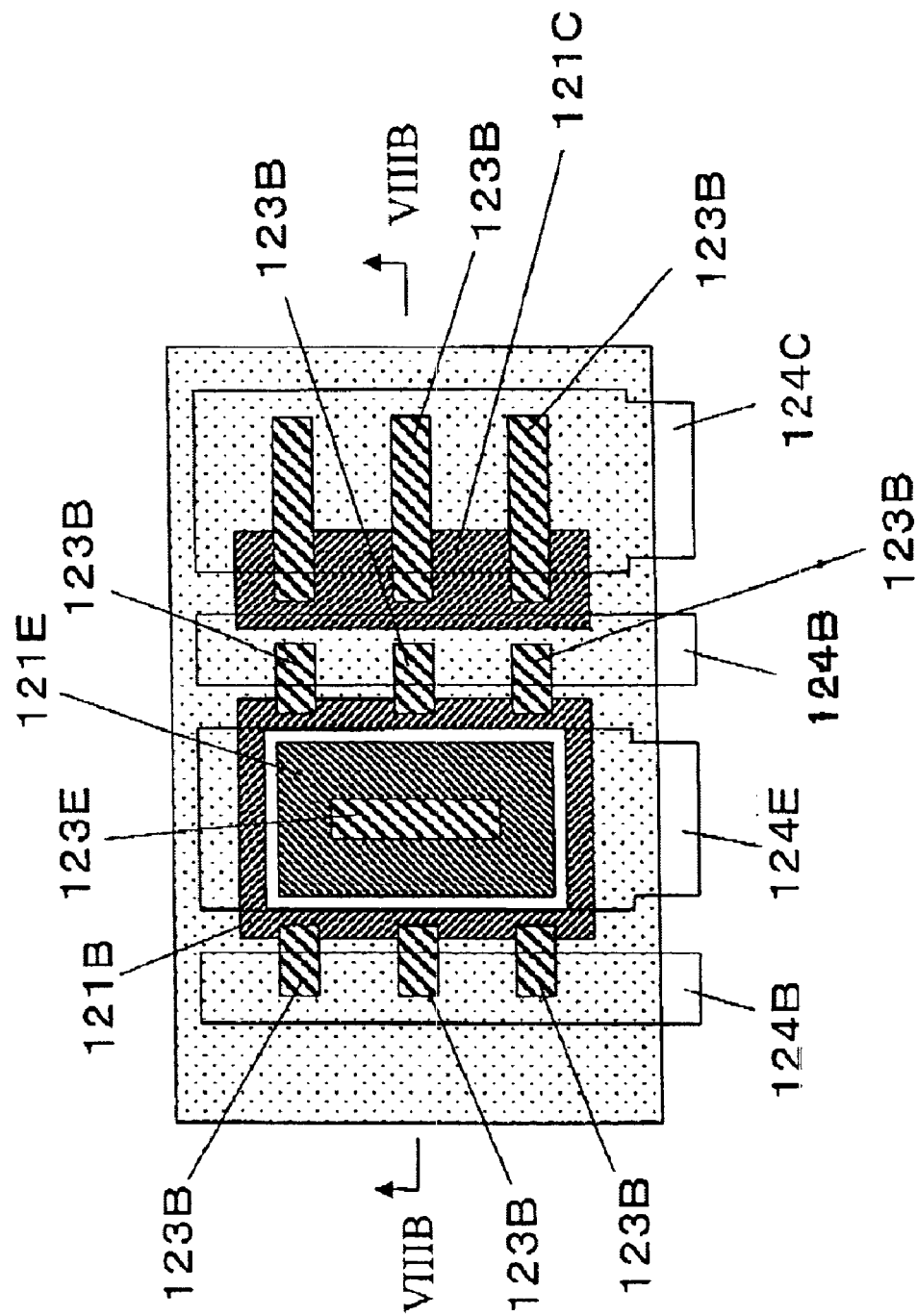

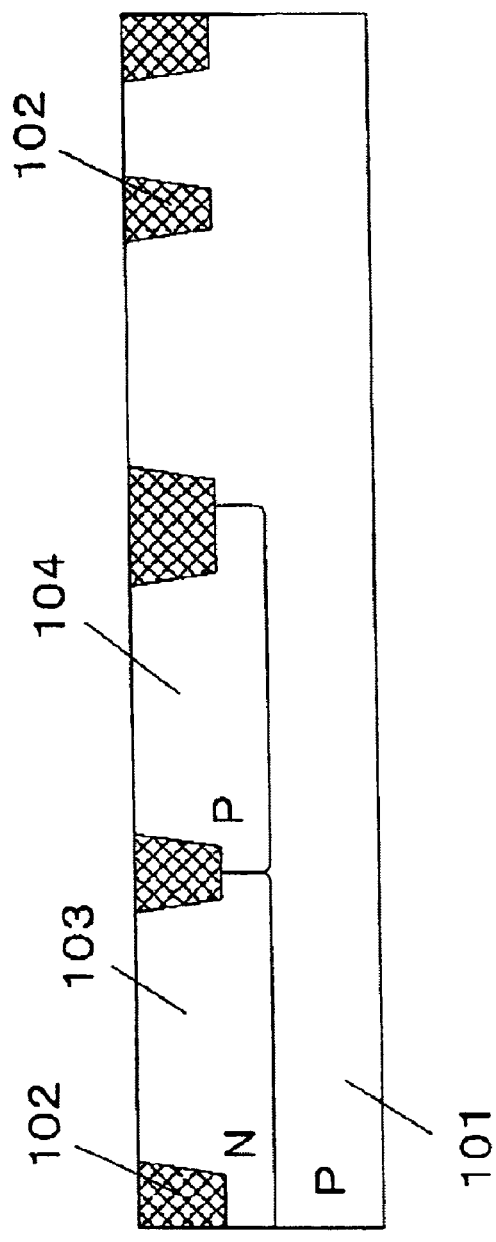
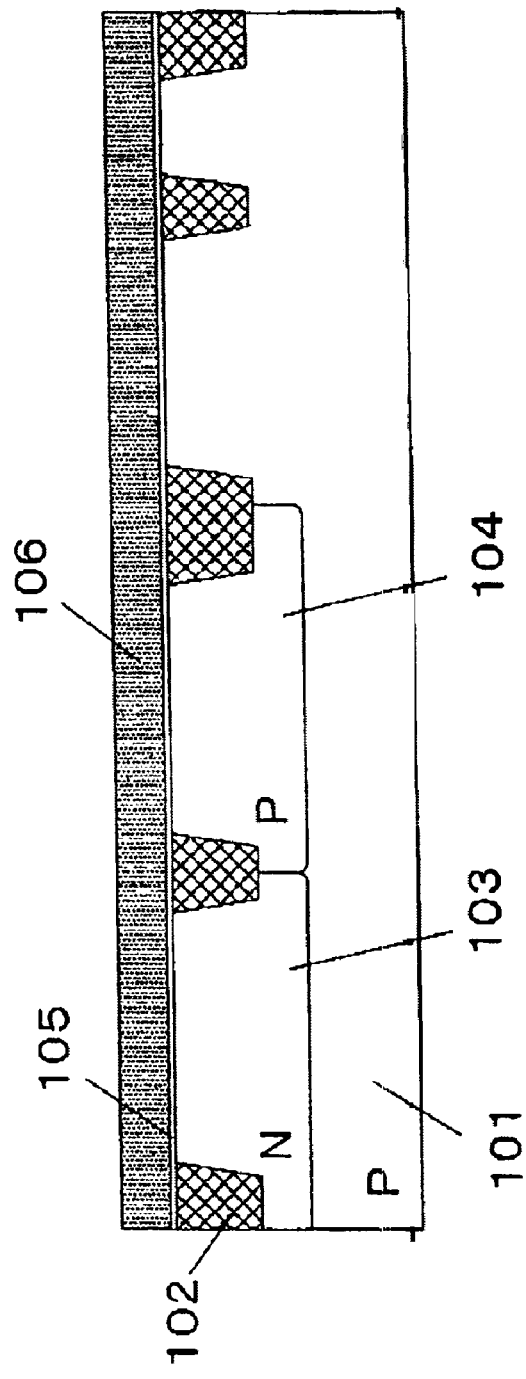
FIG.9A
FIG.9B

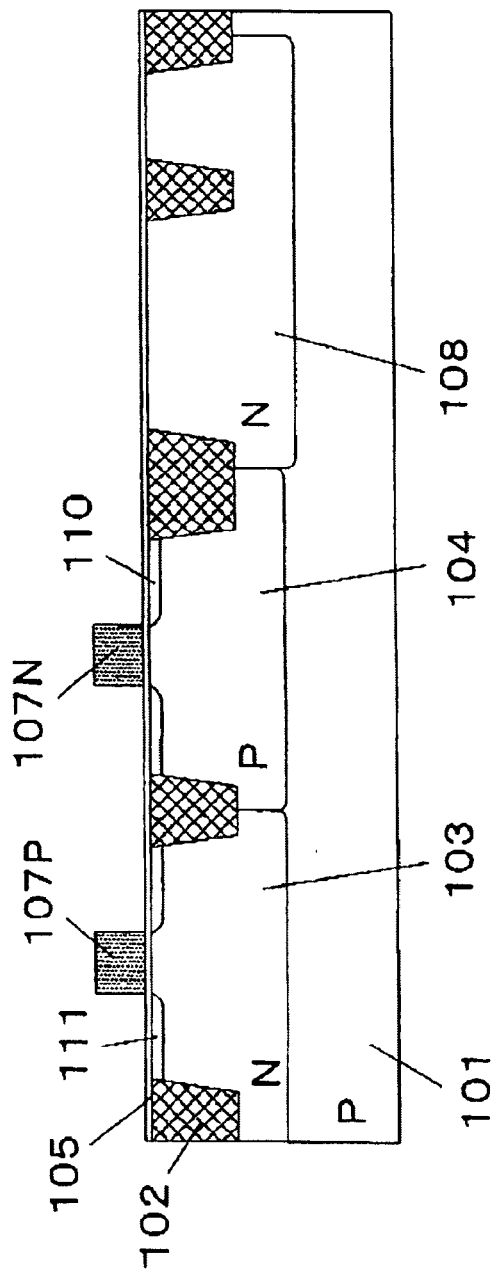
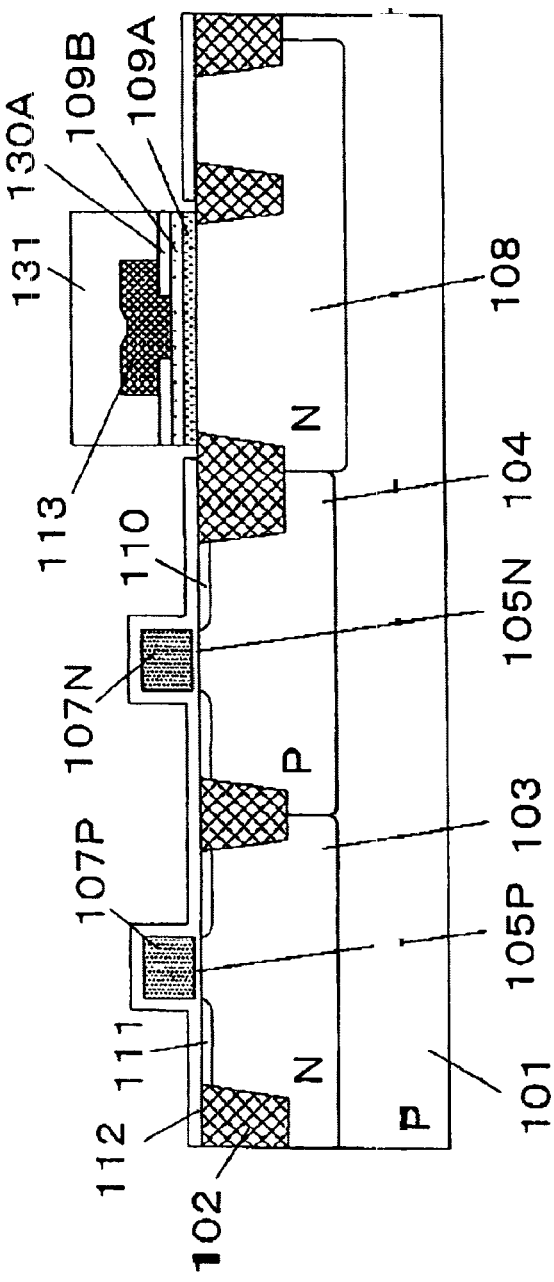
FIG.9C
FIG.9D

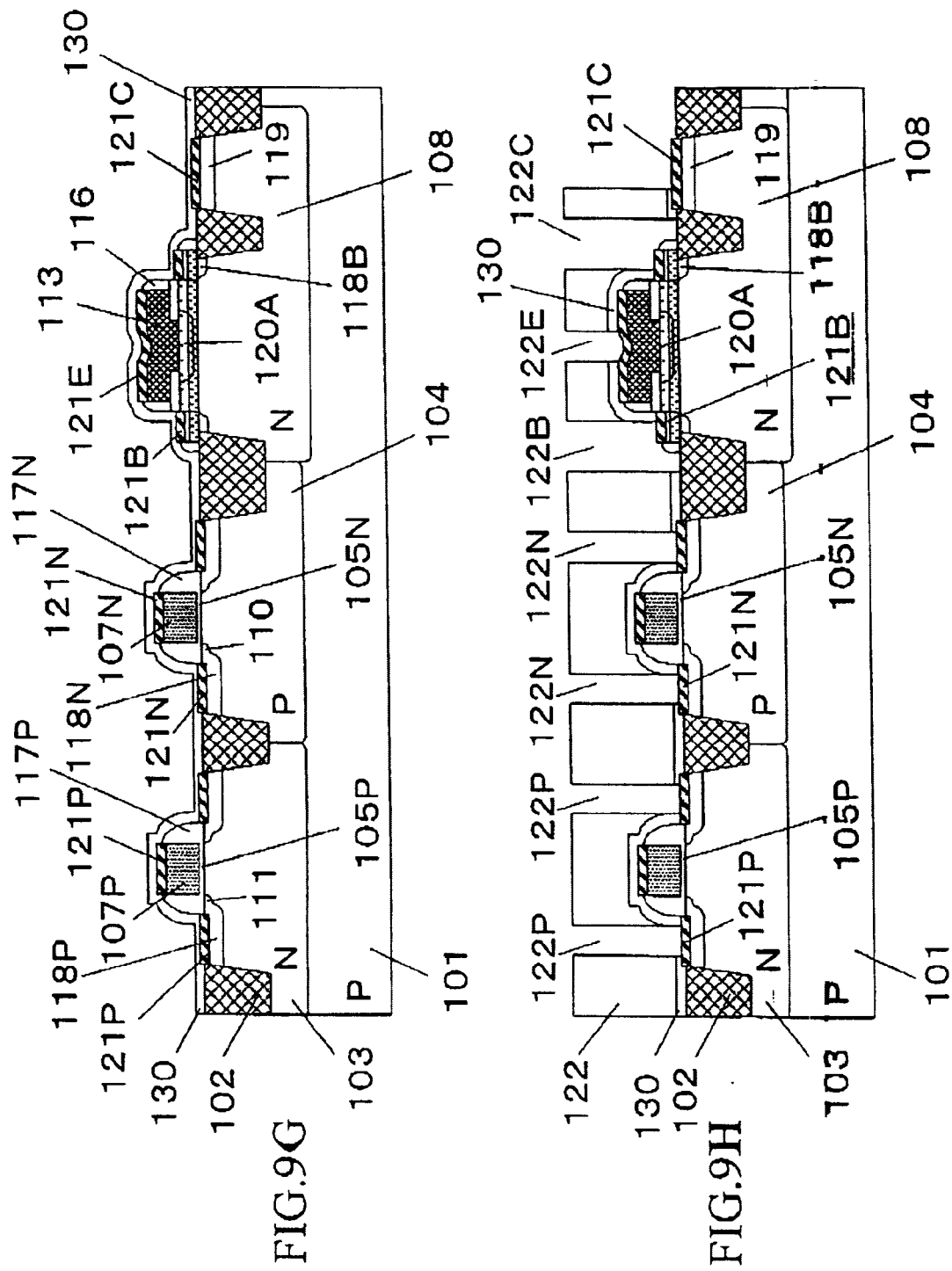

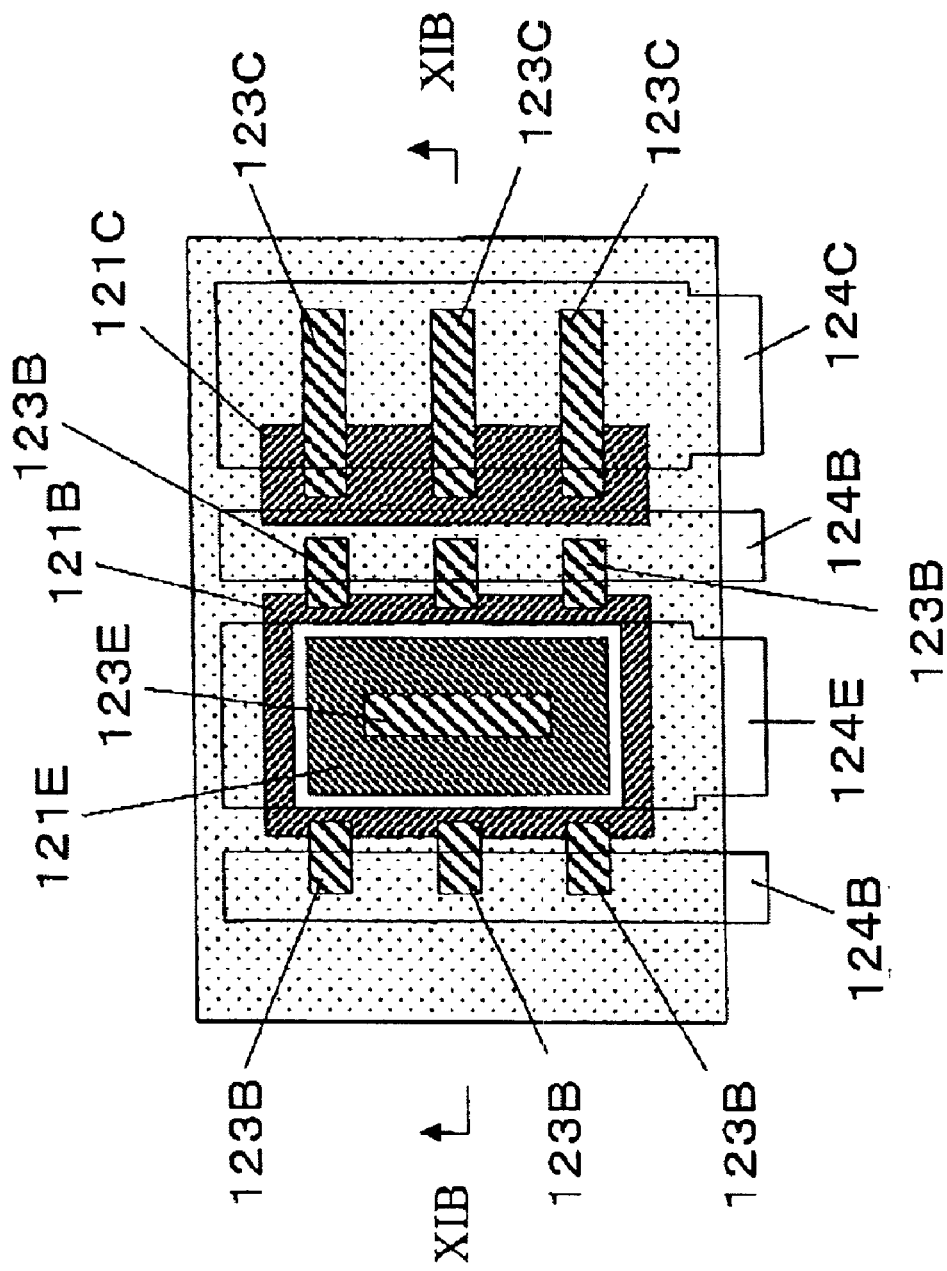

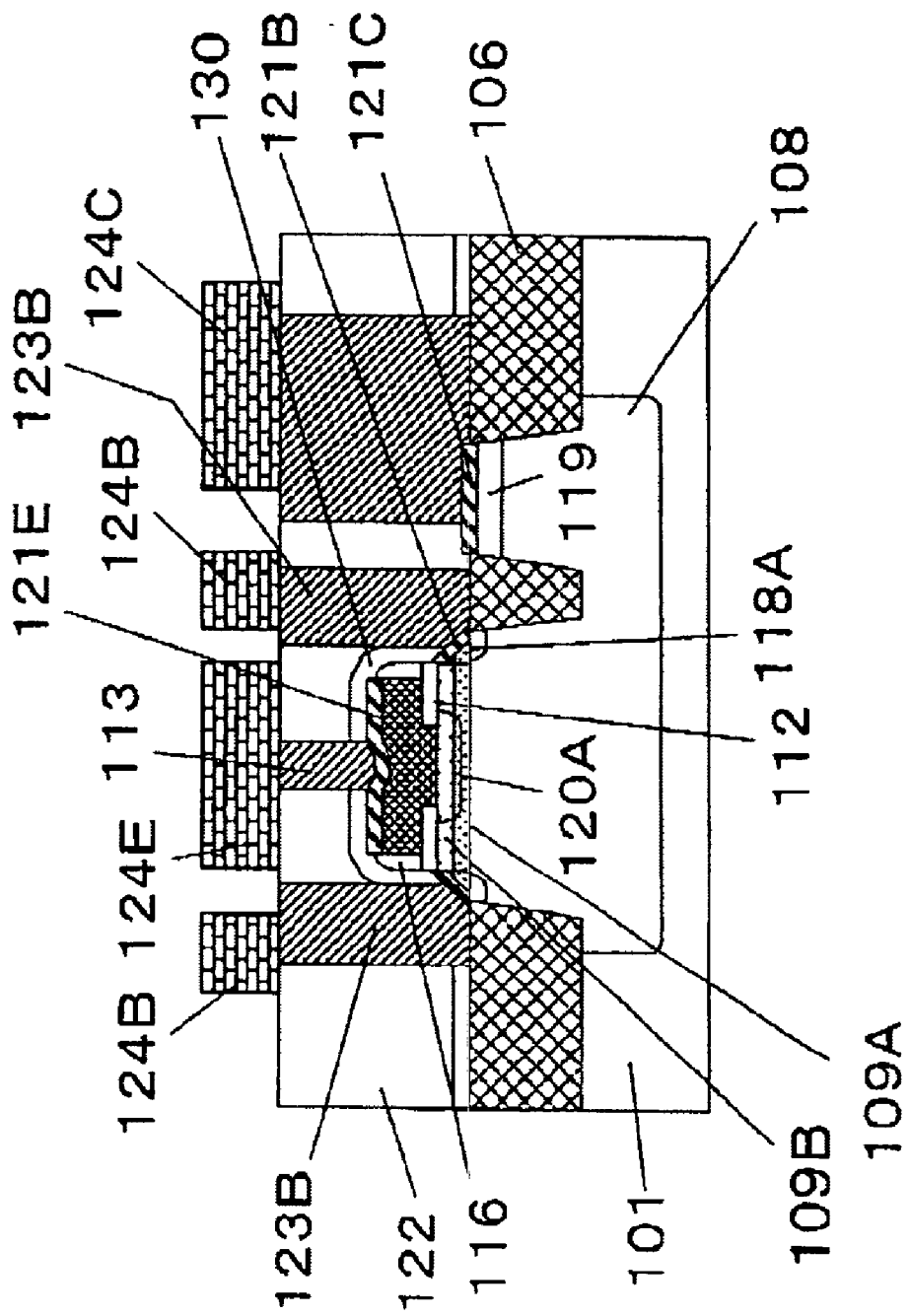

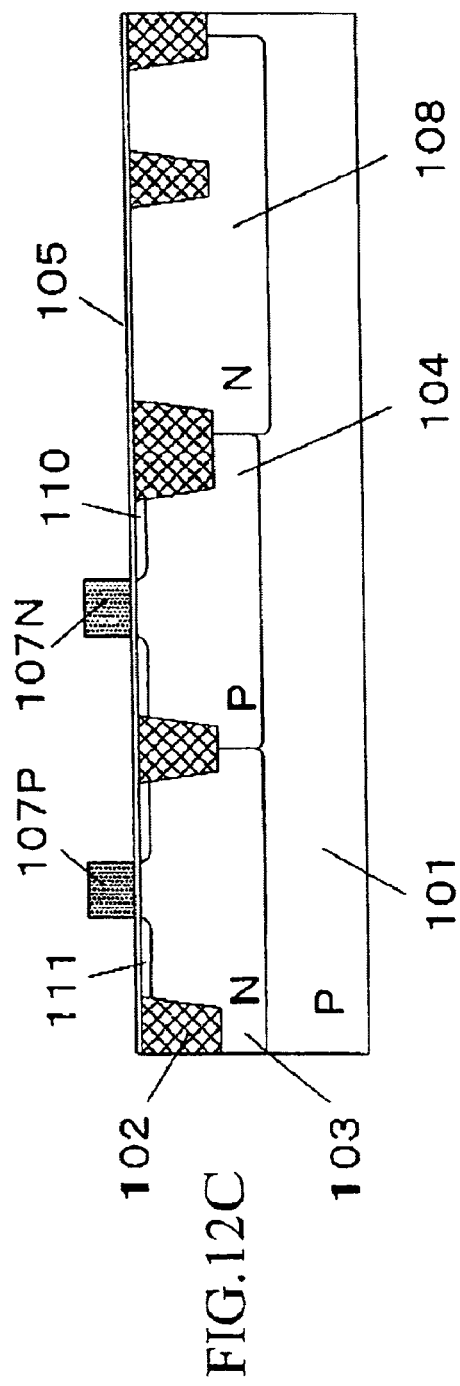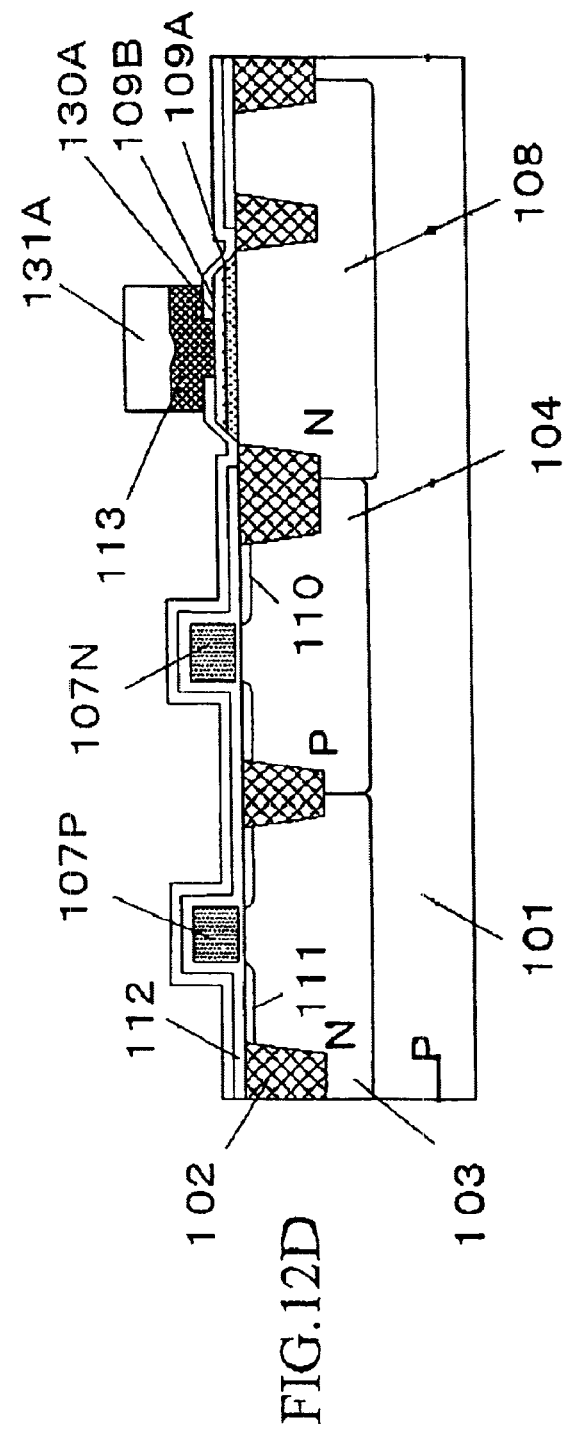

SEMICONDUCTOR DEVICE AND METHOD OF FABRICATING SAME

BACKGROUND OF THE INVENTION

1. Field of the Invention

The present invention relates generally to semiconductor device. More particularly, the invention relates to a semiconductor device having improved high-frequency characteristics, and a method of fabricating the device.

2. Description of the Related Art

In recent years, communication devices, such as cellular phones, portable telephones designed for the Personal Handy Phone System (PHS), and Personal Digital Assistants (PDAs), have been very popular and used extensively worldwide. Under such circumstances, there has been the need to provide low-price communication devices capable of faster and larger-capacity communication. Therefore, to meet this need, the performance of LSIs (Large-Scale Integrated devices) that include analog and digital circuits on the same chip needs to be enhanced while keeping or decreasing their fabrication cost.

With popular analog/digital composite LSIs designed for this purpose, the CMOS (Complementary Metal-Oxide-Semiconductor) configuration is applied to the digital circuits capable of high-speed operation and at the same time, high-performance bipolar transistors are used for the analog circuits capable of high-frequency operation. The analog circuit needs to operate at high frequencies such as several hundreds megahertz (MHz) to several gigahertz (GHz). From this point of view, the high-frequency characteristics of the bipolar transistors need to be improved.

One of the indices representing the performance of high-frequency bipolar transistors is the "maximum oscillation frequency", which is given by the following equation (1).

$$f_{max} \approx \sqrt{\frac{f_T}{8\pi \cdot R_b \cdot C_{cb}}} \quad (1)$$

In the equation (1), $f_{max}$ is the maximum oscillation frequency (at which the high-frequency power gain is equal to unity), $f_T$ is the cut-off frequency, $R_b$ is the base resistance, and $C_{cb}$ is the collector-to-base capacitance.

As seen from the equation (1), to raise the maximum oscillation frequency $f_{max}$, it is effective to raise the cut-off frequency $f_T$, to reduce the base resistance $R_b$, and/or to reduce the collector-to-base capacitance $C_{cb}$.

An example of known techniques to reduce the base resistance $R_b$ or a bipolar transistor is disclosed in 1997 IEDM (International Electron Device Meeting) Technical Digest, pp.807–810. This technique is explained below with reference to FIGS. 1A to 1C.

As shown in FIGS. 1A and 1C, a heavily-doped, n-type buried region 203 is formed on a p-type silicon (Si) substrate 201. A n-type epitaxial region 204 is formed on the substrate 202 to cover the buried region 203. A n-type pedestal region 212 is formed in the epitaxial region 204 to be placed over the buried region 203. The pedestal region 212 has an intermediate doping concentration between the epitaxial region 204 and the buried region 203. The n-type buried region 203, the n-type epitaxial region 204, and the n-type pedestal region 212 constitute the n-type collector of a bipolar transistor.

An isolation oxide 206 is selectively formed in the surface area of the epitaxial region 204. The oxide 206 separates electrically a p-type intrinsic base region 209 and a heavily-doped, p-type diffusion region (i.e., a graft base region) 218 from a heavily-doped, n-type diffusion region (i.e., a collector extraction region) 219.

A heavily-doped, n-type diffusion region 220 is formed in the intrinsic base region 209, which forms a n-type emitter region. An emitter extraction electrode 213 is formed to contact the intrinsic base region 209 by way of a dielectric 217. A titanium silicide ($TiSi_2$) layer 221E is formed on the electrode 313. A $TiSi_2$ layer 221B is formed on the p-type external base region 218, which serves as a base extraction region.

As shown in FIG. 1A, which shows the layout of the respective regions or parts of the transistor, the p-type graft base region (i.e., the heavily-doped, p-type diffusion region) 218 and the $TiSi_2$ layer 221B formed thereon are divided into two parts by the emitter extraction electrode 213 and the $TiSi_2$ layer 221E formed thereon. Two elongated base contact sections 225, which are electrically connected to the metal wiring line for the base, are respectively contacted with the $TiSi_2$ layers 221b at each side of the emitter extraction electrode 213. The base contact sections 225 are formed to extend along the same direction. The reference symbols 226 and 227 denote an emitter contact section and a collector contact section, respectively.

An interlayer dielectric layer 222 is formed over the whole substrate 201 to cover the bipolar transistor. The layer 222 has an emitter contact hole 224E that exposes the $TiSi_2$ layer 221E, two base contact holes 224B that expose the corresponding $TiSi_2$ layers 221B, and a collector contact hole 224C that exposes the $TiSi_2$ layer 221C.

With the prior-art transistor structure of FIGS. 1A to 1C, the surface of the heavily-doped p-type diffusion region (i.e., the graft base region) 218 is covered with the $TiSi_2$ layers 221B (which have a sheet resistance sa low as approximately 5 Ω/□) at each side of the emitter extraction electrode 213. Moreover, the metal base wiring line is connected to the graft base region 218 at each side of the emitter extraction electrode 213 by way of the contact holes 224B. Accordingly, the base resistance $R_b$ is reduced compared with the case where the region 218 is not covered with the $TiSi_2$ layers 221B. The above-described document, IEDM Technical Digest, shows that the maximum oscillation frequency $f_{max}$ is raised up to 54 GHz if the voltage applied across the collector and emitter is 2.5 V.

Next, a method of fabricating the bipolar transistor of FIGS. 1A to 1C is explained below with reference to FIGS. 2A to 2G.

First, as shown in FIG. 2A, the heavily-doped, n-type buried region 203 is formed on the p-type substrate 201 and then, the n-type epitaxial region 204 is formed to cover the region 203 by known methods. The thickness of the region 204 is set at 1 μm, for example.

Next, as shown in FIG. 2B, the isolation oxide 206 is selectively formed by using the so-called LOCOS (LOCal Oxidation of Silicon) method. A first oxide layer 205 with a thickness of 12 nm is formed to cover the epitaxial region 204 and the isolation oxide 206.

As shown in FIG. 2C, the heavily-doped n-type diffusion region (i.e., the collector extraction region) 219 is formed by ion implantation of phosphorus (P). The intrinsic base region 209 is formed by ion implantation of boron (B) at an acceleration energy of 7 keV.

As shown in FIG. 2D, a window for forming the emitter region is formed in the first oxide layer 205 and then, the pedestal region 212 is formed by ion implantation of phosphorus at an acceleration energy of 550 keV. A n-type polysilicon layer (thickness: 250 nm) doped with arsenic (As) is formed and patterned, forming the emitter extraction electrode 213.

As shown in FIG. 2E, the sidewall oxides 217 are formed by a silicon dioxide layer (thickness: 150 nm). Using the sidewall oxides 217 and the emitter extraction electrode 213, the heavily-doped, p-type diffusion region (i.e., the graft base region) 218 is formed in self-alignment to the electrode 213 by ion-implantation of boron at 10 keV. Thereafter, an RTA (Rapid Thermal Annealing) process is carried out at 1025° C. for 20 seconds, thereby diffusing the arsenic (As) atoms from the electrode 213 into the intrinsic base region 209. Thus, the n-type emitter region 220 is formed in self-alignment.

Thereafter, as shown in FIG. 2F, using known silicide technique, the surface areas of the second conductor 213, the extrinsic base region 218, and the collector extraction region 210 are subjected to silicidation reaction. Thus, the $TiSi_2$ layers 221E, 221B, and 221C are formed.

As shown in FIG. 2G, using known technique, the interlayer dielectric layer 222 is formed to cover the transistor. The contact holes 224E, 224B, and 224c are formed by known techniques and then, tungsten (W) and Ti/TiN barrier metal layers are formed on the layer 222 and patterned, thereby forming the contact plugs 225E, 225B, and 225E in the respective contact holes 221E, 221B, and 221C.

Finally, a metal layer is formed on the interlayer dielectric layer 222 and patterned, thereby forming the emitter, base, and collector wiring lines 224E, 224B, and 225C. These lines 224E, 224B, and 225C are contacted with the plugs 225E, 225B, and 225E, respectively. With the above-explained prior-art bipolar transistor, the following problem occurs. Specifically, the position of the contact plugs 225B for the base is determined according to the interval between the emitter wiring line 224E and the base wiring line 224B. In other words, the contact holes 225B for the base are entirely overlapped with the graft base region 218. Therefore, the graft base region 218 will occupy a wide area. For this reason, it is difficult to make the maximum oscillation frequency $f_{max}$ higher than the conventional bipolar transistors with the emitter/base double-polysilicon structure.

Since the maximum current for the base metal line 224B is usually as large as several hundreds microamperes (μA), the line 224B can be designed as the minimum width according to the design rule of bipolar transistors. Unlike this, the maximum currents for the emitter and collector metal lines 224B and 224C are usually as large as several tens milliamperes (mA), which is $h_{FE}$ times (typically, approximately 100) the maximum current for the base line 224B. Here, $h_{FE}$ is defined as $h_{FE}=I_C/I_B \approx I_E/I_B$, where $I_C$ is the collector current, $I_B$ is the base current, and $I_E$ is the emitter current. Therefore, from the viewpoint of reliability, the line 224E and 224C need to be designed considerably wider than the minimum width according to the design rule.

With the above-described prior-art transistor, the base and collector contact plugs 225B and 225C are positioned corresponding to the large widths of the emitter and collector metal lines 224E and 224C. Thus, the base contact plugs 225B are likely to be positioned at a considerable distance from the emitter extraction electrode 213.

Moreover, it the distance between the isolation oxide 206 and the base contact section 225 is reduced to narrow the graft base region 218, the isolation oxide tends to be partially broken to thereby cause short-circuit between the base and collector. This is because if placement error occurs in the contact-hole formation process, the isolation oxide will be etched and desired isolation characteristics will not be available. As a result, it is impossible to reduce the distance between the isolation oxide 203 and the base contact section 225.

SUMMARY OF THE INVENTION

Accordingly, a chief object of the present invention is to provide a semiconductor device that raises the maximum oscillation frequency $f_{max}$ of bipolar transistors, and a method of fabricating the device.

Another object of the present invention is to provide a semiconductor device that makes it possible to narrow the graft base region without increasing the base resistance $R_b$, and a method of fabricating the device.

Still another object of the present invention is to provide a semiconductor device that increases the degree of freedom in designing the layout of the emitter, base, and collector wiring lines, and a method of fabricating the device.

The above objects together with others not specifically mentioned will become clear to those skilled in the art from the following description.

According to a first aspect of the invention, a semiconductor device is provided, which comprises:
(a) a semiconductor substrate;
(b) an isolation dielectric formed on the substrate to define a transistor section for a bipolar transistor;
the transistor section being divided into an emitter/base subsection and a collector extraction subsection by the isolation dielectric;
(c) an intrinsic base region formed in the emitter/base subsection;
(d) a graft base region formed in the emitter/base subsection;
the graft base region being contacted with the isolation dielectric;
(e) an emitter region formed in the emitter/base subsection to overlap with the intrinsic base region;
(f) a collector extraction region formed in the collector extraction subsection;
(g) a stopper dielectric layer formed on the substrate to cover the transistor section and the isolation dielectric; and
(h) an interlayer dielectric layer formed on the stopper dielectric layer to cover the transistor section and the isolation dielectric;
the interlayer dielectric layer having an emitter contact plug for electrical connection to the emitter region, a base contact plug for electrical connection to the graft base region, and a collector contact plug for electrical connection to the collector extraction region;
the base contact plug being located over the isolation dielectric in such a way as to contact the graft base region near its bottom end corner.

With the semiconductor device according to the first aspect of the invention, the stopper dielectric layer is formed on the substrate to cover the transistor section and the isolation dielectric. The interlayer dielectric layer is formed on the stopper dielectric layer. The base contact plug, which is formed in the interlayer dielectric layer, is located over the isolation dielectric in such a way as to contact the graft base region near its bottom end corner.

Therefore, the base contact plug needs not to entirely overlap with the graft base region, which means that the graft base region can be narrowed without increasing the base resistance $R_b$ and that the collector-base capacitance $C_{cb}$ is reduced. Also, electrical short circuit between the graft base region and the collector region can be effectively suppressed by the stopper dielectric layer.

Accordingly, the maximum oscillation frequency $f_{max}$ of the bipolar transistor can be raised.

Moreover, since the location of the base contact plug is not affected by the location of the emitter wiring line and the distance between the emitter and base wiring lines, the degree of freedom in designing the layout of the emitter, base, and collector wiring lines is enhanced.

In a preferred embodiment of the device according to the first aspect, a n-channel MOEFET and a p-channel MOSFET are additionally provided on the substrate, thereby forming the BiCMOS configuration.

In another preferred embodiment of the device according to the first aspect, an additional base contact plug is formed in the interlayer dielectric layer in such a way as to be apart from the base contact plug.

In still another preferred embodiment of the device according to the first aspect, the base contact plug has an elongated plan shape extending in a first direction and the emitter contact plug has an elongated plan shape extending in a second direction different from the first direction. Preferably, the base contact plug is approximately perpendicular to the emitter contact plug.

In a further preferred embodiment of the device according to the first aspect, an additional base contact plug is formed in the interlayer dielectric layer between the emitter contact plug and the collector contact plug.

In a still further preferred embodiment of the device according to the first aspect, the base contact plug has a plan shape like E.

Preferably, the intrinsic base region is formed in a single-crystal Si layer or a combination of a SiGe layer and a single-crystal Si layer Preferably, the base contact plug is connected with the graft base region by way of a metal silicide layer.

According to a second aspect of the invention, a method of fabricating the semiconductor device according to the first aspect is provided. This method comprises:

(a) forming an isolation dielectric on a semiconductor substrate to define a transistor section for a bipolar transistor;

the transistor section being divided into an emitter/base subsection and a collector extraction subsection by the isolation dielectric;

(b) forming an intrinsic base region in the emitter/base subsection;

(c) forming a graft base region in the emitter/base subsection;

the graft base region being contacted with the isolation dielectric;

(d) forming an emitter region in the emitter/base subsection to overlap with the intrinsic base region;

(e) forming a collector extraction region formed in the collector extraction subsection;

(f) forming a stopper dielectric layer on the substrate to cover the transistor section and the isolation dielectric;

(g) forming an interlayer dielectric layer on the stopper dielectric layer to cover the transistor section and the isolation dielectric;

(h) forming an emitter contact plug for electrical connection to the emitter region, a base contact plug for electrical connection to the graft base region, and a collector contact plug for electrical connection to the collector extraction region in the interlayer dielectric layer;

the base contact plug being located over the isolation dielectric in such a way as to contact the graft base region near its bottom end corner.

With the method according to the second aspect of the invention, it is obvious that the semiconductor device according to the first aspect is fabricated.

In a preferred embodiment of the method according to the second aspect, a n-channel MOEFET and a p-channel MOSFET are additionally formed on the substrate, thereby forming the BiCMOS configuration.

In another preferred embodiment of the method according to the second aspect, an additional base contact plug is formed in the interlayer dielectric layer in such a way as to be apart from the base contact plug in the step (h).

In still another preferred embodiment of the method according to the second aspect, the base contact plug is formed to have an elongated plan shape extending in a first direction and the emitter contact plug is formed to have an elongated plan shape extending in a second direction different from the first direction in the step (h). Preferably, the base contact plug is approximately perpendicular to the emitter contact plug.

In a further preferred embodiment of the method according to the second aspect, an additional base contact plug is formed in the interlayer dielectric layer between the emitter contact plug and the collector contact plug in the step (h).

In a still further preferred embodiment of the method according to the second aspect, the base contact plug is formed to have a plan shape like E in the step (h).

Preferably, the intrinsic base region is formed in a single-crystal Si layer or a combination of a SiGe layer and a single-crystal Si layer Preferably, the base contact plug is connected with the graft base region by way of a metal silicide layer.

Preferably, the stopper dielectric layer and the interlayer dielectric layer are made of different dielectric materials that provide a desired etch selectivity with respect to an etchant.

Preferably, the stopper dielectric layer and the isolation dielectric are made of different dielectric materials that provide a desired etch selectivity with respect to an etchant.

BRIEF DESCRIPTION OF THE DRAWINGS

In order that the present invention may be readily carried into effect, it will now be described with reference to the accompanying drawings.

FIG. 1A is a partial plan view showing the layout of a prior-art bipolar transistor.

FIGS. 2A to 2G are partial cross-sectional view showing the process steps of a method of fabricating the prior-art bipolar transistor of FIGS. 1A to 1C, respectively.

FIG. 3A is a partial plan view showing the layout of a bipolar transistor of a semiconductor device according to a first embodiment of the invention.

FIGS. 4A to 4I are partial cross-sectional views showing the process steps of a method of fabricating a semiconductor device according to a second embodiment of the invention, respectively, in which the bipolar transistor according to the first embodiment is incorporated.

FIG. 6B is a partial, cross-sectional view along the line VIB—VIB in FIG. 6A, which shows the structure of the bipolar transistor according to the fourth embodiment of FIG. 6A.

FIG. 8A is a partial plan view showing the layout of a bipolar transistor of a semiconductor device according to a sixth embodiment of the invention.

FIGS. 9A to 9I are partial cross-sectional view showing the process steps of a method of fabricating a semiconductor device according to a seventh embodiment of the invention, respectively, in which the bipolar transistor according to the sixth embodiment is incorporated.

FIG. 11A is a partial plan view showing the layout of a bipolar transistor of a semiconductor device according to an eighth embodiment of the invention.

FIG. 11B is a partial, cross-sectional view along the line XIB—XIB in FIG. 11A, which shows the structure of the bipolar transistor according to the eighth embodiment of FIG. 11A.

FIGS. 12A to 12E are partial cross-sectional view showing the process steps of a method of fabricating a semiconductor device according to a ninth embodiment of the invention, respectively, in which the bipolar transistor according to the eighth embodiment is incorporated.

DETAILED DESCRIPTION OF THE PREFERRED EMBODIMENTS

Figure 1B:
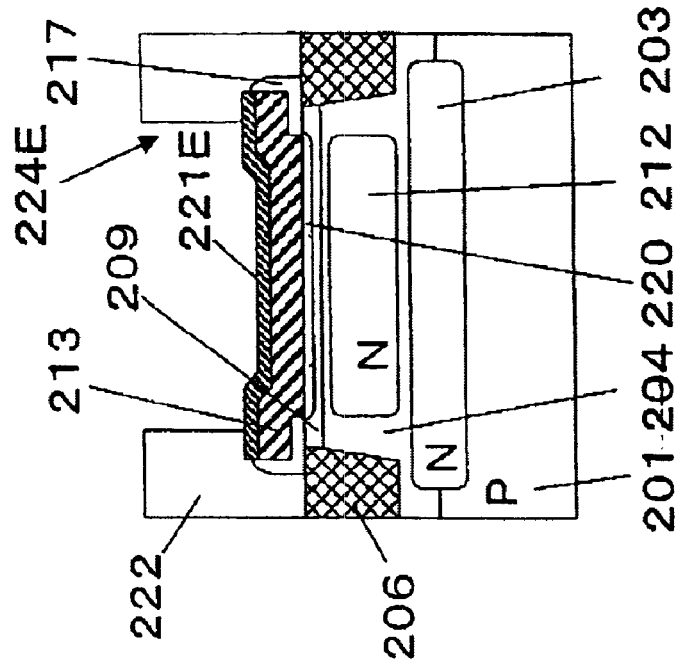
FIG. 1B is a partial, cross-sectional view along the line IB—IB in FIG. 1A, which shows the structure of the prior-art bipolar transistor of FIG. 1A.

Preferred embodiments of the present invention will be described in detail below while referring to the drawings attached.

First Embodiment

Figure 3B:
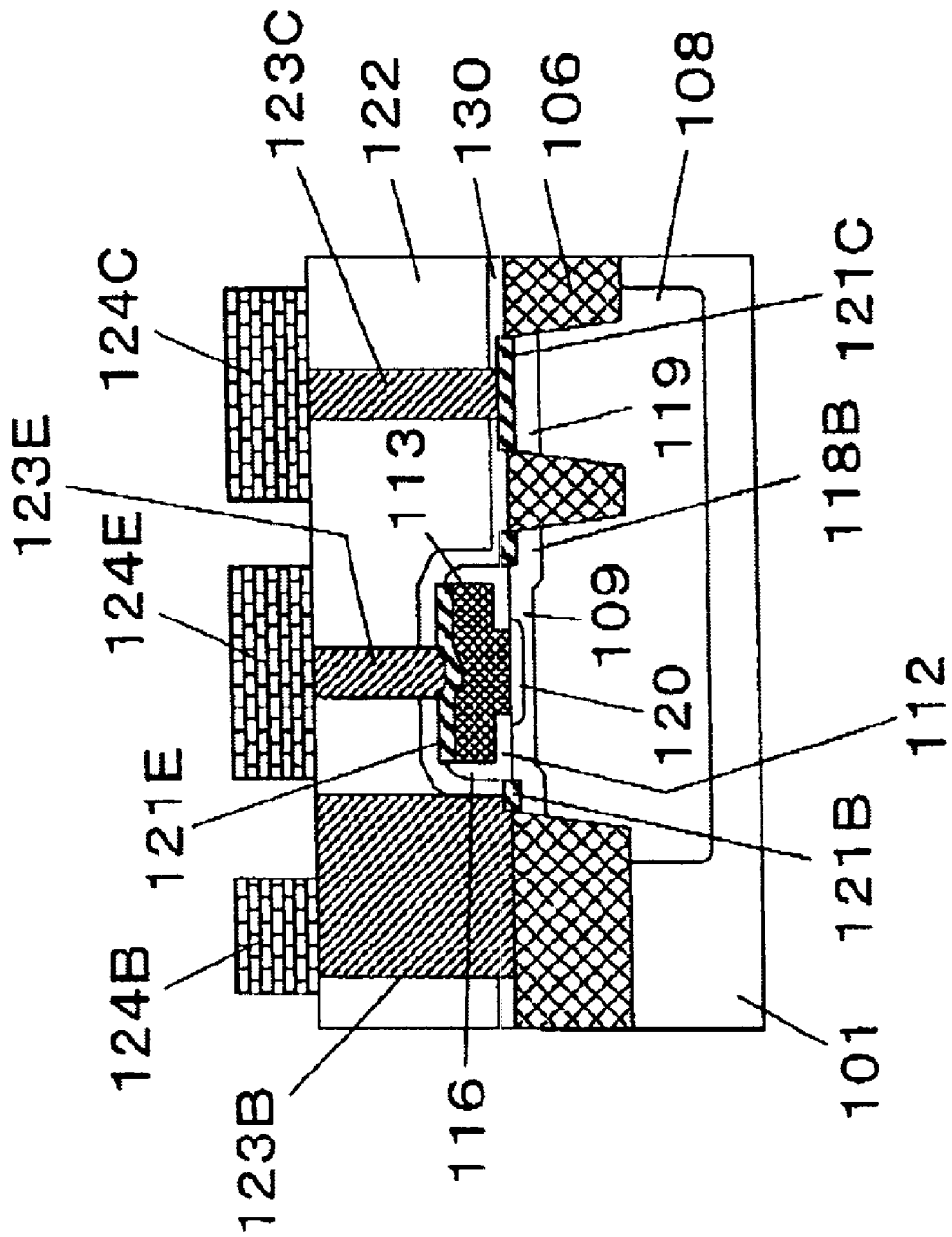
FIG. 3B is a partial, cross-sectional view along the line IIIB—IIIB in FIG. 3A, which shows the structure of the bipolar transistor according to the first embodiment of FIG. 3A.

FIGS. 3A and 3B show the structure of a semiconductor device with a bipolar transistor according to a first embodiment of the invention.

As shown in FIG. 3B, this device comprises a p-type single-crystal silicon substrate 101 on which a npn-type bipolar transistor is formed. A n-type well region 108 is formed on the substrate 101 and serves as the collector of the transistor. An isolation oxide 106 is selectively formed on the substrate 101, which separates electrically a p-type intrinsic base region 109 and a heavily-doped, p-type diffusion region (i.e., a graft base region) 118B from a heavily-doped, n-type diffusion region (i.e., a collector extraction region) 119. A heavily-doped, n-type diffusion region (i.e., an emitter region) 120 is formed in the intrinsic base region 109. An emitter extraction electrode 113 is formed to contact the emitter region 120 by way of a window of a silicon dioxide ($SiO_2$) layer 112. A dielectric sidewall 116, which is made of $SiO_2$, covers the side faces of the electrode 113. A cobalt silicide ($CoSi_2$) layer 121E is formed on the upper face of the electrode 113. A $CoSi_2$ layer 121B is formed on the upper face of the graft base region 118B. A $CoSi_2$ layer 121C is formed on the upper face of the collector extraction region 119.

A thin stopper dielectric layer 130, which is made of silicon nitride ($SiN_x$), is formed to cover the entire substrate 101. A thick interlayer dielectric layer 122, which is made of $SiO_2$, is formed on the layer 130 to cover the entire substrate 101. The layer 122 has an emitter contact hole that exposes the $CoSi_2$ layer 121E, three base contact holes that expose the $CoSi_2$ layer 121B, and a collector contact hole that exposes the $CoSi_2$ layer 121C.

An emitter contact plug 123E is filled into the emitter contact hole. The whole bottom end of the plug 123E is contacted with the $CoSi_2$ layer 121E. A collector contact plug 123C is filled into the collector contact hole. The whole bottom end of the plug 123CE is contacted with the $CoSi_2$ layer 121C. On the other hand, three base contact plugs 123B are filled into the respective base contact holes. These plugs 123B are extended in parallel from the near end of the graft base region 118B toward the opposite side to the emitter extraction electrode 113. Almost all of each plug 123B is placed on the isolation oxide 106, which is contacted with the $CoSi_2$ layer 121B at its emitter-side end only. Thus, the contact area of each plug 123B with the $CoSi_2$ layer 121B is extremely small.

On the interlayer dielectric layer 122, an emitter wiring line 124E, a base wiring line 124B, and a collector wiring line 124C are formed. These lines 124E, 124B, and 124C are made of metal. The emitter line 124E is located to overlap entirely with the contact plug 123E. The collector line 124C is located to overlap entirely with the contact plug 123C. Unlike this, the base line 124B is located to overlap partially with the contact plugs 123B and the isolation dielectric 196.

The layout of the respective parts or regions are clearly shown in FIG. 3A. The graft base region (i.e., the heavily-doped, p-type diffusion region) 118B, on which the CoSi$_2$ layer 121B is formed, is formed to surround the emitter extraction electrode 113 and the CoSi$_2$ layer 121E. The base contact plugs 123B are apart from each other and extended perpendicular to the elongated emitter contact plug 123E. The base wiring line 124B is formed to be perpendicular to the plugs 123B, thereby contacting all the plugs 123B.

The CoSi$_2$ layer 121B on the graft base region 118B is necessary to reduce the contact resistance between the contact plug 123B and the graft base region 118B. However, the CoSi$_2$ layer 121E on the emitter extraction electrode 113 and the CoSi$_2$ layer 121C on the collector extraction regions 119 are not always necessary for the invention.

Figure 1C:
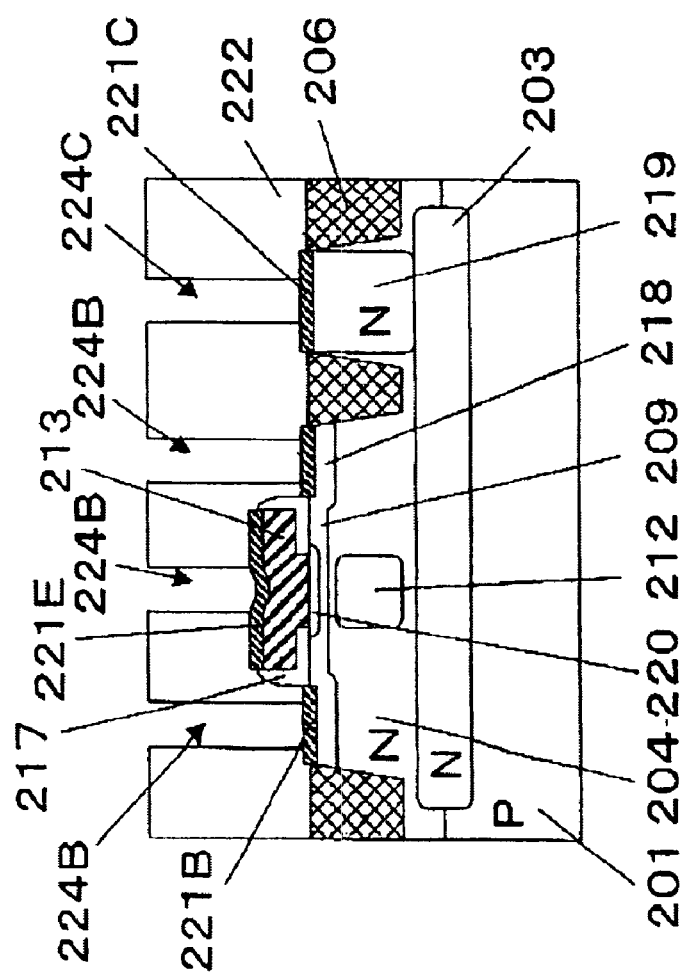
FIG. 1C is a partial, cross-sectional view along the line IC—IC in FIG. 1A, which shows the structure of the prior-art bipolar transistor of FIG. 1A.
Figure 2C:
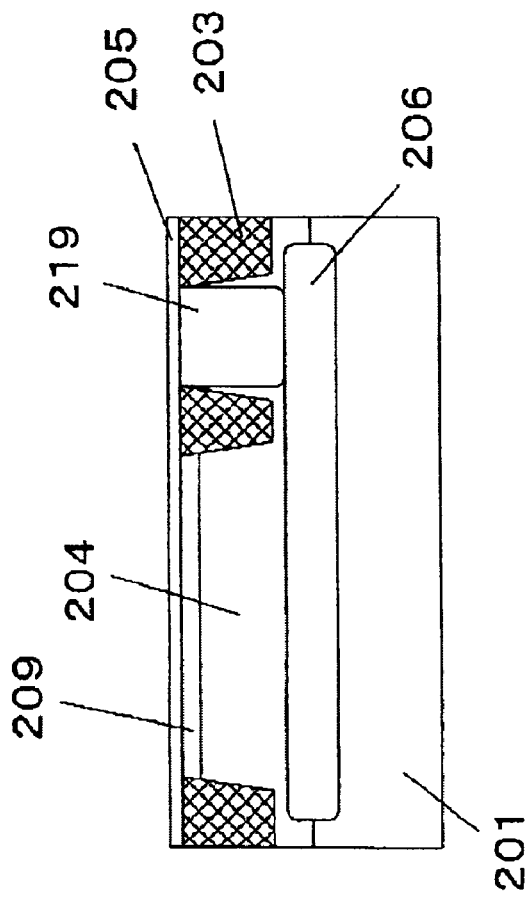
Figure 2D:
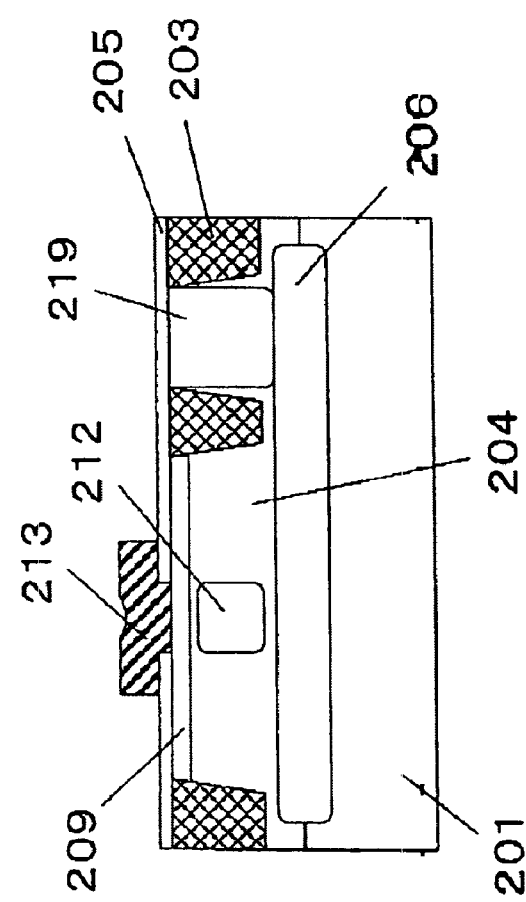
Figure 2G:
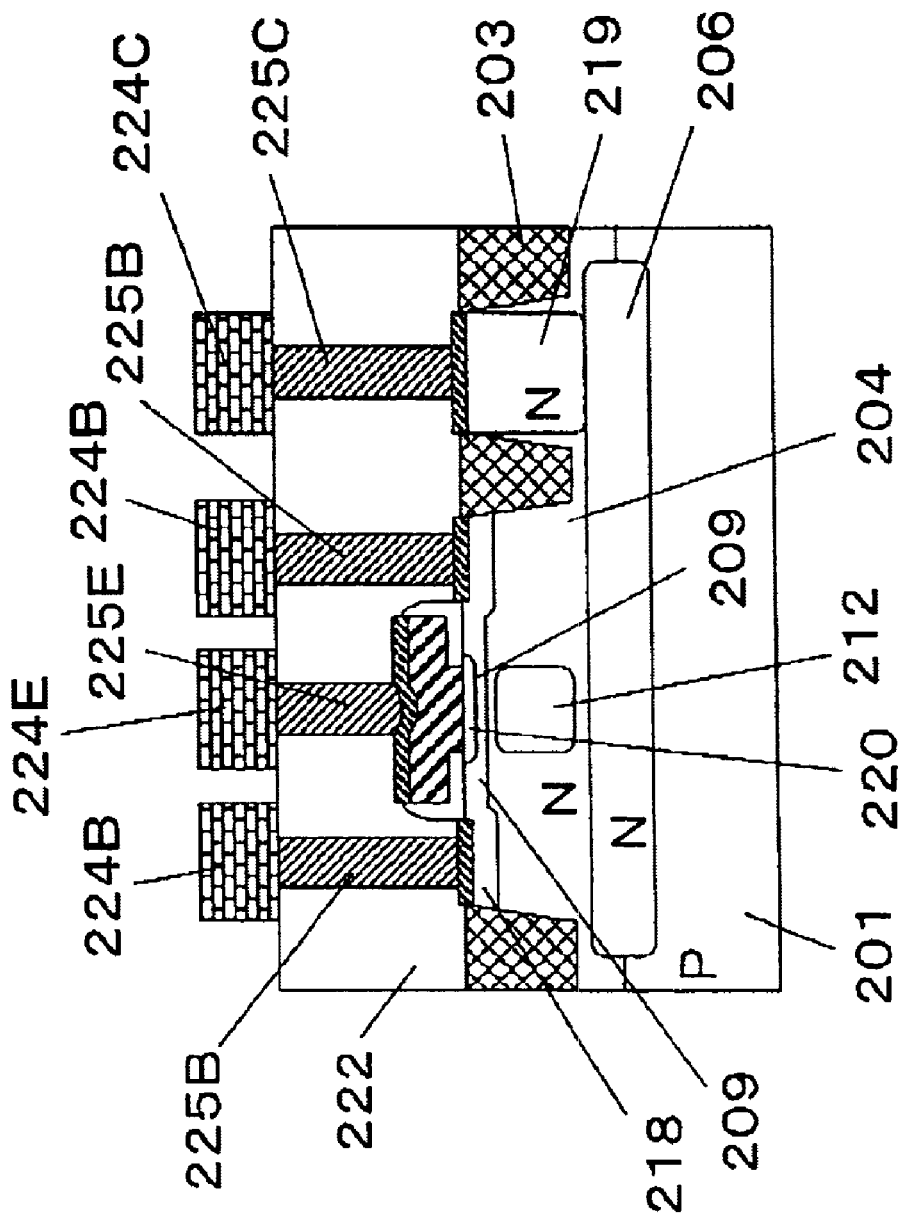

With the semiconductor device with the bipolar transistor of the first embodiment shown in FIGS. 3A and 3B, compared with the previously-explained prior-art bipolar transistor of FIGS. 1A to 1C, the area itself of the graft base region 118B is smaller. Moreover, unlike the prior-art transistor, the base wiring line 124B is provided on one side of the emitter electrode 113. Accordingly, the collector-to-base capacitance $C_{cb}$ is reduced and therefore, the maximum oscillation frequency $f_{max}$ is raised.

Second Embodiment

In the first embodiment, to facilitate understanding the invention, only the bipolar transistor is explained with reference to FIGS. 3A and 3B. However, the invention is more effective if it is applied to semiconductor devices with the so-called BiCMOS (Bipolar and Complementary MOS) configuration. Therefore, the second embodiment relates to a semiconductor device with the BiCMOS configuration.

Figure 4C:
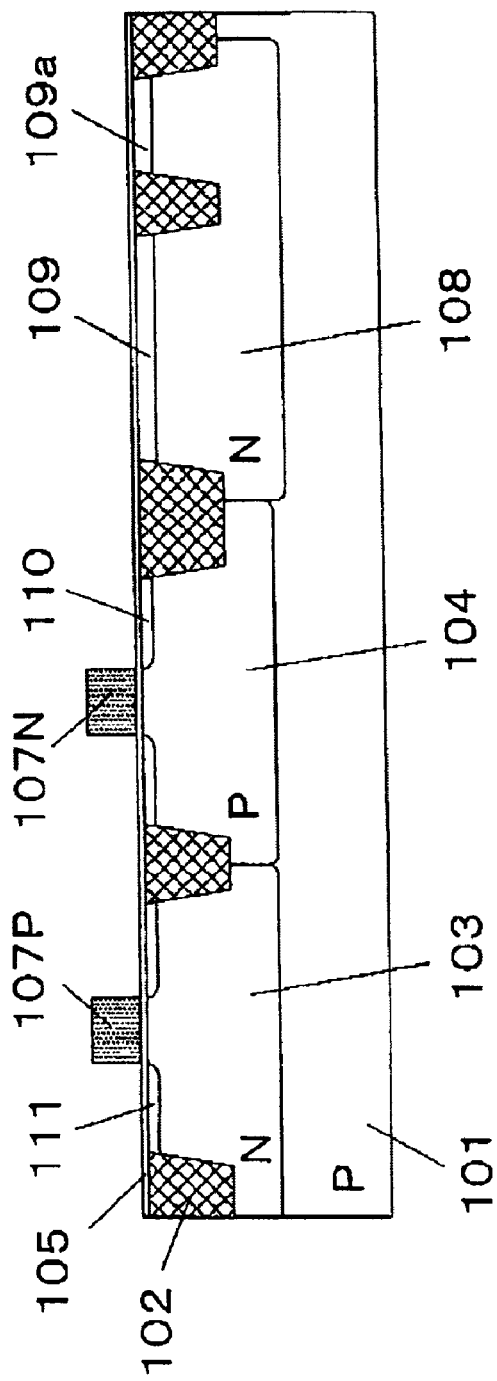
Figure 4D:
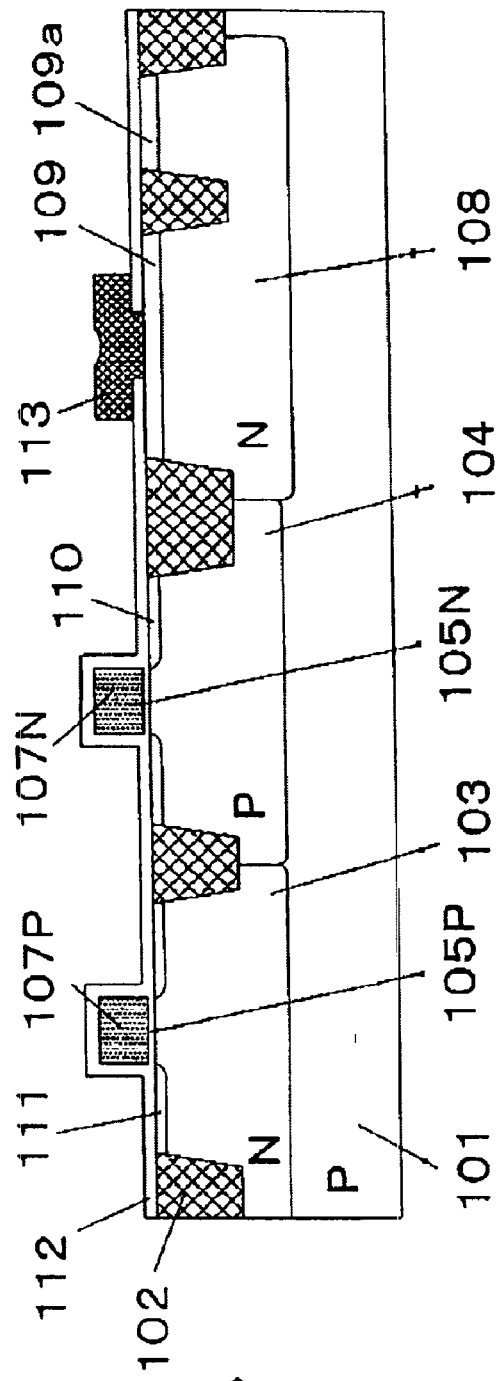
Figures 4E, 4F:
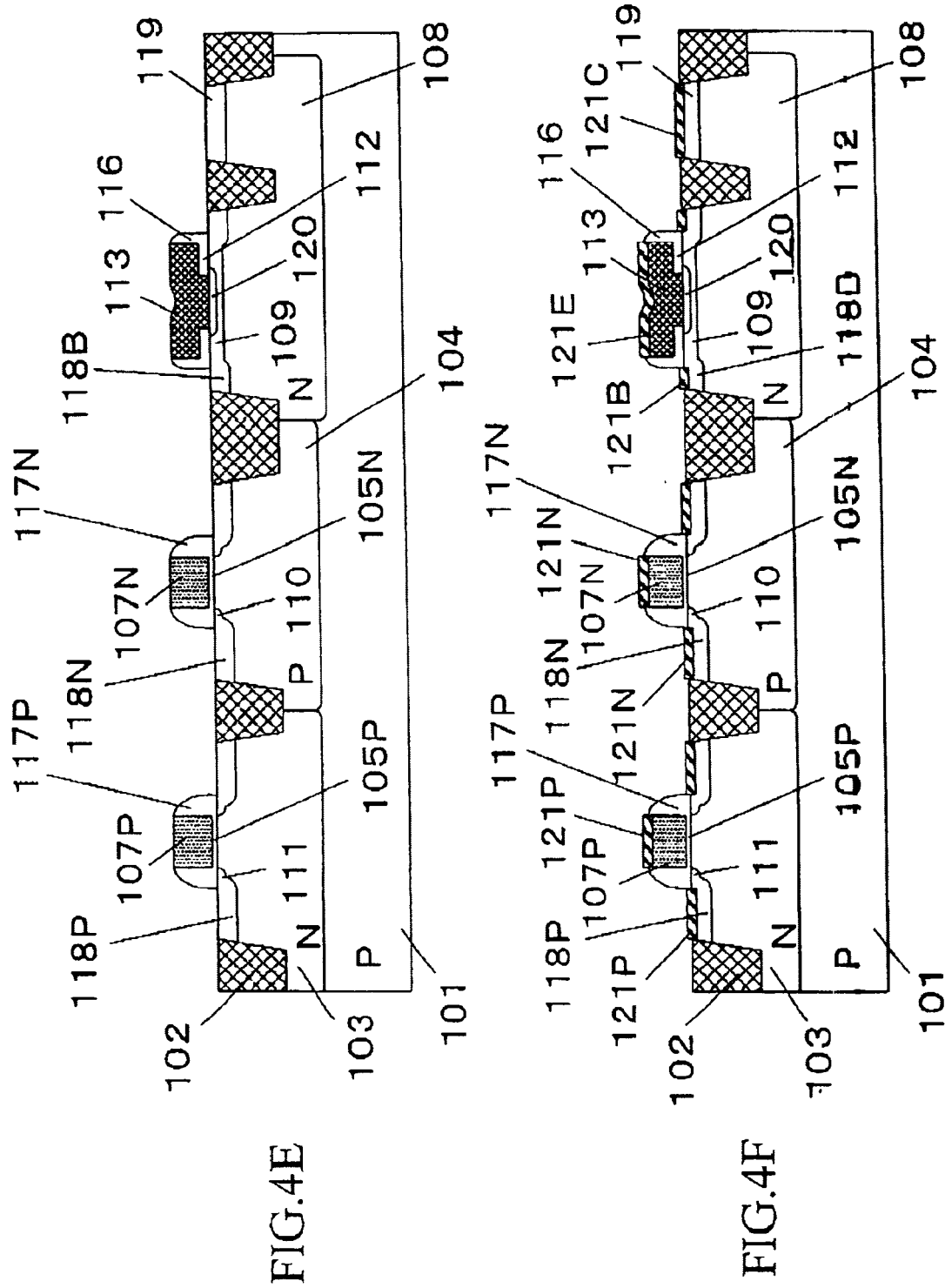
Figure 4G:
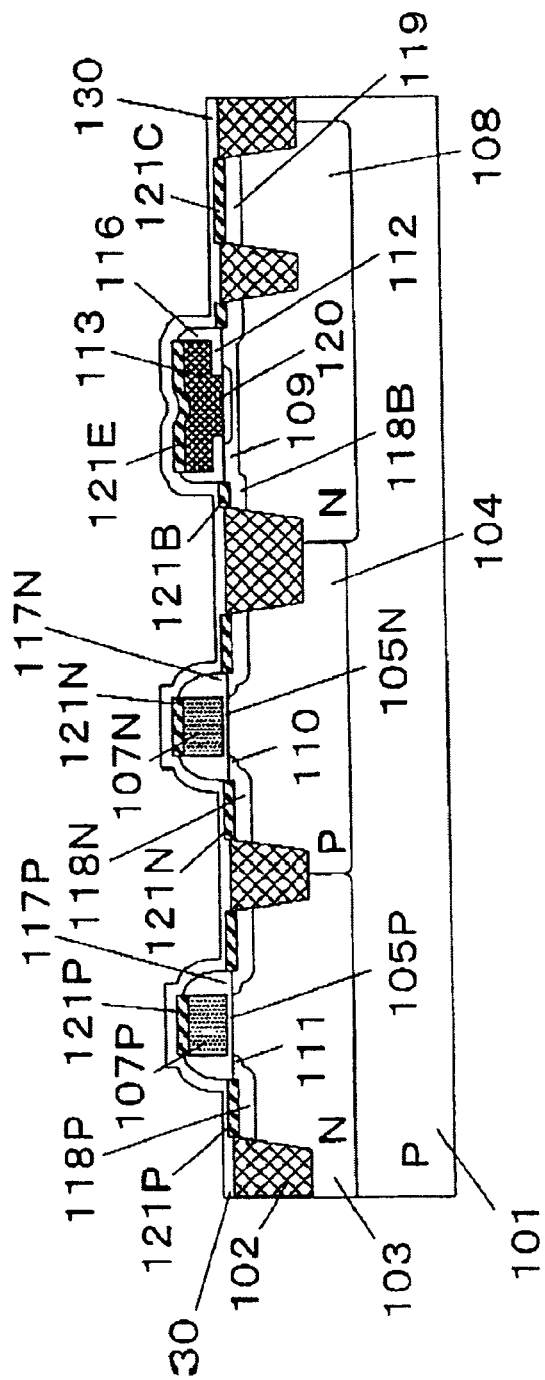
Figure 4H:
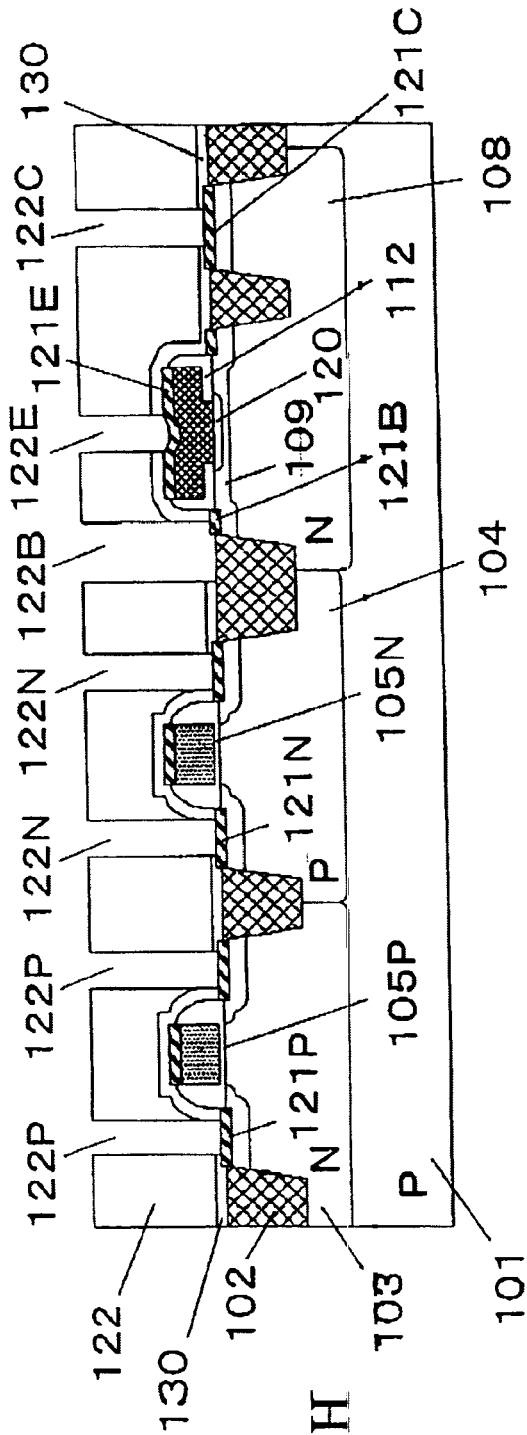
Figure 4I:
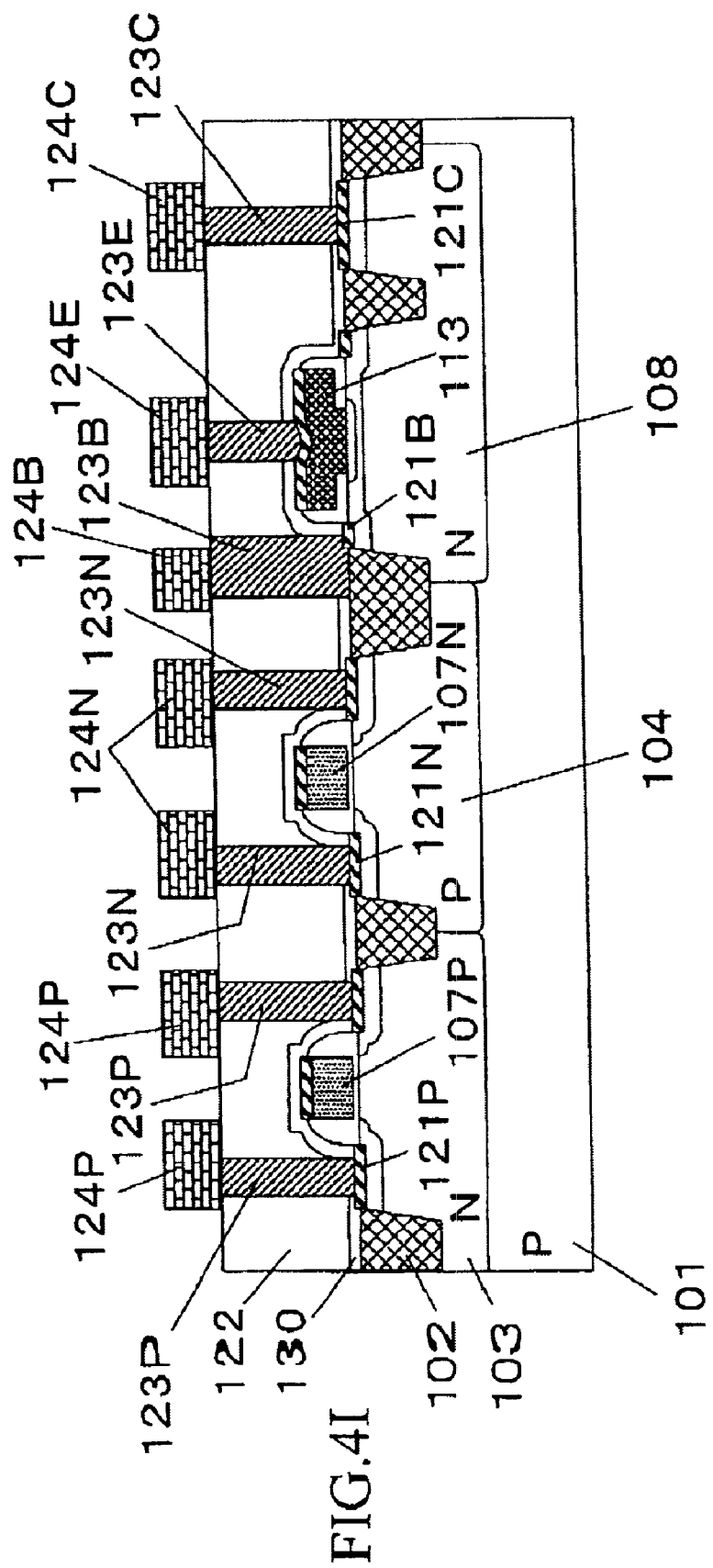

FIGS. 4A to 4I show a method of fabricating the BiCMOS semiconductor device of the second embodiment. FIG. 4I shows the structure of this device.

First, as shown in FIG. 4A, an isolation oxide 102 is formed on a p-type Si substrate 101 by a known method. A p-type well 104 and a n-type well 103 are formed on the substrate 101 to be adjacent to each other by a know method.

Next, as shown in FIG. 4B, a gate oxide layer 105 with a thickness of 2 to 4 nm is formed on the surface of the substrate 101. Then, a first conductive layer 106 with a thickness of 10 to 25 nm is formed on the layer 105. The layer 106 is made of, for example, amorphous silicon, polysilicon, or doped polysilicon with phosphorus (P), arsenic (As) or boron (B).

In the step of FIG. 4C, the first conductive layer 106 is patterned to form gate electrodes 107N and 107P on the p- and N-type well regions 104 an 103, respectively. By ion-implantation of a n-type dopant, a pair of n-type diffusion regions 110 is formed in the well 104 in self-alignment to the gate electrode 107N. Similarly, by ion-implantation of a p-type dopant, a pair of p-type diffusion regions 111 is formed in the well 103 in self-alignment to the gate electrode 107P. By ion-implantation of phosphorus at 400 to 1000 keV, a n-type well region 108 is formed to be adjacent to the p-type well 104. Then, by ion-implantation of boron at approximately 4 keV or BF$_2$ at approximately 15 keV, a p-type intrinsic base region 109 and a p-type diffusion region 109$a$ are formed in the well region 108 thus formed.

In the step of FIG. 4D, a first LDD oxide layer 112 with a thickness of 20 to 80 nm is formed on the surface of the substrate 101 to cover the gate electrodes 107N and 107P. A window is formed in the layer 112 by an etching method. A second conductive layer with a thickness of 150 to 300 nm, which is made of an amorphous Si, polysilicon, or a doped polysilicon with phosphorus or arsenic, is formed on the layer 112. This conductive layer is patterned by known photolithography and etching techniques, thereby forming the emitter extraction electrode 113. In this process, a dielectric layer such as a SiN$_x$ layer with a thickness of 20 to 100 may be additionally formed on the second conductive layer and patterned. In this case, a dielectric cap is formed on the electrode 113.

In the step of FIG. 4E, a second LDD oxide layer 116 with a thickness of 40 to 100 nm is formed and patterned by a known anisotropic etching method. Thus, the sidewalls 117N are formed at each side of the gate electrode 107N and the sidewalls 117P are formed at each side of the gate electrode 107P by the remaining first and second LDD oxide layers 112. At the same time, the layer 116 is left at each side of the emitter extraction electrode 113. The layer 116 thus left serve as the sidewalls of the electrode 113 formed at each side of the electrode 113.

Thereafter, by ion-implantation of a p-type dopant into the substrate 101, the heavily-doped, p-type diffusion regions 118P are formed in the N-type well region 103 in self-alignment to the sidewalls 117P, and the heavily-doped, p-type diffusion regions 118B are formed in the N-type well region 108 in self-alignment to the sidewalls 116. The p-type diffusion regions 111 and the p-type diffusion regions 118P constitute the pair of p-type source/drain regions with the LDD (Lightly Doped Drain) structure. Similarly, by ion-implantation of a n-type dopant into the substrate 101, the heavily-doped, n-type diffusion regions 118N are formed in the p-type well region 104 in self-alignment to the sidewalls 117N. The n-type diffusion regions 110 and the n-type diffusion regions 118N constitute the pair of n-type source/drain regions the LDD structure.

Then, the substrate 101 is subjected to a RTA (Rapid Thermal Annealing) process, thereby annealing the ion-implanted regions 108P, 108N, and 118B and diffusing the n-type dopant from the electrode 113 into the region 109 in the well regions 108. Thus, the heavily-doped, n-type diffusion region (i.e., the emitter region) 120 is formed.

In the step of FIG. 4F, a cobalt (Co) layer is deposited on the substrate 101 to cover the electrodes 107P, 107N, and 113 and the sidewalls 117P, 117N, and 116 by sputtering. Then, the Co layer is reacted with the Si substrate 101 and the Si electrodes 107P, 107N, and 113 by a known method, thereby forming the CoSi$_2$ layers 121P, 121N, 121B, 121E, 121B, and 121C.

In the step of FIG. 4G, a SiN$_x$ layer with a thickness of 10 to 200 nm, which serves as the stopper layer 130, is formed to cover the whole surface of the substrate 101.

In the step of FIG. 4H, as the interlayer dielectric layer 122, a thick SiO$_2$ layer is formed on the stopper layer 130 over the whole substrate 101 by a know method. Then, the layer 122 is selectively etched by a known dry etching method, forming the contact holes 122P, 122N, 122E, 122B, and 122C. In this step, the dry etching is carried out in two processes.

Specifically, in the first etching process, the interlayer dielectric layer 122 is selectively etched while the underlying stopper layer 130 is scarcely etched, thereby exposing the stopper layer 130. This is easily realized by using a known etching condition that the etch rate ratio between the layers 122 and 130 is at 20–50:1.

In the second etching process, the underlying stopper layer 130 is selectively etched. Thus, the contact holes 122P, 122N, 122E, 122B, and 122C are formed, as shown in FIG. 4H. It is preferred that a known etching condition that the etch rate ratio between the stopper layer 130 and the isolation dielectric 102 is at 10–30:1. If so, the etching amount of the dielectric 102 can be suppressed at a satisfactory low level (e.g., about 20 nm in thickness at most).

In the step of FIG. 4I, by a known method, the contact plugs 123P, 123N, 123E, 123B, and 123C are formed to fill the corresponding contact holes 122P, 122N, 122E, 122B, and 122C, respectively. The plugs 123P, 123N, 123E, 123B, and 123C are formed by a conductive material, such as a composite material of tungsten (W) and a barrier metal Ti/TiN (i.e., a two-layer structure of a titanium (Ti) layer and a titanium nitride (TiN) layer).

Thereafter, a metal (e.g., aluminum) layer is formed on the interlayer dielectric layer 122 and patterned by a known method, thereby forming the wiring lines 124P, 124N, 124E, 124B, and 124C. The wiring lines 124P, 124N, 124E, 124B, and 124C thus formed are contacted with the top ends of the contact plugs 123P, 123N, 123E, 123B, and 123C, respectively.

As seen from FIG. 4I, the BiCMOS semiconductor device of the second embodiment comprises the BJT according to the first embodiment of FIGS. 3A and 3B and the PMOS and NMOS on the same substrate 101. Accordingly, with the semiconductor device of the second embodiment, compared with the previously-explained prior-art bipolar transistor of FIGS. 1A to 1C, the area itself of the graft base region 118B of the BJT can be reduced by approximately 50% based on the inventor's test. This means that the collector-base capacitance $C_{cb}$ can be largely reduced without increasing the base resistance $R_b$ and changing the cut-off frequency $f_T$. As a result, the maximum oscillation frequency $f_{max}$ is highly improved.

Third Embodiment

Figure 5A:
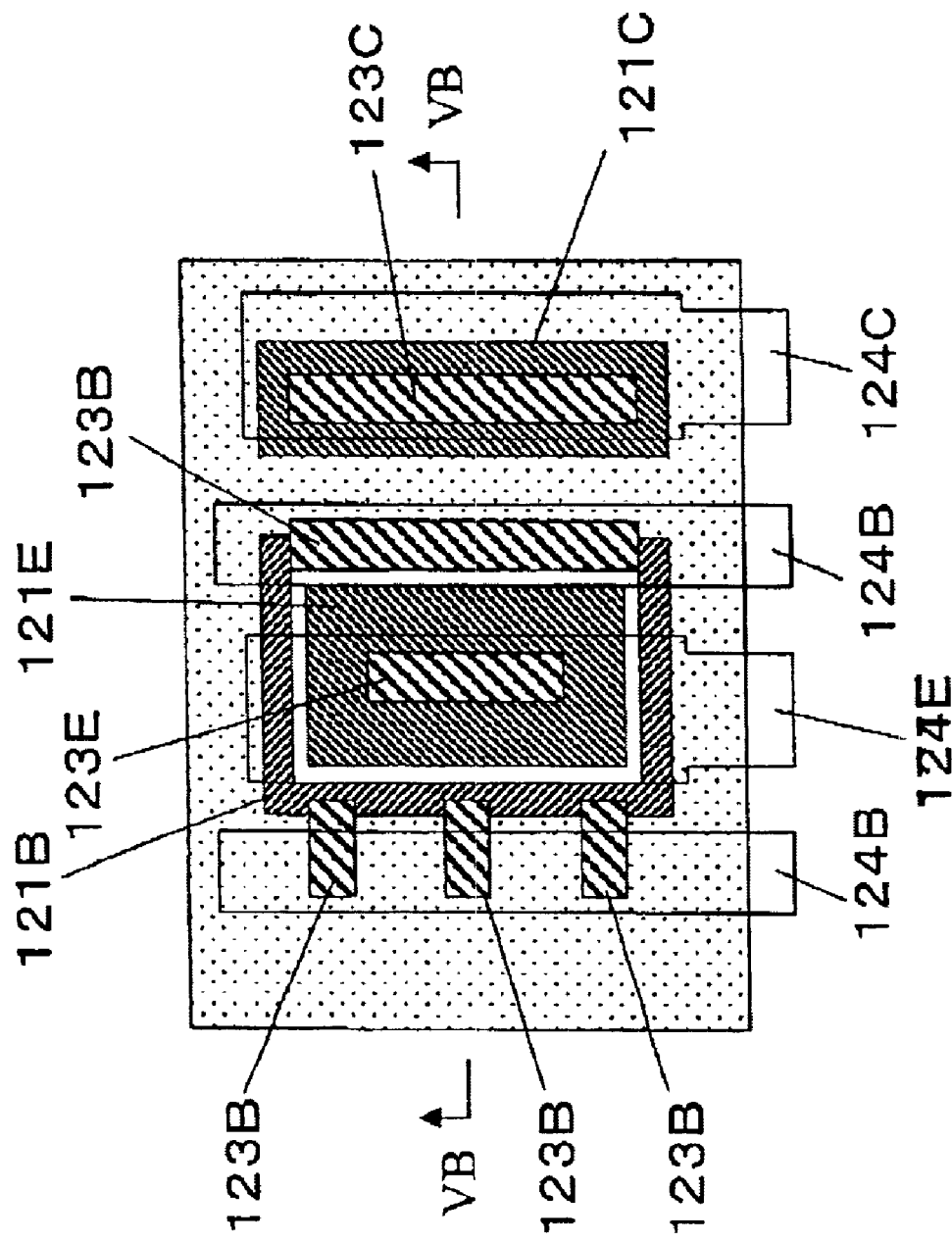
FIG. 5A is a partial plan view showing the layout of a bipolar transistor of a semiconductor device according to a third embodiment of the invention.
Figure 5B:
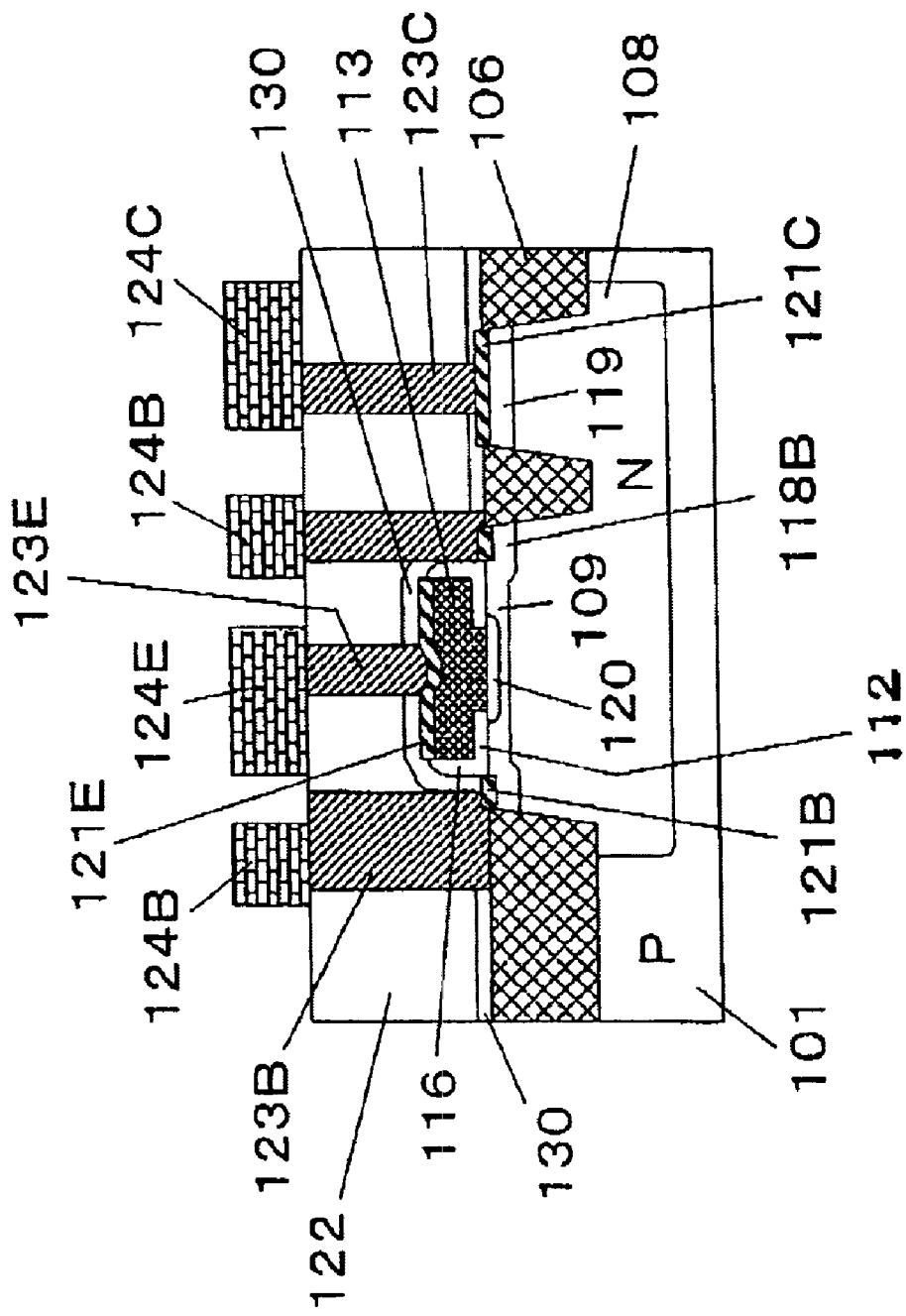
FIG. 5B is a partial, cross-sectional view along the line VB—VB in FIG. 5A, which shows the structure of the bipolar transistor according to the third embodiment of FIG. 5A.

FIGS. 5A and 5B show the structure of a semiconductor device with a bipolar transistor according to a third embodiment of the invention. This is the same in structure as that of the first embodiment of FIGS. 3A and 3B, except that a base extraction line is additionally provided. Therefore, the transistor of the third embodiment may be termed the "double-base" structure. On the other hand, the transistor of the first embodiment may be termed the "single-base" structure.

In general, if the emitter length (i.e., the length of the elongated emitter window of the dielectric layer 112) is increased, the base resistance $R_b$ will decrease accordingly. In the transistor of the first embodiment, only the base contact plug 123B is provided at one side of the emitter extraction electrode 113 to interconnect the graft base region 118B with the base wiring line 124B. Thus, the base current flows through the $CoSi_2$ layer 121B around the periphery of the electrode 113. This means that the base resistance $R_b$ tends to increase with the increasing emitter length.

Unlike this, in the transistor of the third embodiment, the base contact plugs 123B are provided at both sides of the emitter extraction electrode 113 to interconnect the graft base region 118B with the base wiring line 124B. As a result, there is an additional advantage that the base resistance $R_b$ will decrease with the increasing emitter length.

Moreover, the additional base contact plug 123B located at the right-hand side of FIGS. 5A and 5B is formed to extend parallel to the emitter contact plug 123E, as clearly shown in FIG. 5A. Therefore, the emitter wiring line 124E and the collector wiring line 124C can be formed wider than the previously-explained prior-art transistor of FIGS. 1A to 1C. This is another additional advantage.

Fourth Embodiment

Figure 6A:
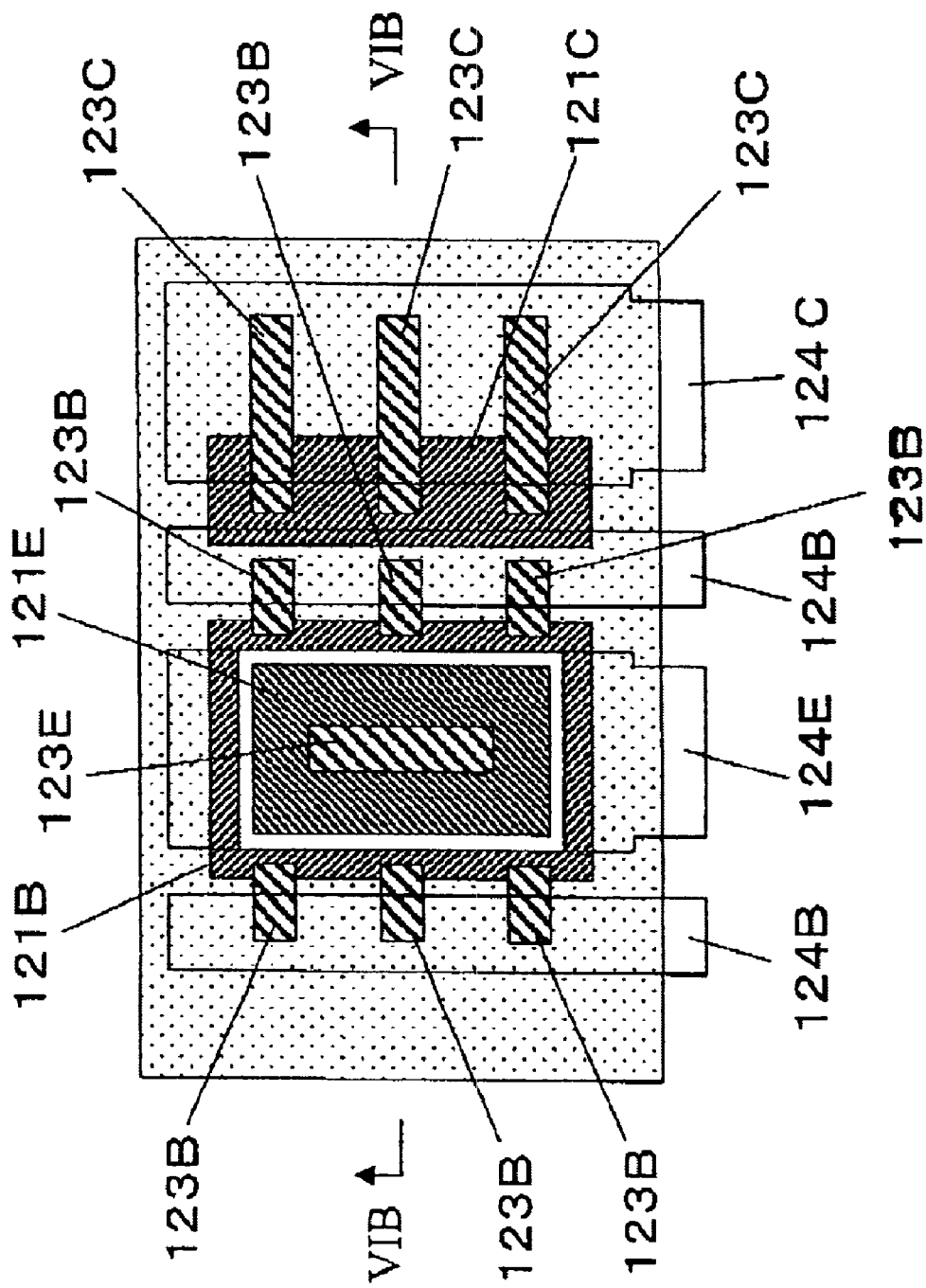
FIG. 6A is a partial plan view showing the layout of a bipolar transistor of a semiconductor device according to a fourth embodiment of the invention.

FIGS. 6A and 6B show the structure of a semiconductor device with a bipolar transistor according to a fourth embodiment of the invention. This is the same in structure as that of the third embodiment of FIGS. 5A and 5B, except that (i) the base contact plug 123B located at the right-hand side of FIG. 5A has the same configuration as the base contact plugs 123B located at the left-hand side of FIG. 5A, and that (ii) the collector contact plug 123C has a similar configuration to the base contact plugs 123B. In other words, the plug 123B parallel to the emitter contact plug 123E in the third embodiment is replaced with the three emitter contact plugs 123B perpendicular to the emitter contact plug 123E and at the same time, the collector contact plug 123C parallel to the emitter contact plug 123E in the third embodiment is replaced with the three collector contact plugs 123C perpendicular to the emitter contact plug 123E.

With the semiconductor device with the bipolar transistor of the fourth embodiment of FIGS. 6A and 6B, as seen from these figures, the emitter wiring line 124E and the collector wiring line 124C can be formed wider than the third embodiment of FIGS. 5A and 5B. This is an additional advantage of the fourth embodiment that a larger current can be flown than the third embodiment.

Fifth Embodiment

Figure 7A:
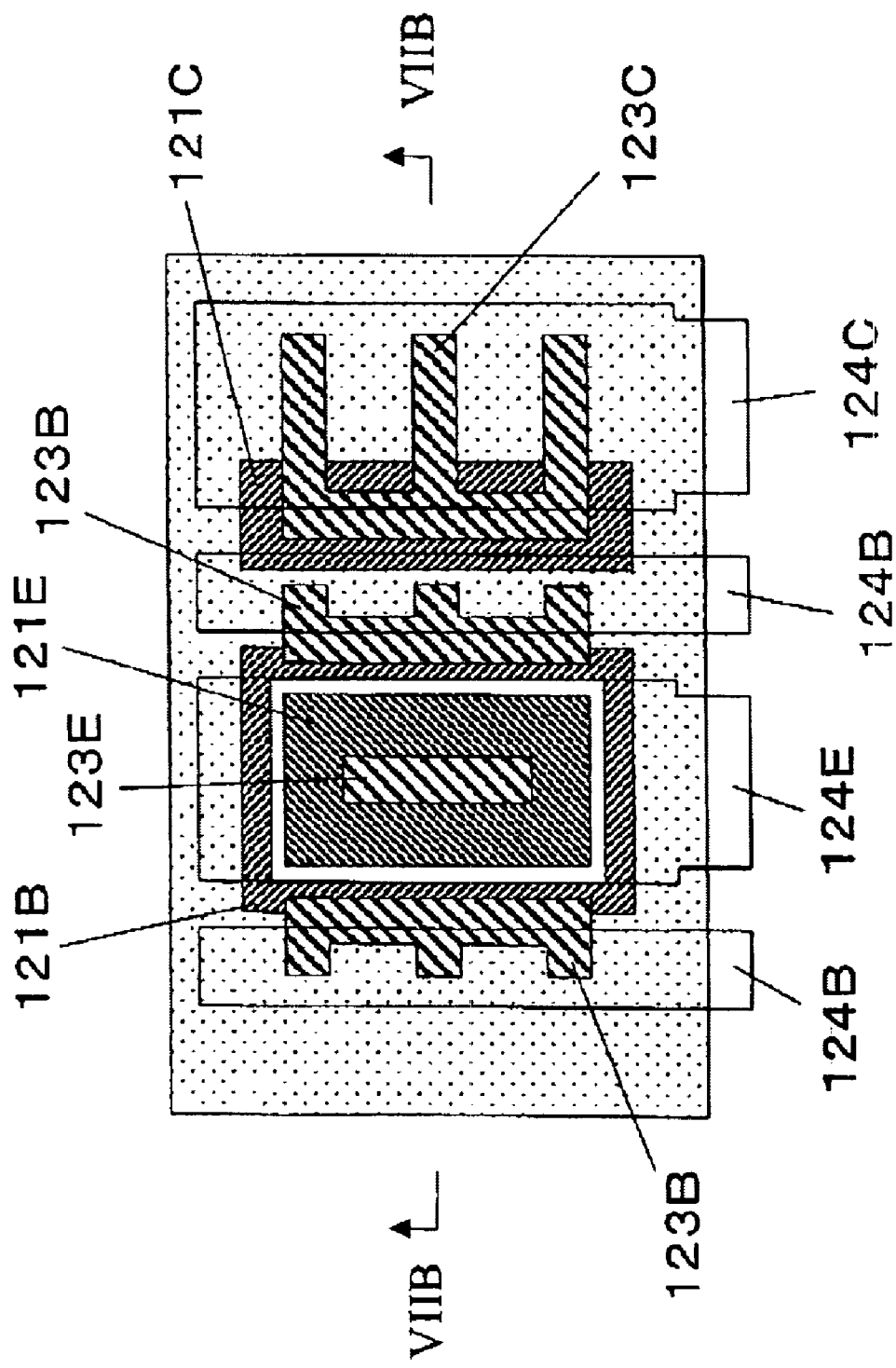
FIG. 7A is a partial plan view showing the layout of a bipolar transistor of a semiconductor device according to a fifth embodiment of the invention.
Figure 7B:
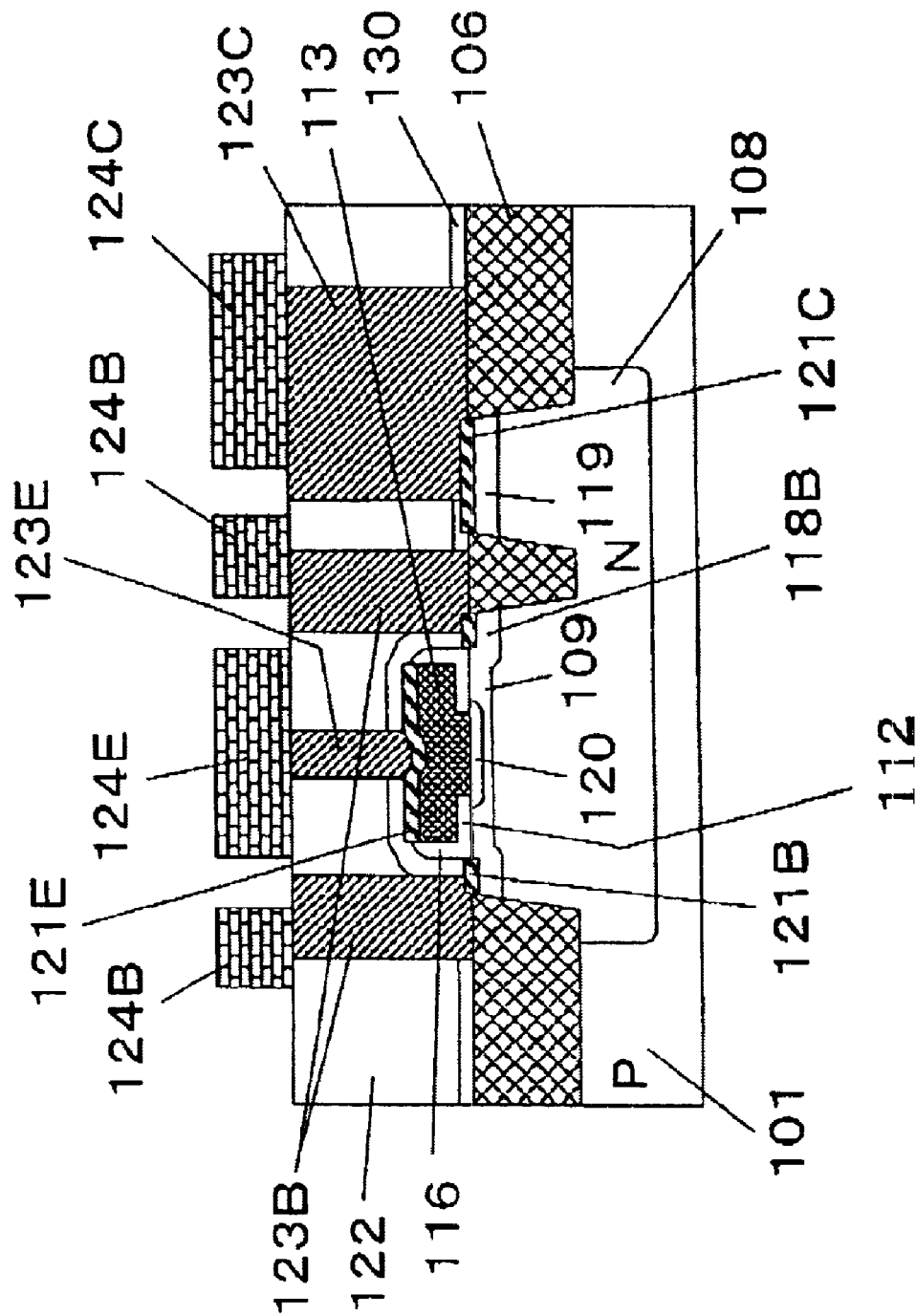
FIG. 7B is a partial, cross-sectional view along the line VIIB—VIIB in FIG. 7A, which shows the structure of the bipolar transistor according to the fifth embodiment of FIG. 7A.

FIGS. 7A and 7B show the structure of a semiconductor device with a bipolar transistor according to a fifth embodiment of the invention. This is the same in structure as that of the fourth embodiment of FIGS. 6A and 6B, except that the three base contact plugs 123B located at the left-hand side of FIG. 5A are interconnected to each other and at the same time, the three base contact plugs 123B located at the right-hand side of FIG. 5A are interconnected to each other as well. Moreover, the transistor of the fifth embodiment is different from the fourth embodiment of FIGS. 6A and 6B in that the three collector contact plugs 123C are interconnected to each other. Thus, it may be said that each of the base and collector plugs 123B and 123C has a plan shape (or pattern) like a character "E".

Sixth and Seventh Embodiments

Figure 8B:
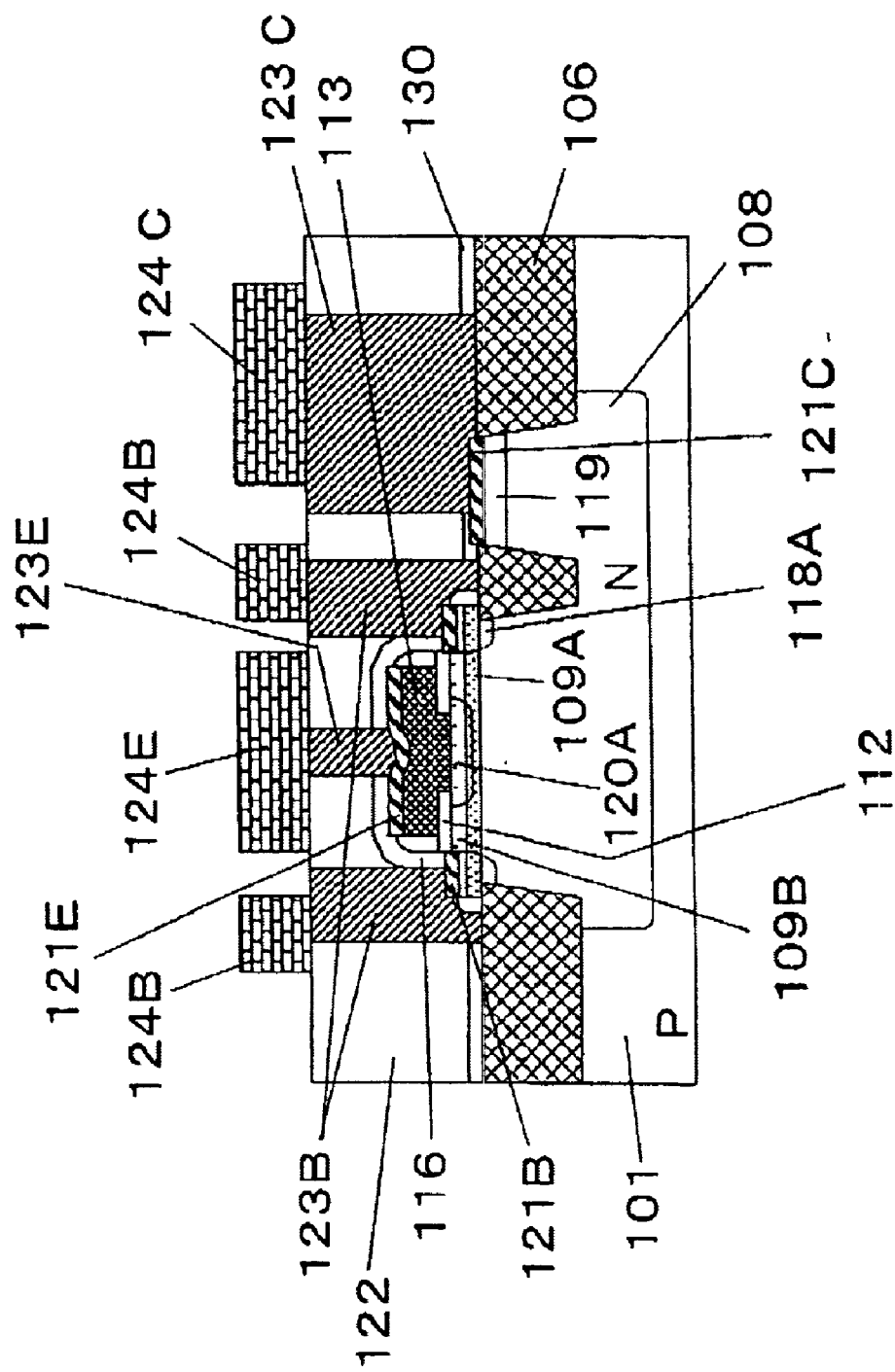
FIGS. 8B is a partial, cross-sectional view along the line VIIIB—VIIIB in FIG. 8A, which shows the structure of the bipolar transistor according to the sixth embodiment of FIG. 8A.
Figures 9E, 9F:
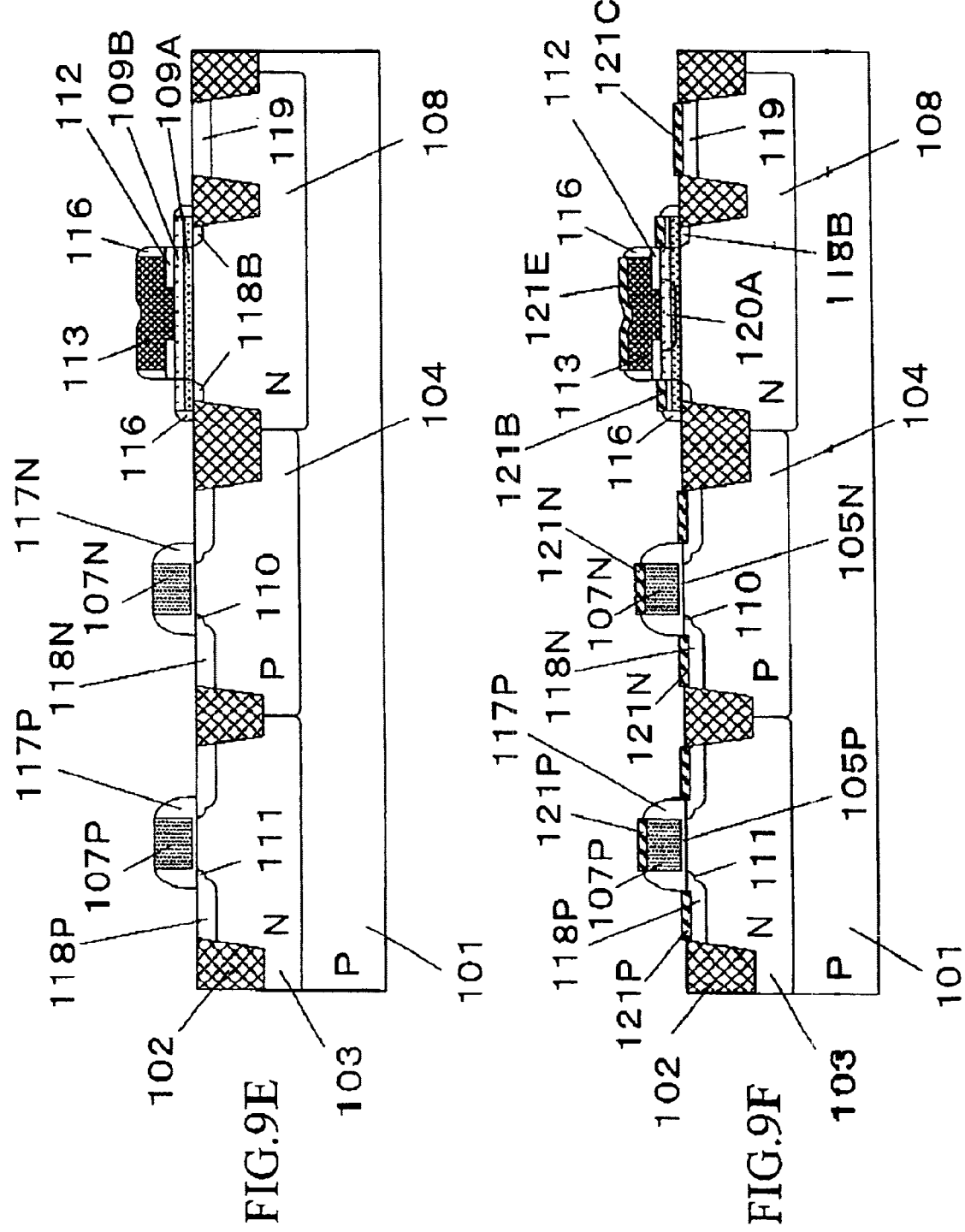

FIGS. 8A and 8B show the structure of a semiconductor device with a bipolar transistor according to a sixth embodiment of the invention. FIG. 9E shows the structure of a BiCMOS semiconductor device according to a seventh embodiment of the invention, which incorporates the bipolar transistor of the sixth embodiment.

As seen from FIG. 8A, the bipolar transistor of the sixth embodiment is the same in layout as the fourth embodiment of FIGS. 6A and 6B, except that the structure of the base/emitter region is different.

As shown in FIG. 8B, a n-type well region 108 is formed on a p-type Si substrate 101, which serves as the collector of the transistor. An isolation oxide 106 is selectively formed on the substrate 101, which separates electrically a heavily-doped, p-type diffusion region 118A from a heavily-doped, n-type diffusion region (i.e., a collector extraction region) 119.

A single-crystal SiGe layer 109A is formed on the well region 108. A single-crystal Si layer 109B is formed on the layer 109A. These two layers 109A and 109B serve as the intrinsic base region. A heavily-doped, n-type diffusion region (i.e., an emitter region) 120 is formed in the layers 109A and 109B (i.e., in the intrinsic base region). An emitter extraction electrode 113 is formed to contact the emitter region 120 by way of a window of a $SiO_2$ layer 112. A dielectric sidewall 116, which is made of $SiO_2$, covers the side faces of the electrode 113. A $CoSi_2$ layer 121E is formed on the upper face of the electrode 113. A CoSi$_2$ layer 121B is formed on the upper face of the 109B in its periphery, in other words, the layer 121B is formed on the intrinsic base region in its periphery. A CoSi$_2$ layer 121C is formed on the upper face of the collector extraction region 119.

A thin stopper dielectric layer 130, which is made of SiN$_x$, is formed to cover the entire substrate 101. A thick interlayer dielectric layer 122, which is made of SiO$_2$, is formed on the layer 130 to cover the entire substrate 101. The layer 130 has an emitter contact hole that exposes the CoSi$_2$ layer 121E, three base contact holes that expose the CoSi$_2$ layer 121B, and three collector contact holes that expose the CoSi$_2$ layer 121C.

An emitter contact plug 123E is filled into the emitter contact hole. The whole bottom end of the plug 123E is contacted with the CoSi$_2$ layer 121E. The three collector contact plugs 123C are filled into the corresponding collector contact holes. The whole bottom end of each plug 123C is contacted with the CoSi$_2$ layer 121C. Six base contact plugs 123B are filled into the corresponding base contact holes. Three plugs 123B are extended in parallel outwardly from the near end of the Si layer 109B while the other three plugs 123B are extended in parallel outwardly from the opposite ends of the Si layer 109B. Almost all of each plug 123B is placed on the isolation oxide 106, which is contacted with the CoSi$_2$ layer 121B at its emitter-side end only. Thus, the contact area of the plug 123B with the CoSi$_2$ layer 121B is extremely small.

With the semiconductor device with the bipolar transistor of the sixth embodiment shown in FIGS. 8A and 8B, unlike the above-described first to fifth embodiments, the intrinsic base region is formed by the SiGe layer 109A and the Si layer 109B. Therefore, the cut-off frequency $f_T$ can be raised compared with the previously-explained first to fifth embodiments where the intrinsic base region 109 is formed in the well region 108 by ion implantation.

Accordingly, due to rising of the cut-off frequency $f_T$ and the reduction of the collector-base capacitance $C_{cb}$, the maximum oscillation frequency $f_{max}$ is raised more than the first to fifth embodiments.

Figure 9I:
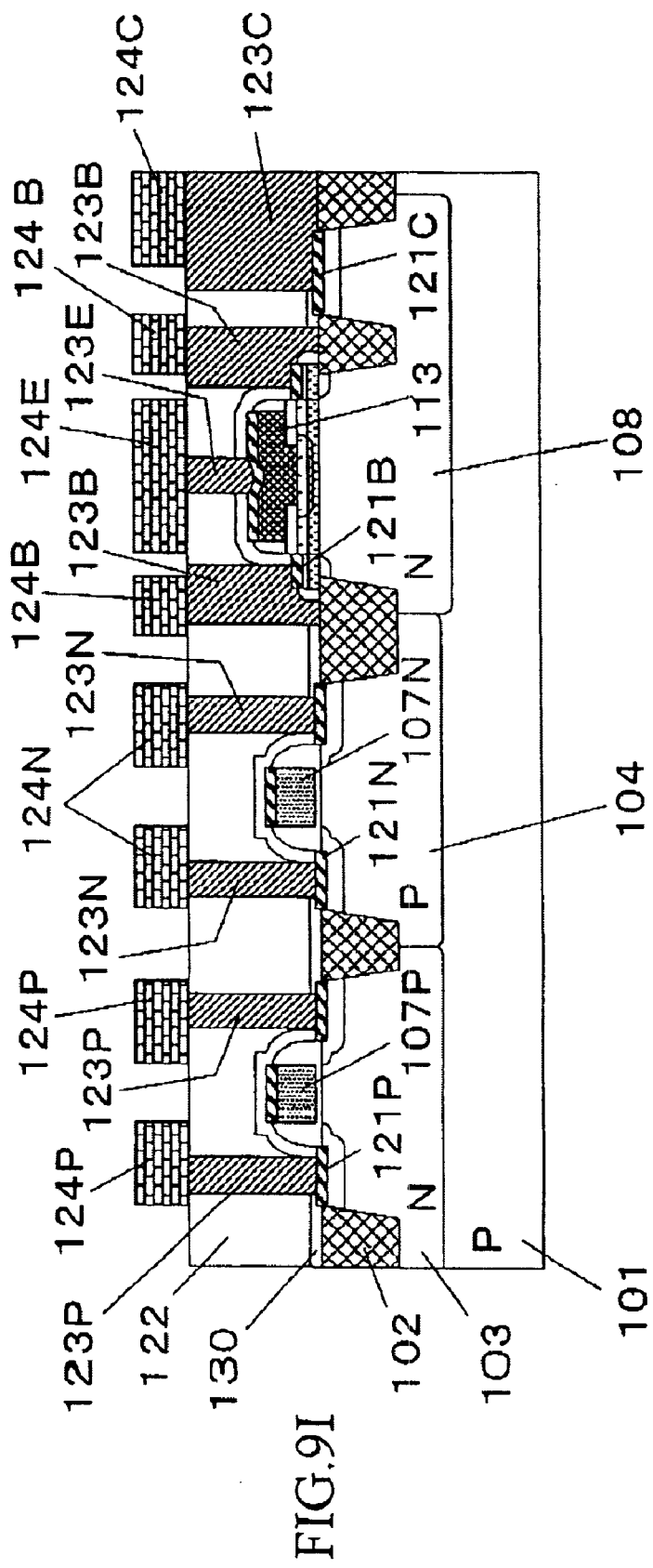

FIGS. 9A to 9I show a method of fabricating the BiCMOS semiconductor device of the seventh embodiment. FIG. 9I shows the structure of this device.

First, as shown in FIG. 9A, an isolation oxide 102 is formed on a p-type Si substrate 101 by a known method. A p-type well 104 and a n-type well 103 are formed on the substrate 101 to be adjacent to each other by a known method.

Next, as shown in FIG. 9B, a gate oxide layer 105 with a thickness of 2 to 4 nm is formed on the surface of the substrate 101. Then, a first conductive layer 106 with a thickness of 10 to 25 nm is formed on the layer 105. The layer 106 is made of, for example, amorphous silicon, polysilicon, or doped polysilicon with P, As or B.

These process steps are the same as those of the first embodiment shown in FIGS. 4A and 4B.

In the step of FIG. 9C, the first conductive layer 106 is patterned to form gate electrodes 107N and 107P on the p- and N-type well regions 104 an 103, respectively. By ion-implantation of a n-type dopant, a pair of n-type diffusion regions 110 is formed in the well 104 in self-alignment to the gate electrode 107N. Similarly, by ion-implantation of a p-type dopant, a pair of p-type diffusion regions 111 is formed in the well 103 in self-alignment to the gate electrode 107P. By ion-implantation of P at 400 to 1000 keV, a n-type well region 108 is formed to be adjacent to the p-type well 104. Unlike the step of FIG. 4C, the ion-implantation process for forming the intrinsic base region 109 and the diffusion region 109a is not carried out here.

In the step of FIG. 9D, a first LDD oxide layer 112 with a thickness of 20 to 80 nm is formed on the surface of the substrate 101 to cover the gate electrodes 107N and 107P. A window is then formed in the layer 112 at a specific location for the intrinsic base region by known photolithography and etching methods. Thus, the surface of the n-type well region 108 is selectively exposed from the layer 112.

Thereafter, the SiGe layer 109A, which contains 5 to 30% of Ge, is epitaxially grown on the first LDD oxide layer 112 over the whole substrate 101. The layer 109A is doped with a p-type dopant (e.g., B or In) at a concentration of $1 \times 10^{18}$ to $5 \times 10^{20}$ cm$^{-3}$. The layer 109A has a thickness of 20 to 100 nm. Then, the single-crystal Si layer 109B is epitaxially grown on the layer 109A over the whole substrate 101. The layer 109B gas a thickness of 20 to 50 nm. Furthermore, the dielectric layer 130A is formed on the Si layer 109B over the whole substrate 101. Thereafter by using known photolithography and etching techniques, the dielectric layer 130A is selectively removed to form an emitter window that exposes the Si layer 109B.

A second conductive layer with a thickness of 150 to 300 nm, which is made of an amorphous Si, polysilicon, or a doped polysilicon with P, or As, is formed on the layer 130A. This conductive layer is patterned by known photolithograpy and etching techniques, thereby forming the emitter extraction electrode 113. Thereafter, a patterned photoresist film 131 is formed and then, the dielectric layer 130A, the Si layer 109A, and the SiGe layer 109A are patterned to form the intrinsic base region on the n-type well region 108, as shown in FIG. 9D. The intrinsic base region is formed by the layers 109A and 109B thus patterned.

Although not shown in FIGS. 9D to 9I, the single-crystal Si layer 109A has a polycrystalline part at its periphery which is overlapped with the isolation dielectric 102.

A SiGe—C layer, which is a SiGe layer doped with carbon (C) at about 1%, may be used instead of the SiGe layer 109B. This is because the diffusion rate of the p-type dopant in the layer is delayed and the heat-resistant property is enhanced due to addition of C.

The intrinsic base region, which is formed by the patterned SiGe layer 109A (20 to 100 nm in thickness) and the patterned Si layer 109B (20 to 50 nm in thickness), may be formed by a known selective growth method. In this case, if the dielectric layer 130A is patterned by using the photoresist film 131, the resultant intrinsic base region has approximately the same cross section as that of FIG. 9D.

In the step of forming the intrinsic base region, if the SiGe layer 109A is directly grown on the surface of the n-type well region 108, crystal defects are likely to occur because of the difference of crystal lattice size. If a relaxation layer, which is made of single-crystal Si doped with a n-type dopant and which has a thickness of 10 to 20 nm, is additionally provided between the SiGe (or SiGe—C) layer 109A and the Si well region 108, the occurrence of crystal defects is suppressed. Therefore, it is preferred to use this method.

In the step of FIG. 9E, a second LDD oxide layer 116 with a thickness of 40 to 100 nm is formed and patterned by a known anisotropic etching method. Thus, the sidewalls 117N are formed at each side of the gate electrode 107N and the sidewalls 117P are formed at each side of the gate electrode 107P by the remaining first and second LDD oxide layers 112. At the same time, the layer 116 is left at each side of the emitter extraction electrode 113 and the intrinsic base region (i.e., the SiGe layer 109A and Si layer 109B). The layer 116 thus left serve as the sidewalls of the electrode 113 formed at each side of the electrode 113.

Thereafter, by ion-implantation of a p-type dopant into the substrate 101, the heavily-doped, p-type diffusion regions 118P are formed in the N-type well region 103 in self-alignment to the sidewalls 117P, and the heavily-doped, p-type diffusion regions 118B are formed in the N-type well region 108 in self-alignment to the sidewalls 116. The p-type diffusion regions 111 and the p-type diffusion regions 118P constitute the pair of p-type source/drain regions with the LDD structure. Similarly, by ion-implantation of a n-type dopant into the substrate 101, the heavily-doped, n-type diffusion regions 118N are formed in the p-type well region 104 in self-alignment to the sidewalls 117N. The n-type diffusion regions 110 and the n-type diffusion regions 118N constitute the pair of n-type source/drain regions the LDD structure.

In the step of FIG. 9F, the substrate 101 is subjected to a RTA process, thereby annealing the ion-implanted regions 108P, 108N, and 118B and diffusing the n-type dopant from the electrode 113 into the intrinsic region (i.e., the SiGe and Si layers 109A and 109B). Thus, the heavily-doped, n-type diffusion region (i.e., the emitter region) 120 is formed in the intrinsic region over the substrate 101.

Then, a Co layer is deposited on the substrate 101 to cover the electrodes 107P, 107N, and 113 and the sidewalls 117P, 117N, and 116 by sputtering. Then, the Co layer is reacted with the Si substrate 101 and the Si electrodes 107P, 107N, and 113 by a known method, thereby forming the $CoSi_2$ layers 121P, 121N, 121E, 121B, and 121C.

In the step of FIG. 9G, a $SiN_x$ layer with a thickness of 10 to 200 nm, which serves as the stopper layer 130, is formed to cover the whole surface of the substrate 101.

In the step of FIG. 9H, as the interlayer dielectric layer 122, a thick $SiO_2$ layer is formed on the stopper layer 130 over the whole substrate 101 by a known method. Then, the layer 122 is selectively etched by a known dry etching method, forming the contact holes 122P, 122N, 122E, 122B, and 122C. In this step, the dry etching is carried out in two processes.

Specifically, in the first etching process, the interlayer dielectric layer 122 is selectively etched while the underlying stopper layer 130 is scarcely etched, thereby exposing the stopper layer 130. This is easily realized by using a known etching condition that the etch rate ratio between the layers 122 and 130 is at 10–30:1.

In the second etching process, the underlying stopper layer 130 is selectively etched. Thus, the contact holes 122P, 122N, 122E, 122B, and 122C are formed, as shown in FIG. 9H. It is preferred that a known etching condition that the etch rate ratio between the stopper layer 130 and the isolation dielectric 102 is at 10–30:1. If so, the etching amount of the dielectric 102 can be suppressed at a satisfactory low level (e.g., about 20 nm in thickness at most).

In the step of FIG. 9I, by a known method, the contact plugs 123P, 123N, 123E, 123B, and 123C are formed to fill the corresponding contact holes 122P, 122N, 122E, 122B, and 122C, respectively. The plugs 123P, 123N, 123E, 123B, and 123C are formed by a conductive material, such as a composite material of W and a barrier metal Ti/TiN.

Thereafter, a metal (e.g., aluminum) layer is formed on the interlayer dielectric layer 122 and patterned by a known method, thereby forming the wiring lines 124P, 124N, 124E, 124B, and 124C. The wiring lines 124P, 124N, 124E, 124B, and 124C thus formed are contacted with the top ends of the contact plugs 123P, 123N, 123E, 123B, and 123C, respectively.

As seen from FIG. 9I, the BiCMOS semiconductor device of the seventh embodiment comprises the BJT according to the sixth embodiment of FIGS. 8A and 8B and the PMOS and NMOS on the same substrate 101. Accordingly, with the semiconductor device of the seventh embodiment, the collector-base capacitance $C_{cb}$ can be largely reduced without increasing the base resistance $R_b$ and changing the cut-off frequency $f_T$. As a result, the maximum oscillation frequency $f_{max}$ is highly improved.

Figure 10A:
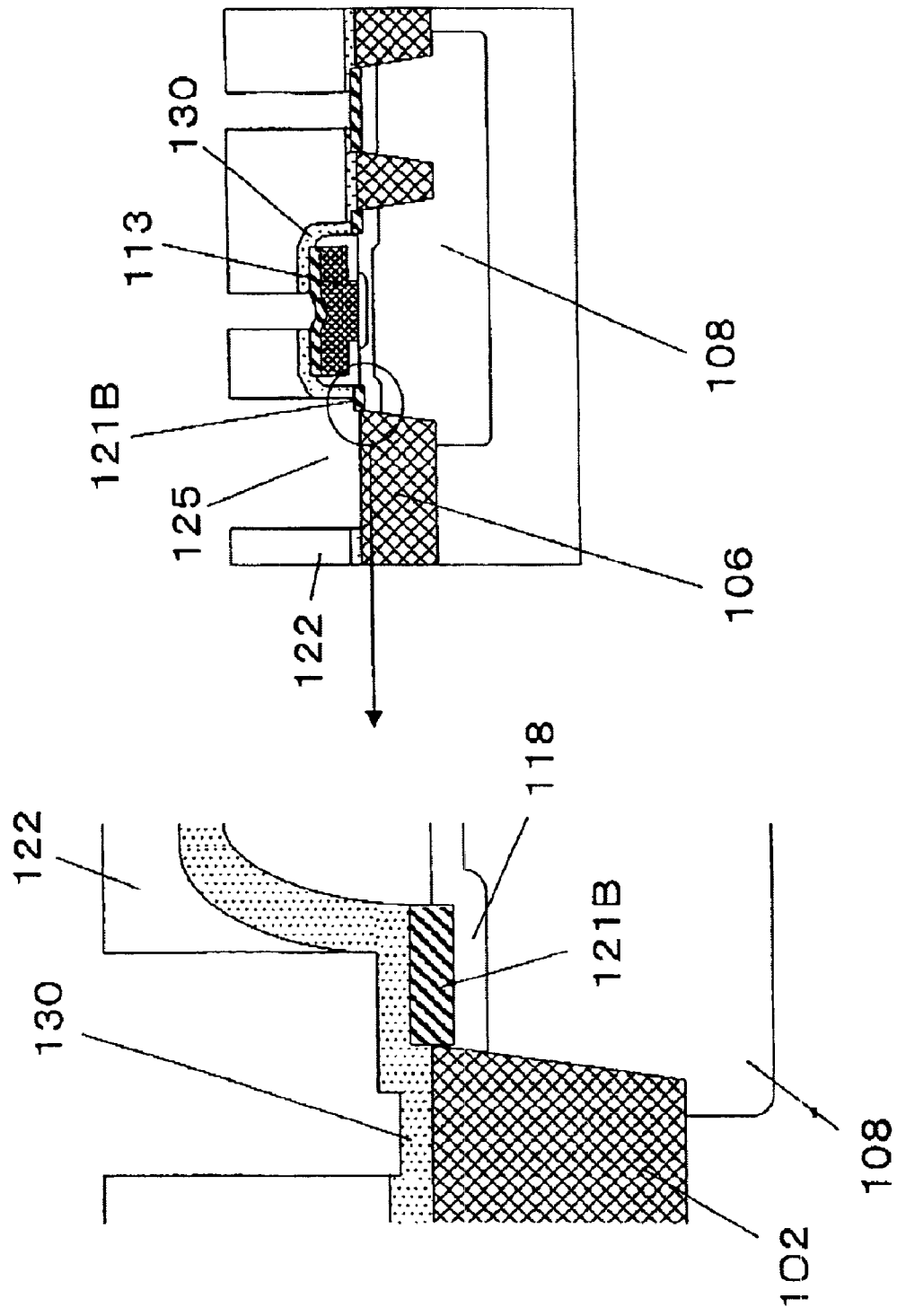
FIGS. 10A and 10B are schematic views showing the reason for the advantage of the invention, respectively.
Figure 10B:
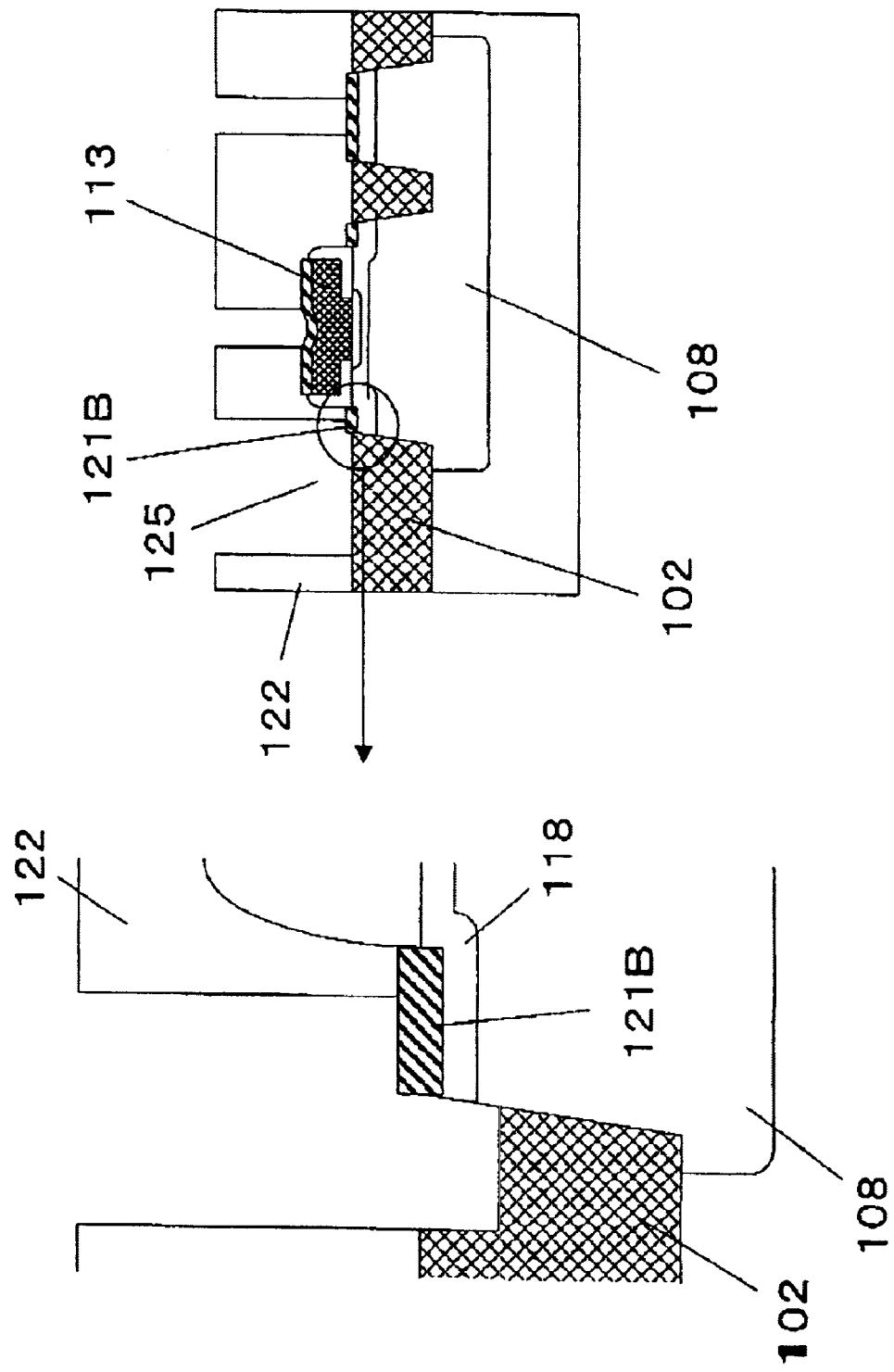

FIGS. 10A and 10B are to explain the function of the stopper dielectric layer 130 in the invention.

If the stopper dielectric layer ($SiN_x$) 130 is not formed, as shown in FIG. 10B, if placement error occurs in the contact-hole formation process for forming the contact holes 122P, 122N, 122E, 122B, and 122C in the interlayer dielectric layer ($SiO_2$) 122, the isolation oxide ($SiO_2$) 102 will be etched unintentionally. Thus, desired isolation characteristics will not be available. If the oxide 102 is etched to a depth greater than the depth of the p-n junction of the diffusion region 118B, the region 118B is connected to the well region 108 by way of the contact plug 123B (not shown) resulting in electrical short-circuit.

Unlike this, if the stopper dielectric layer ($SiN_x$) 130 is formed, as shown in FIG. 10A, even if placement error occurs in the contact-hole formation process, the above-described problem of short circuit will not occur because of the following reason.

When the etching condition is chosen in such a way that the etch rate ratio between $SiN_x$ and $SiO_2$ is 20–50:1, which is easily realized with a known etchant, the interlayer dielectric layer 122 can be selectively etched at a satisfactorily high etch selectivity (i.e., the stopper dielectric layer 130 is scarcely etched). When the etching condition is chosen in such a way that the etch rate ratio between $SiN_x$ and $SiO_2$ is 10–30:1, which is easily realized with a known etchant, the stopper dielectric layer 130 can be selectively etched at a satisfactorily high etch selectivity (i.e., the isolation oxide 102 is scarcely etched).

Eighth and Ninth Embodiments

FIGS. 11A and 11B show the structure of a semiconductor device with a bipolar transistor according to an eighth embodiment of the invention. FIG. 12I shows the structure of a BiCMOS semiconductor device according to a ninth embodiment of the invention, which incorporates the bipolar transistor of the eighth embodiment.

As seen from FIG. 11A, the bipolar transistor of the eighth embodiment is the same in layout as that of the fourth embodiment of FIGS. 6A and 6B, except that the structure of the base/emitter region is different and that the SiGe layer 109A and the Si layer 109B are formed by a known selective growth method.

As shown in FIG. 11B, a n-type well region 108 is formed on a p-type Si substrate 101, which serves as the collector of the transistor. An isolation oxide 106 is selectively formed on the substrate 101, which separates electrically a heavily-doped, p-type diffusion region (i.e., a graft base region) 118A from a heavily-doped, n-type diffusion region (i.e., a collector extraction region) 119.

A single-crystal SiGe layer 109A is formed on the well region 108. A single-crystal Si layer 109B is formed on the layer 109A. These two layers 109A and 109B serve as the intrinsic base region. Unlike the sixth embodiment, each of these layers 109A and 109B has inclined end faces at its ends. These inclined end faces are termed "facets".

A heavily-doped, n-type diffusion region (i.e., an emitter region) 120 is formed in the layers 109A and 109B (i.e., in the intrinsic base region). An emitter extraction electrode 113 is formed to contact the emitter region 120 by way of a window of a SiO$_2$ layer 112. A dielectric sidewall 116, which is made of SiO$_2$, covers the side faces of the electrode 113. A CoSi$_2$ layer 121E is formed on the upper face of the electrode 113. A CoSi$_2$ layer 121B is formed on the facets of the SiGe layer 109A and the Si layer 109B. A CoSi$_2$ layer 121C is formed on the upper face of the collector extraction region 119.

A thin stopper dielectric layer 130, which is made of SiN$_x$, is formed to cover the entire substrate 101. A thick interlayer dielectric layer 122, which is made of SiO$_2$, is formed on the layer 130 to cover the entire substrate 101. The layer 130 has an emitter contact hole that exposes the CoSi$_2$ layer 121E, six base contact holes that expose the CoSi$_2$ layer 121B, and three collector contact holes that expose the CoSi$_2$ layer 121C.

An emitter contact plug 123E is filled into the emitter contact hole. The whole bottom end of the plug 123E is contacted with the CoSi$_2$ layer 121E. The three collector contact plugs 123C are filled into the corresponding collector contact holes. The bottom end of each plug 123C is contacted with the CoSi$_2$ layer 121C at its left-side part. Six base contact plugs 123B are filled into the corresponding base contact holes. Three plugs 123B are extended in parallel outwardly from the near end of the Si layer 109B while the other three plugs 123B are extended in parallel outwardly from the opposite ends of the Si layer 109B. Almost all of each plug 123B is placed on the isolation oxide 106, which is contacted with the CoSi$_2$ layer 121B at its emitter side and only Thus, the contact area of each plug 123B with the CoSi$_2$ layer 121B is extremely small.

With the semiconductor device with the bipolar transistor of the eighth embodiment shown in FIGS. 11A and 11B, the same advantages as those in the sixth embodiment of FIGS. 8A and 8B are obtainable.

Figure 12A:
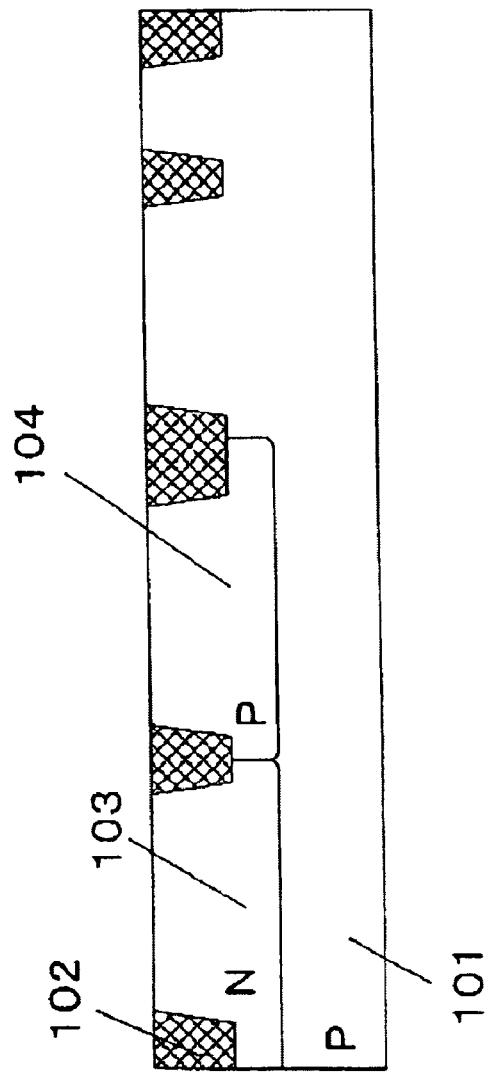
Figure 12B:
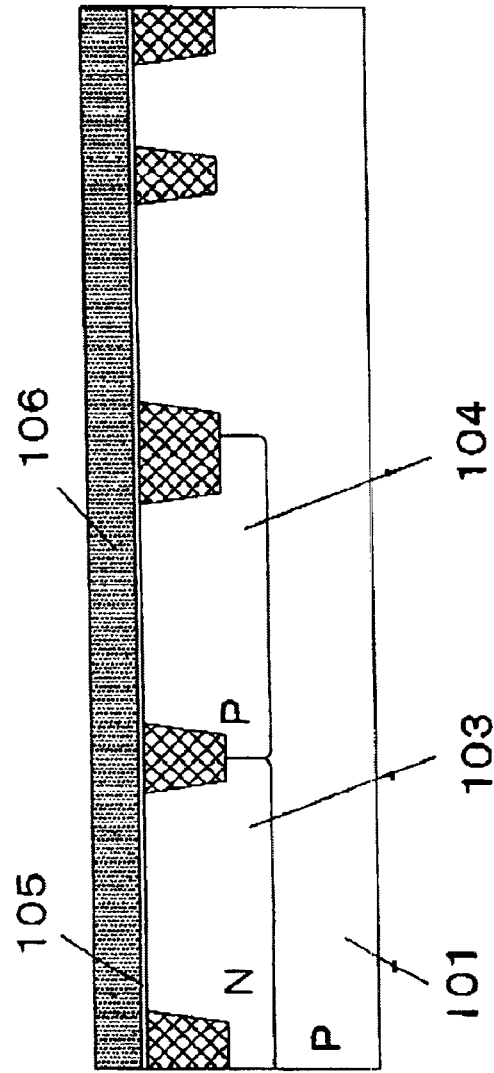
Figure 12E:
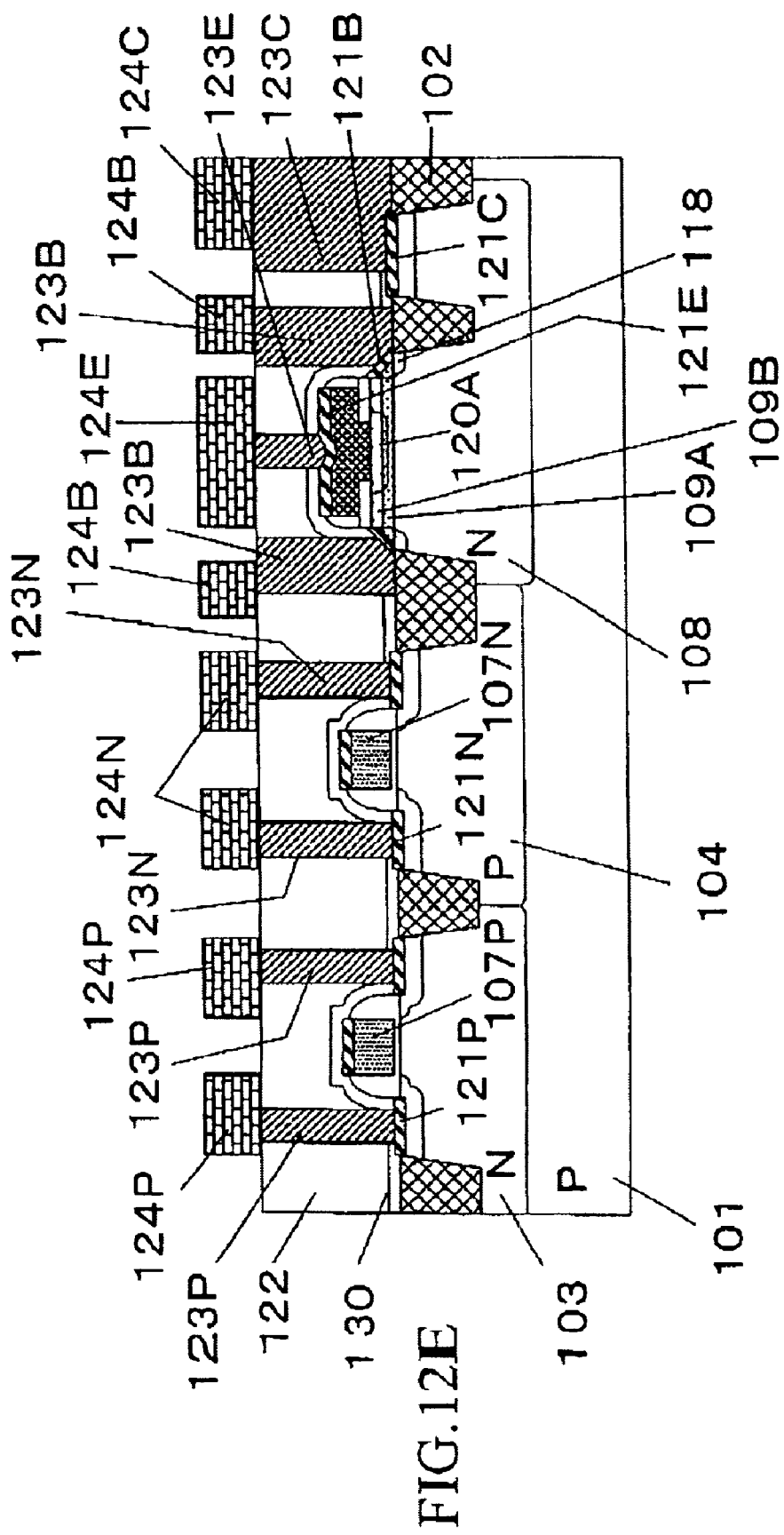

FIGS. 12A to 12E show a method of fabricating the BiCMOS semiconductor device of the ninth embodiment. FIG. 12E shows the structure of this device.

First, as shown in FIG. 12A, an isolation oxide 102 is formed on a p-type Si substrate 101. A p-type well 104 and a n-type well 103 are formed on the substrate 101 to be adjacent to each other.

Next, as shown in FIG. 12B, a gate oxide layer 105 with a thickness of 2 to 4 nm is formed on the surface of the substrate 101. Then, a first conductive layer 106 with a thickness of 10 to 25 nm is formed on the layer 105. The layer 106 is made of, for example, amorphous silicon, polysilicon, or doped polysilicon with P, As or B.

These process steps are the same as those of the first embodiment shown in FIGS. 4A and 4B.

In the step of FIG. 12C, the first conductive layer 106 is patterned to form gate electrodes 107N and 107P on the p- and N-type well regions 104 an 103, respectively. By ion-implantation of a n-type dopant, a pair of n-type diffusion regions 110 is formed in the well 104 in self-alignment to the gate electrode 107N. Similarly, by ion-implantation of a p-type dopant, a pair of p-type diffusion regions 111 is formed in the well 103 in self-alignment to the gate electrode 107P. By ion-implantation of P at 400 to 1000 keV, a n-type well region 108 is formed to be adjacent to the p-type well 104. Unlike the step of FIG. 4C, the ion-implantation process for forming the intrinsic base region 109 and the diffusion region 109a is not carried out here.

In the step of FIG. 12D, a first LDD oxide layer 112 with a thickness of 20 to 80 nm is formed on the surface of the substrate 101 to cover the gate electrodes 107N and 107P. A window is then formed in the layer 112 at a specific location for the intrinsic and graft base regions (i.e., the emitter/base region) by known photolithography and etching methods. Thus, the surface of the n-type well region 108 is selectively exposed from the layer 112.

Thereafter, the SiGe layer 109A, which contains 5 to 30% of Ge, is epitaxially and selectively grown on the exposed surface of the well region 108. The layer 109A is doped with a p-type dopant (e.g., B or In) at a concentration of $1 \times 10^{18}$ to $5 \times 10^{20}$ cm$^{-3}$. The layer 109A has a thickness of 20 to 100 nm. Then, the single-crystal Si layer 109B is epitaxially and selectively grown on the layer 109A. The layer 109B gas a thickness of 20 to 50 nm. The layers 109A and 109B have the facets, as shown in FIG. 12D. Furthermore, the dielectric layer 130A is formed on the Si layer 109B over the whole substrate 101. Thereafter, by using known photolithography and etching techniques, the dielectric layer 130A is selectively removed to form an emitter window that exposes the Si layer 109B.

A second conductive layer with a thickness of 150 to 300 nm, which is made of an amorphous Si, polysilicon, or a doped polysilicon with P, or As, is formed on the layer 130A. This conductive layer is patterned by known photolithography and etching techniques using a patterned photoresist film 131A, thereby forming the emitter extraction electrode 113. The intrinsic base region is formed by the layers 109A and 109B.

A SiGe—C layer may be used instead of the SiGe layer 109B. This is because the diffusion rate of the p-type dopant in the layer is delayed and the heat-resistant property is enhanced due to addition of C.

In the step of forming the intrinsic base region, if the SiGe layer 109A is directly grown on the surface of the n-type well region 108, crystal defects are likely to occur because of the difference of crystal lattice size. If a relaxation layer, which is made of single-crystal Si doped with a n-type dopant and which has a thickness of 10 to 20 nm, is additionally provided between the SiGe (or SiGe—C) layer 109A and the Si well region 109, the occurrence of crystal defects is suppressed. Therefore, it is preferred to use this method.

The subsequent steps are the same as those of the seventh embodiment of FIGS. 9E to 9I.

As seen from FIG. 12E, the BiCMOS semiconductor device of the ninth embodiment comprises the BJT according to the eighth embodiment of FIGS. 11A and 11B and the PMOS and NMOS on the same substrate 101. Accordingly, with the semiconductor device of the ninth embodiment, the same advantage as those in the seventh embodiment are obtainable.

There is an additional advantage that the parasitic capacitance of the base extraction section is reduced, because the SiGe layer 109A and the Si layer 109B are selectively formed on the exposed surface of the n-type well region 108 by the selective growth method.

Tenth and Eleventh Embodiments

Figure 13A:
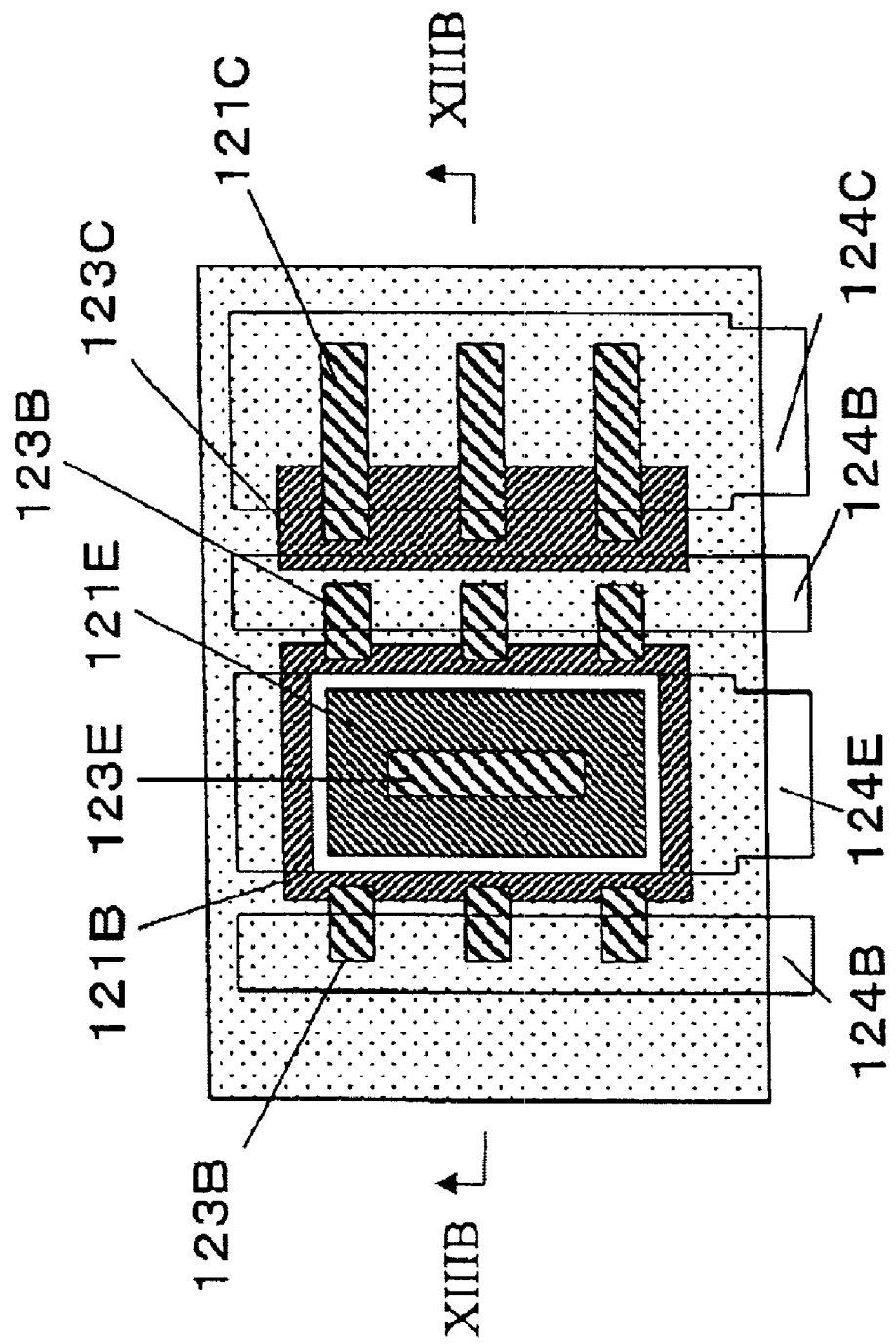
FIG. 13A is a partial plan view showing the layout of a bipolar transistor of a semiconductor device according to a tenth embodiment of the invention.
Figure 13B:
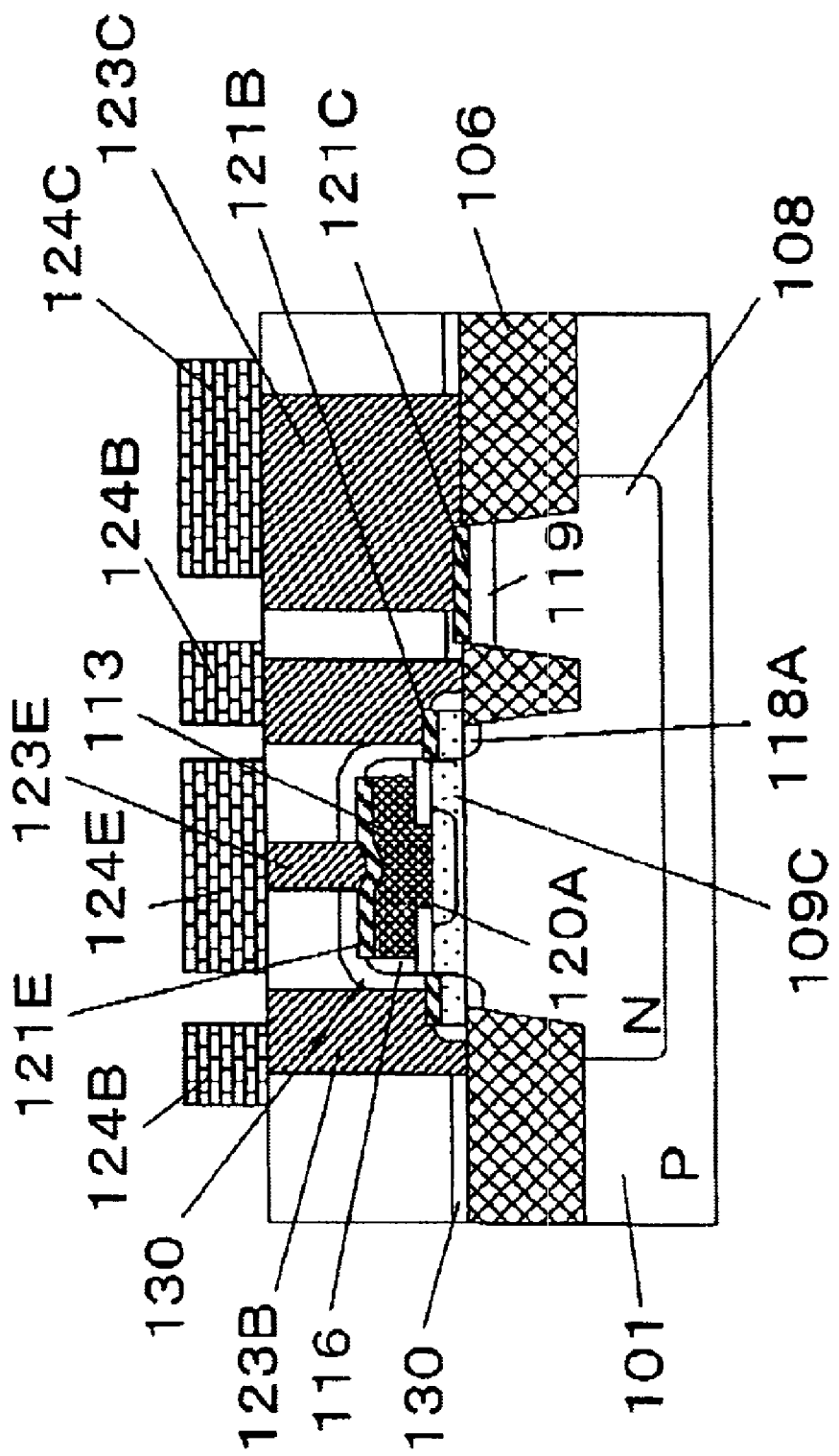
FIG. 13B is a partial, cross-sectional view along the line XIIIB—XIIIB in FIG. 11A, which shows the structure of the bipolar transistor according to the tenth embodiment of FIG. 13A.

FIGS. 13A and 13B show the structure of a semiconductor device with a bipolar transistor according to a tenth embodiment of the invention. FIG. 14E shows the structure of a BiCMOS semiconductor device according to an eleventh embodiment of the invention, which incorporates the bipolar transistor of the tenth embodiment.

As seen from FIG. 13A, the bipolar transistor of the tenth embodiment is the same in layout as that of the fourth embodiment of FIGS. 6A and 6B, except that the structure of the base/emitter region is different and that a single-crystal Si layer 109C is formed for the intrinsic base region.

As shown in FIG. 13B, the single-crystal Si layer 109C with a thickness of 20 to 500 nm, which is doped with a p-type dopant such as B and In at the concentration of $1 \times 10^{18}$ to $5 \times 10^{20}$, is formed on the well region 108. A heavily-doped, n-type diffusion region (i.e., an emitter region) 120 is formed in the layer 109C. An emitter extraction electrode 113 is formed to contact the emitter region 120 by way of a window of a $SiC_2$ layer 112. A dielectric sidewall 116, which is made of $SiO_2$, covers the side faces of the electrode 113. A $CoSi_2$ layer 121E is formed on the upper face of the electrode 113. A $CoSi_2$ layer 121B is formed on the upper face of the SiGe layer 109C. A $CoSi_2$ layer 121C is formed on the upper face of the collector extraction region 119.

A thin stopper dielectric layer 130, which is mad of $SiN_x$, is formed to cover the entire substrate 101. A thick interlayer dielectric layer 122, which is made of $SiO_2$, is formed on the layer 130 to cover the entire substrate 101. The layer 130 has an emitter contact hole that exposes the $CoSi_2$ layer 121E, six base contact holes that expose the $CoSi_2$ layer 121B, and three collector contact holes that expose the $CoSi_2$ layer 121C.

An emitter contact plug 123E is filled into the emitter contact hole. The whole bottom end of the plug 123E is contacted with the $CoSi_2$ layer 121E. The three collector contact plugs 123C are filled into the corresponding collector contact holes. The bottom end of each plug 123C is contacted with the $CoSi_2$ layer 121C at its left-side part. Six base contact plugs 123B are filled into the corresponding base contact holes. Three plugs 123B are extended in parallel outwardly from the near end of the Si layer 109B while the other three plugs 123B are extended in parallel outwardly from the opposite ends of the Si layer 109B. Almost all of each plug 123B is placed on the isolation oxide 106, which is contacted with the $CoSi_2$ layer 121B at its emitter-side end only. Thus, the contact area of the plug 123B with the $CoSi_2$ layer 121B is extremely small.

With the semiconductor device with the bipolar transistor of the tenth embodiment shown in FIGS. 13A and 13B, the same advantages as those in the sixth embodiment of FIGS. 8A and 8B are obtainable.

FIGS. 14A to 14E show a method of fabricating the BiCMOS semiconductor device of the eleventh embodiment. FIG. 14E shows the structure of this device.

Figure 14A:
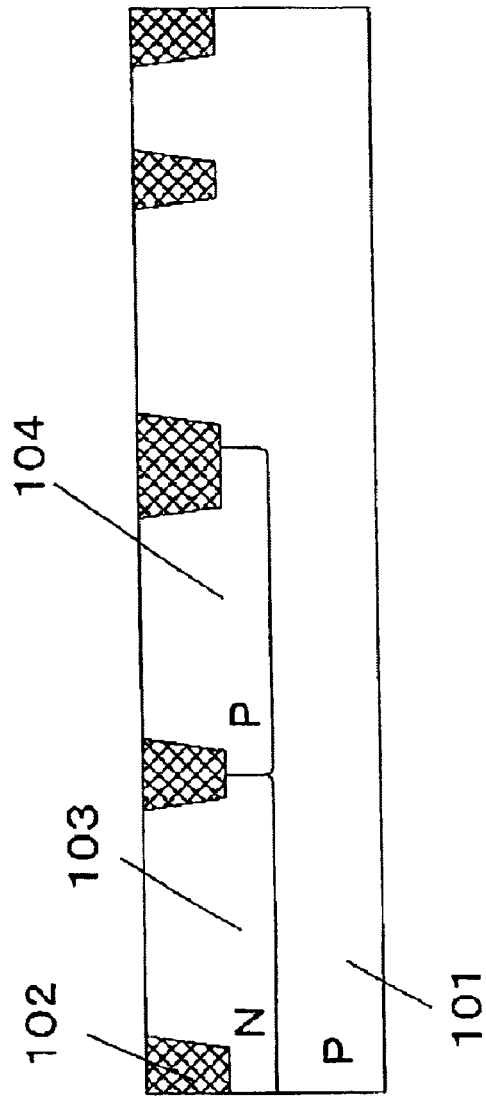
FIGS. 14A to 14E are partial cross-sectional view showing the process steps of a method of fabricating a semiconductor device according to an eleventh embodiment of the invention, respectively, in which the bipolar transistor according to the tenth embodiment is incorporated.

First, as shown in FIG. 14A, an isolation oxide 102 is formed on a p-type Si substrate 101. A p-type well 104 and a n-type well 103 are formed on the substrate 101 to be adjacent to each other.

Figure 14B:
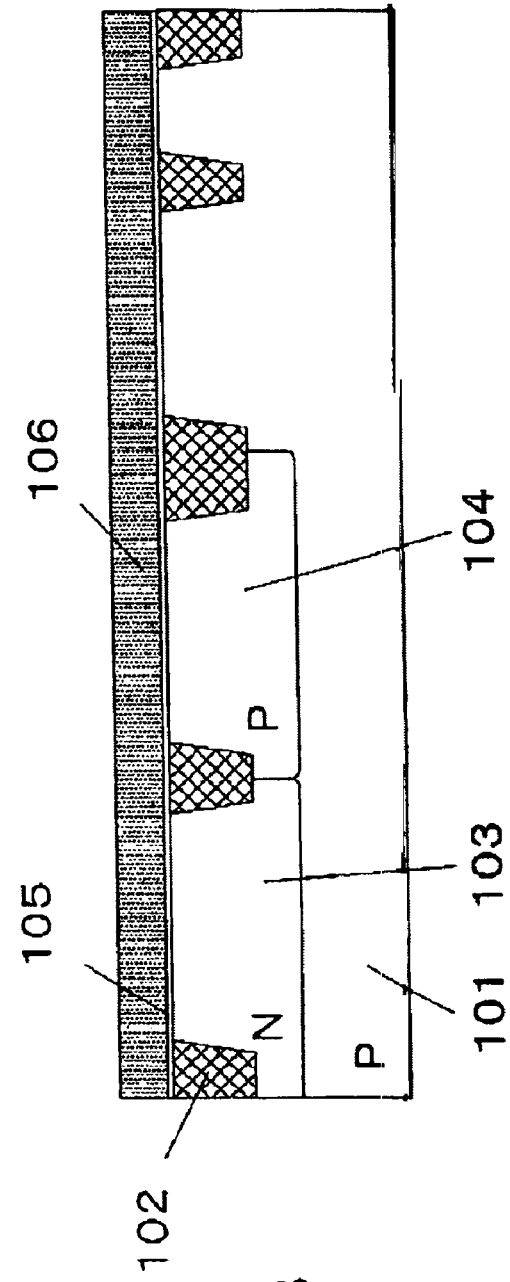

Next, as shown in FIG. 14B, a gate oxide layer 105 with a thickness of 2 to 4 nm is formed on the surface of the substrate 101. Then, a first conductive layer 106 with a thickness of 10 to 25 nm is formed on the layer 105. The layer 106 is made of, for example, amorphous silicon, polysilicon, or doped polysilicon with P, As or B.

These process steps are the same as those of the first embodiment shown in FIGS. 4A and 4B.

Figure 14C:
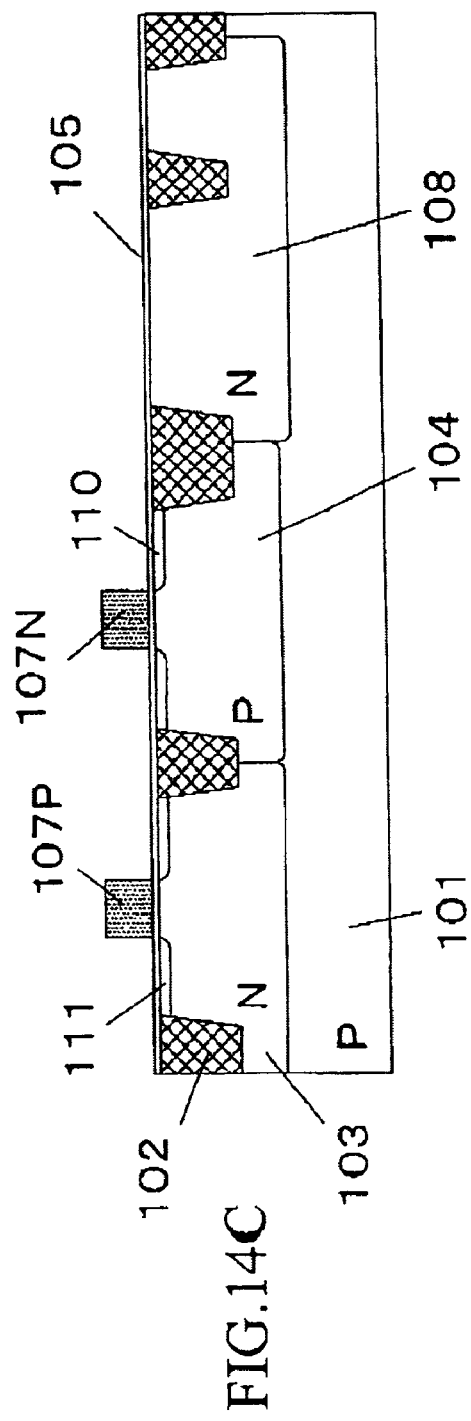

In the step of FIG. 14C, the first conductive layer 106 is patterned to form gate electrodes 107N and 107P on the p- and N-type well regions 104 an 103, respectively. By ion-implantation of a n-type dopant, a pair of n-type diffusion regions 110 is formed in the well 104 in self-alignment to the gate electrode 107N. Similarly, by ion-implantation of a p-type dopant, a pair of p-type diffusion regions 111 is formed in the well 103 in self-alignment to the gate electrode 107P. By ion-implantation of P at 400 to 1000 keV, a n-type well region 108 is formed to be adjacent to the p-type well 104. Unlike the step of FIG. 4C, the ion-implantation process for forming the intrinsic base region 109 and the diffusion region 109a is not carried out here.

Figure 14D:
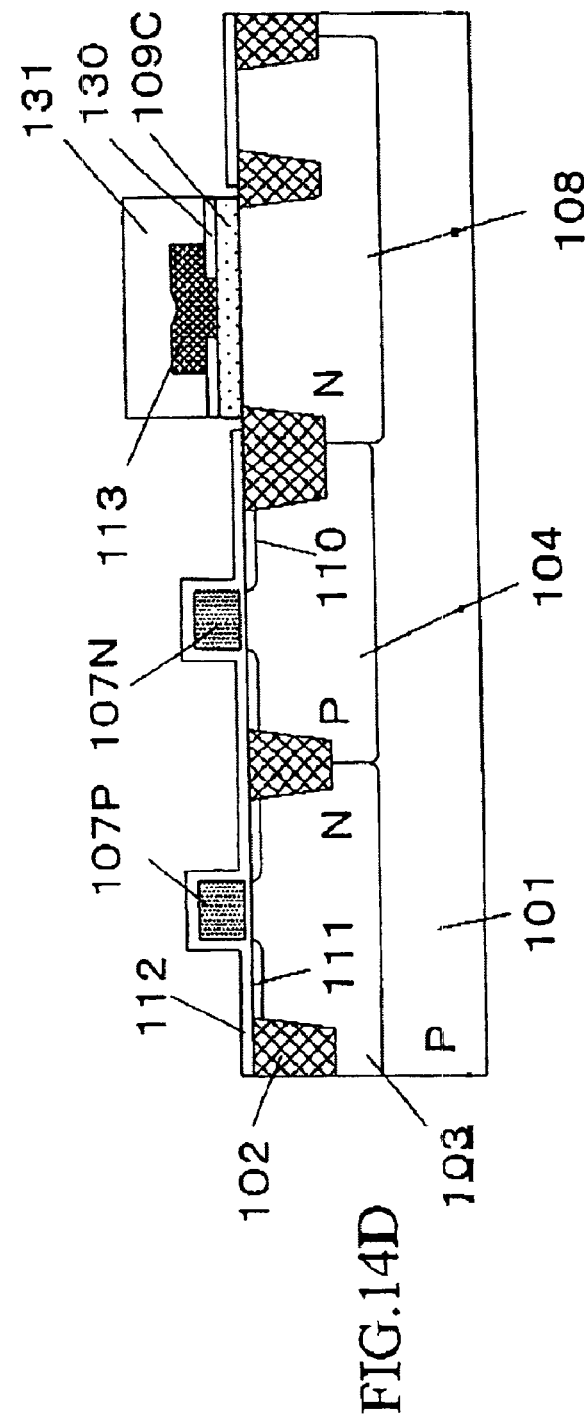
Figure 14E:
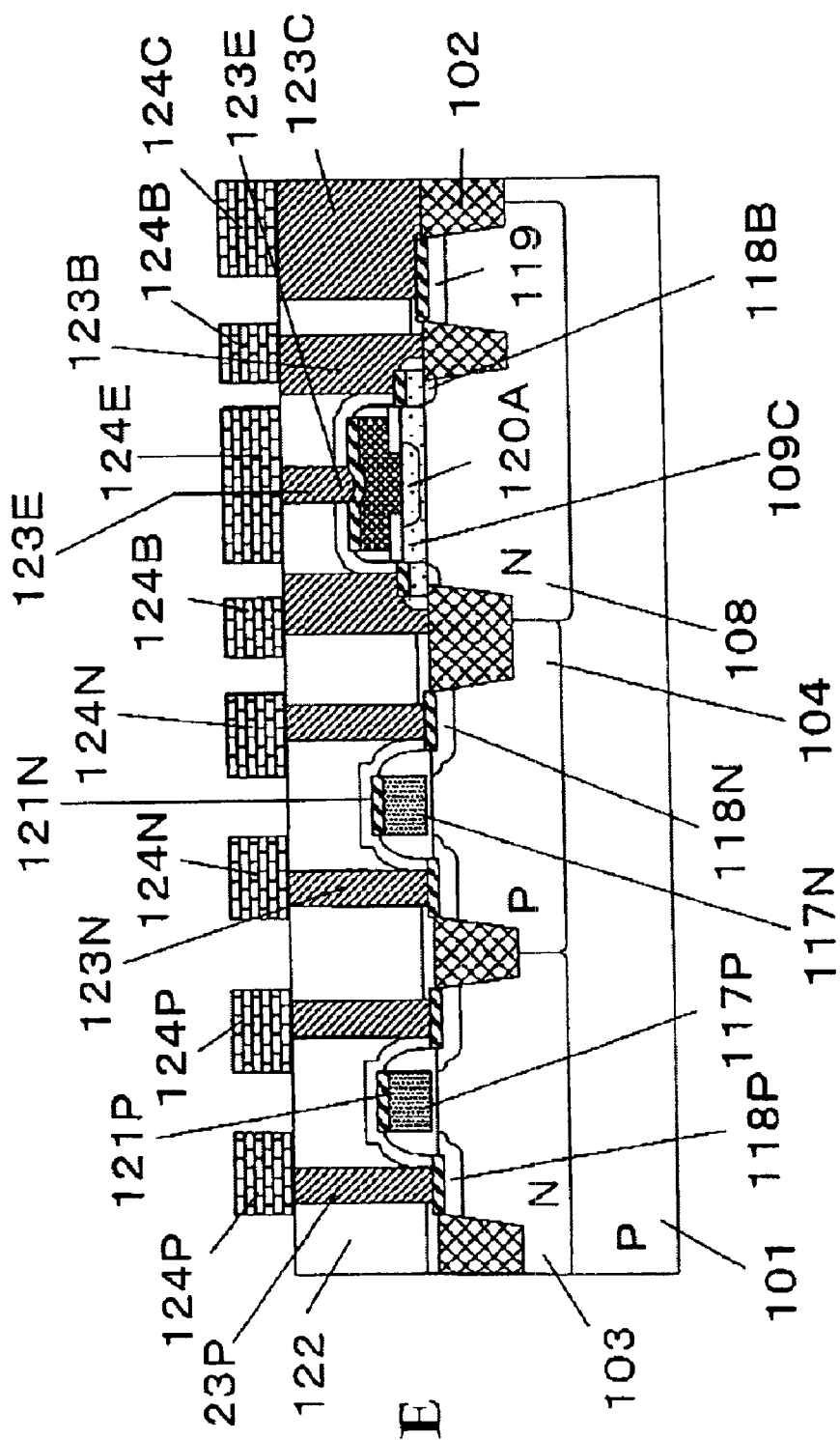

In the step of FIG. 14D, a first LDD oxide layer 112 with a thickness of 20 to 80 nm is formed on the surface of the substrate 101 to cover the gate electrodes 107N and 107P. A window is then formed in the layer 112 at a specific location for the intrinsic and graft base regions (i.e., the emitter/base region) by known photolithography and etching methods. Thus, the surface of the n-type well region 108 is selectively exposed from the layer 112.

Thereafter, the Si layer 109C is epitaxially grow over the whole substrate 101. The layer 109C is doped with a p-type dopant (e.g., B or In) at a concentration of $1 \times 10^{10}$ to $5 \times 10^{20}$ cm$^{-3}$. The layer 109C has a thickness of 20 to 100 nm. The dielectric layer 130 is formed on the Si layer 109C over the whole substrate 101. Thereafter, by using known photolithography and etching techniques, the dielectric layer 130 is selectively removed to form an emitter window that exposes the Si layer 109C.

A second conductive layer with a thickness of 150 to 300 nm, which is made of an amorphous Si, polysilicon, or a doped polysilicon with P, or As, is formed on the layer 130. This conductive layer is patterned by known photolithography and etching techniques using a patterned photoresist film 131, thereby forming the emitter extraction electrode 113. The intrinsic base region is formed by the Si layer 109C.

The subsequent steps are the same as those of the seventh embodiment of FIGS. 9E to 9I.

Although not shown in FIGS. 14D and 14E, the single-crystal Si layer 109C has a polycrystalline part at its periphery which is overlapped with the isolation dielectric 102.

In the step of forming the intrinsic base region, if the Si layer 109C is directly grown on the surface of the n-type well region 108, crystal defects are likely to occur because of the difference of crystal lattice size. If a relaxation layer, which is made of single-crystal Si doped with a n-type dopant and which has a thickness of 10 to 20 nm, is additionally provided between the Si layer 109C and the substrate 101, the occurrence of crystal defects is suppressed. Therefore, this method may be used for this purpose.

As seen from FIG. 14E, the BiCMOS semiconductor device of the eleventh embodiment comprises the BJT according to the tenth embodiment of FIGS. 13A and 13B and the PMOS and NMOS on the same substrate 101. Accordingly, with the semiconductor device of the eleventh embodiment, the same advantages as those in the seventh embodiment are obtainable.

There is an additional advantage that the parasitic capacitance of the base extraction section is reduced, because the Si layer 109C is selectively formed on the exposed surface of the n-type well region 108.

Moreover, if a SiGe or SiGe—C layer is formed n the Si substrate for the intrinsic base region, it is said that crystal defects are likely to occur due to the difference of crystal lattice size even if it is subjected to a heat-treatment process at 1000° C. or higher for a short time. However, none of SiGe and SiGe—C layers are used in this embodiment. Thus, such the problem as above does not occur.

Twelfth and Thirteenth Embodiments

Figure 15A:
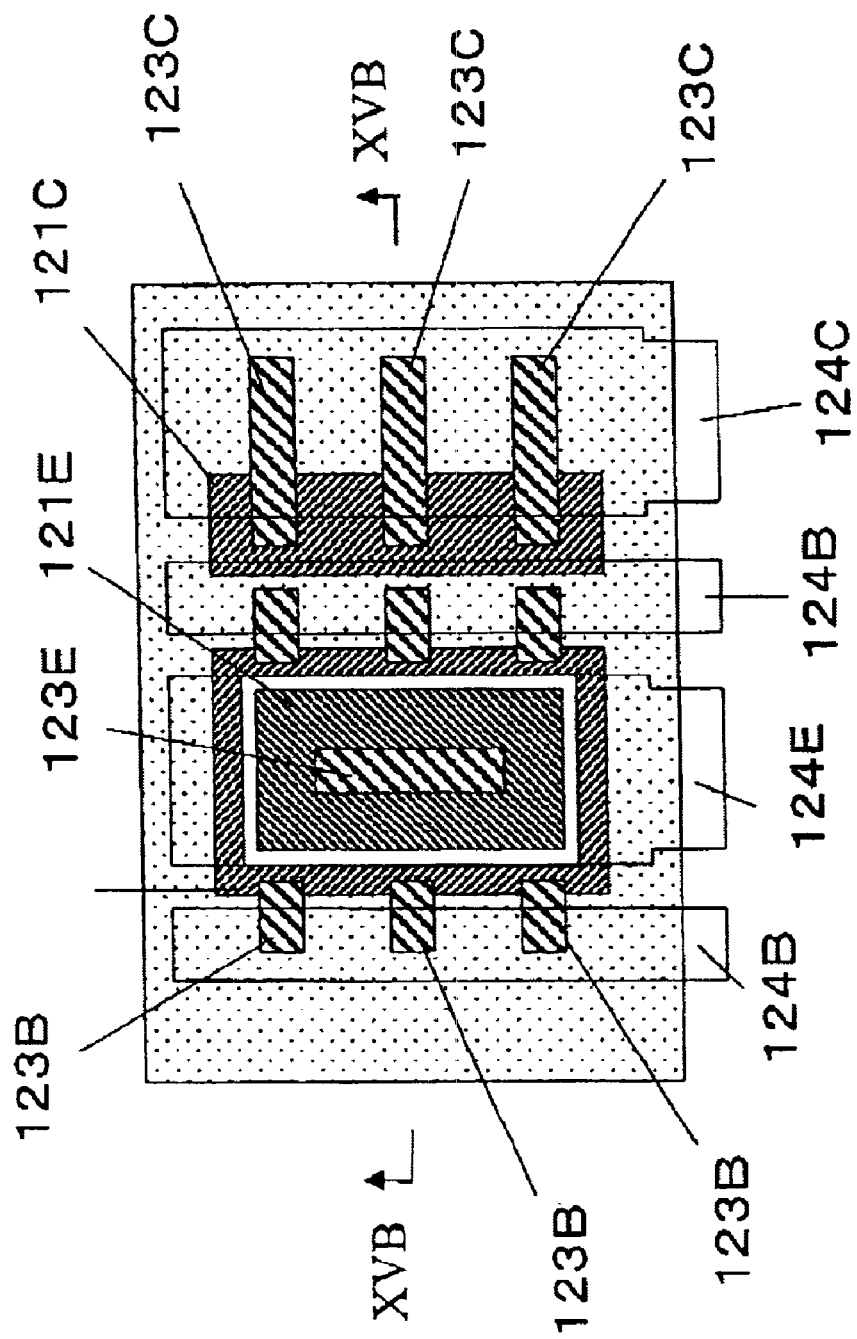
FIG. 15A is a partial plan view showing the layout of a bipolar transistor of a semiconductor device according to a twelfth embodiment of the invention.
Figure 15B:
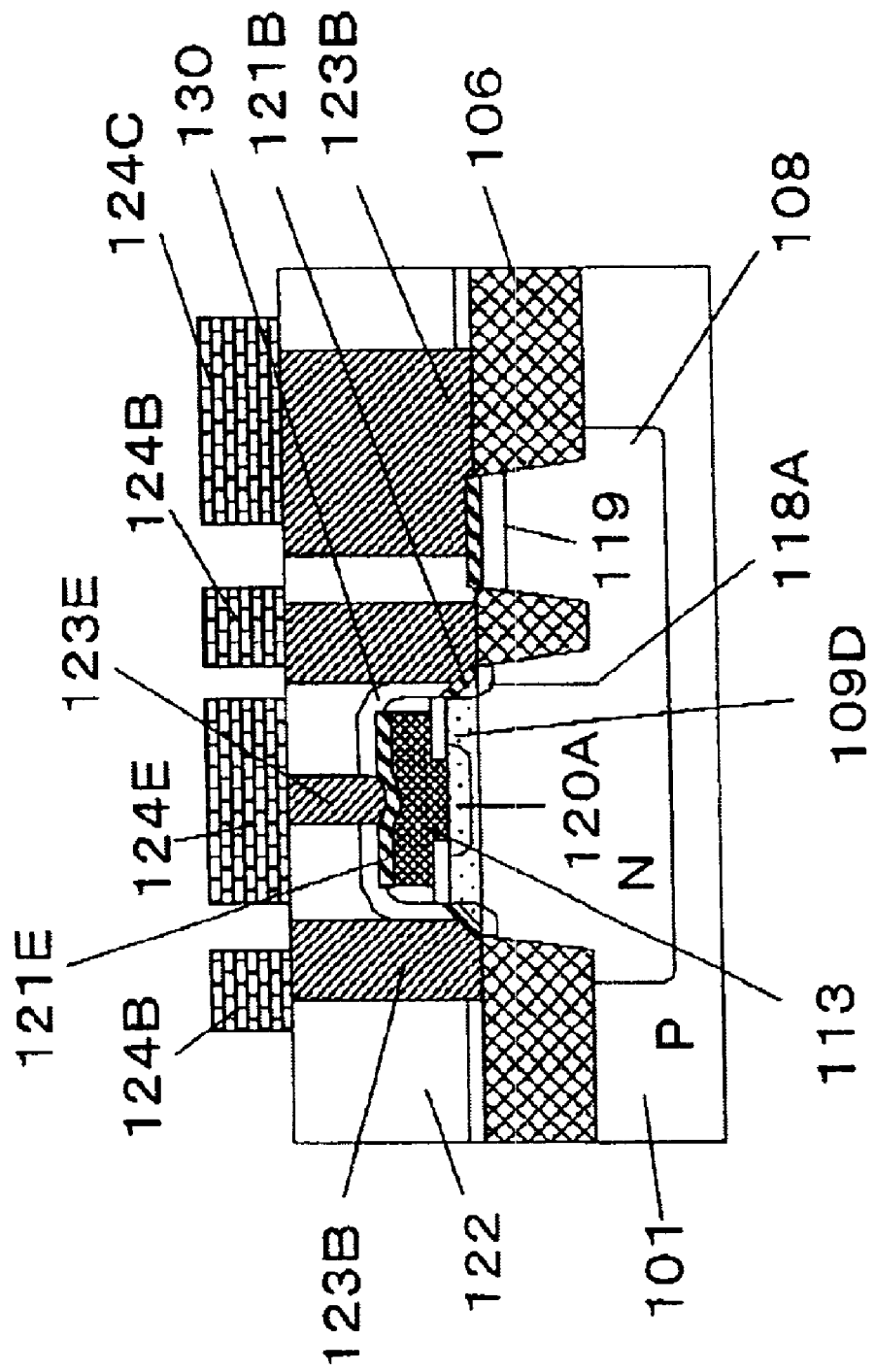
FIG. 15B is a partial, cross-sectional view along the line XVB—XVB in FIG. 15A, which shows the structure of the bipolar transistor according to the twelfth embodiment of FIG. 15A.

FIGS. 15A and 15B show the structure of a semiconductor device with a bipolar transistor according to a twelfth embodiment of the invention. FIG. 16E shows the structure of a BiCMOS semiconductor device according to a thirteenth embodiment of the invention, which incorporates the bipolar transistor of the twelfth embodiment.

As seen from FIG. 15A, the bipolar transistor of the twelfth embodiment is the same in layout as that of the fourth embodiment of FIGS. 6A and 6B, except that the structure of the base/emitter region is different and that a single-crystal Si layer 109D is formed for the intrinsic base region by selective epitaxial growth method.

As shown in FIG. 15B, the single-crystal Si layer 109D with a thickness of 20 to 500 nm, which is doped with a p-type dopant such as B and In at the concentration of $1 \times 10^{18}$ to $5 \times 10^{20}$, is formed on the well region 108. A heavily-doped, n-type diffusion region (i.e., an emitter region) 120 is formed in the layer 109D. An emitter extraction electrode 113 is formed to contact the emitter region 120 by way of a window of a $SiO_2$ layer 112. A dielectric sidewall 116, which is made of $SiO_2$, covers the side faces of the electrode 113. A $CoSi_2$ layer 121E is formed on the upper face of the electrode 113. A $CoSi_2$ layer 121B is formed on the facets of the Si layer 109D. A $CoSi_2$ layer 121C is formed on the upper face of the collector extraction region 119.

A thin stopper dielectric layer 130, which is mad of $SiN_x$, is formed to cover the entire substrate 101. A thick interlayer dielectric layer 122, which is made of $SiO_2$, is formed on the layer 130 to cover the entire substrate 101. The layer 130 has an emitter contact hole that exposes the $CoSi_2$ layer 121E, six base contact holes that expose the $CoSi_2$ layer 121B, and three collector contact holes that expose the $CoSi_2$ layer 121C.

An emitter contact plug 123E is filled into the emitter contact hole. The whole bottom end of the plug 123E is contacted with the $CoSi_2$ layer 121E. The three collector contact plugs 123C are filled into the corresponding collector contact holes. The bottom end of each plug 123C is contacted with the $CoSi_2$ layer 121C at its left-side part. Six base contact plugs 123B are filled into the corresponding base contact holes. Three plugs 123B are extended in parallel outwardly from the near end of the Si layer 109B while the other three plugs 123B are extended in parallel outwardly from the opposite ends of the Si layer 109B. Almost all of each plug 123B is placed on the isolation oxide 106, which is contacted with the $CoSi_2$ layer 121B at its emitter-side end only. Thus, the contact area of the plug 123B with the $CoSi_2$ layer 121B is extremely small.

With the semiconductor device with the bipolar transistor of the twelfth embodiment shown in FIGS. 15A and 15B, the same advantages as those in the sixth embodiment of FIGS. 8A and 8B are obtainable.

FIGS. 16A to 16E show a method of fabricating the BiCMOS semiconductor device of the thirteenth embodiment. FIG. 16E shows the structure of this device.

Figure 16A:
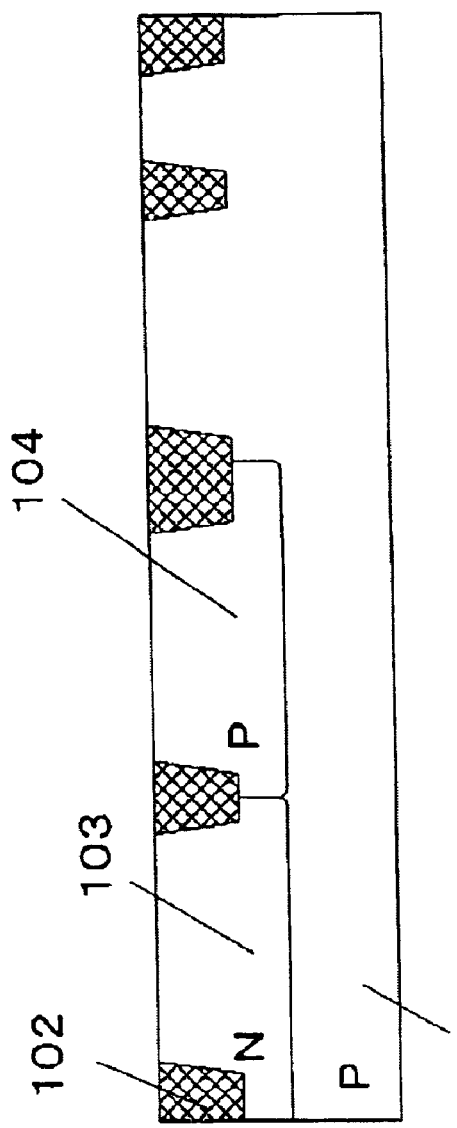
FIGS. 16A to 16E are partial cross-sectional views showing the process steps of a method of fabricating a semiconductor device according to a thirteenth embodiment of the invention, respectively, in which the bipolar transistor according to the twelfth embodiment is incorporated.

First, as shown in FIG. 16A, an isolation oxide 102 is formed on a p-type Si substrate 101. A p-type well 104 and a n-type well 103 are formed on the substrate 101 to be adjacent to each other.

Figure 16B:
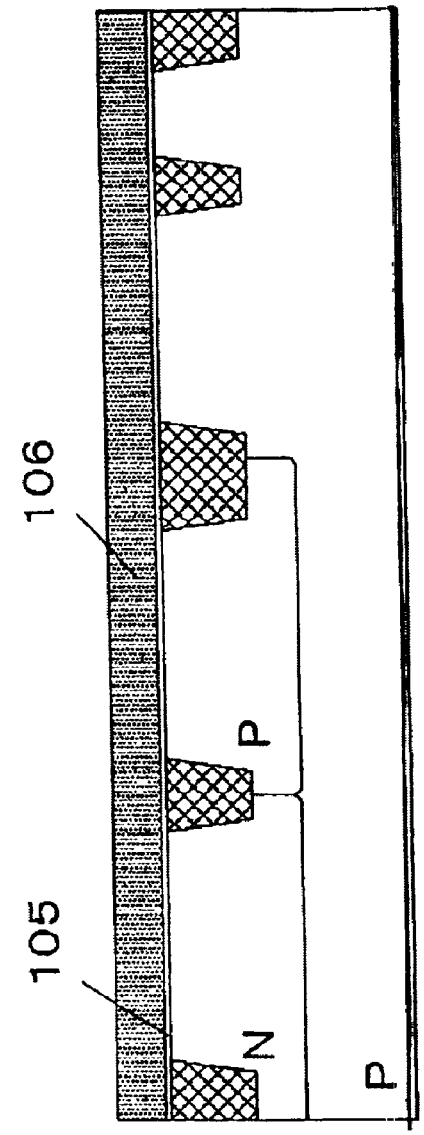

Next, as shown in FIG. 16B, a gate oxide layer 105 with a thickness of 2 to 4 nm is formed on the surface of the substrate 101. Then, a first conductive layer 106 with a thickness of 10 to 25 nm is formed on the layer 105. The layer 106 is made of, for example, amorphous silicon, polysilicon, or doped polysilicon with P, As or B.

These process steps are the same as those of the first embodiment shown in FIGS. 4A and 4B.

Figure 16C:
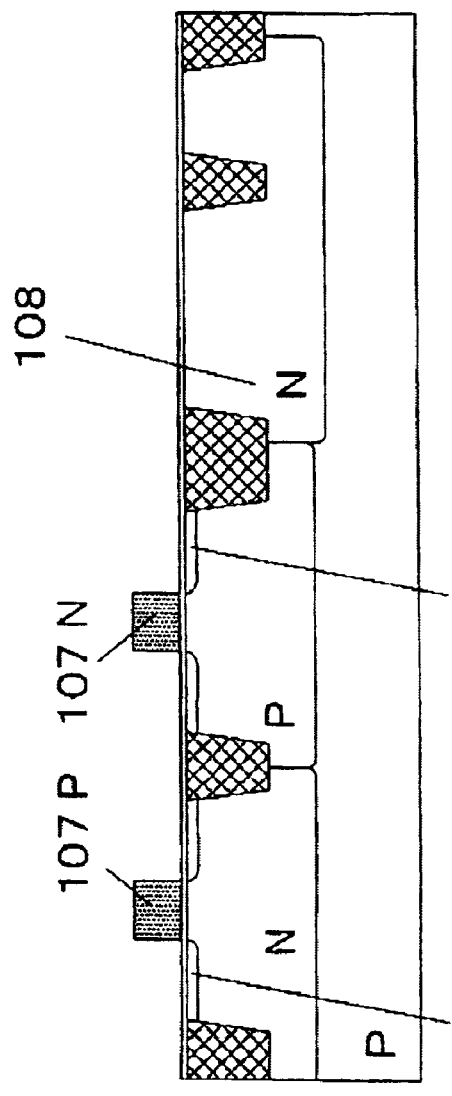

In the step of FIG. 16C, the first conductive layer 106 is patterned to form gate electrodes 107N and 107P on the p- and N-type well regions 104 an 103, respectively. By ion-implantation of a n-type dopant, a pair of n-type diffusion regions 110 is formed in the well 104 in self-alignment to the gate electrode 107N. Similarly, by ion-implantation of a p-type dopant, a pair of p-type diffusion regions 111 is formed in the well 103 in self-alignment to the gate electrode 107P. By ion-implantation of P at 400 to 1000 keV, a n-type well region 108 is formed to be adjacent to the p-type well 104. Unlike the step of FIG. 4C, the ion-implantation process for forming the intrinsic base region 109 and the diffusion region 109a is not carried out here.

Figure 16D:
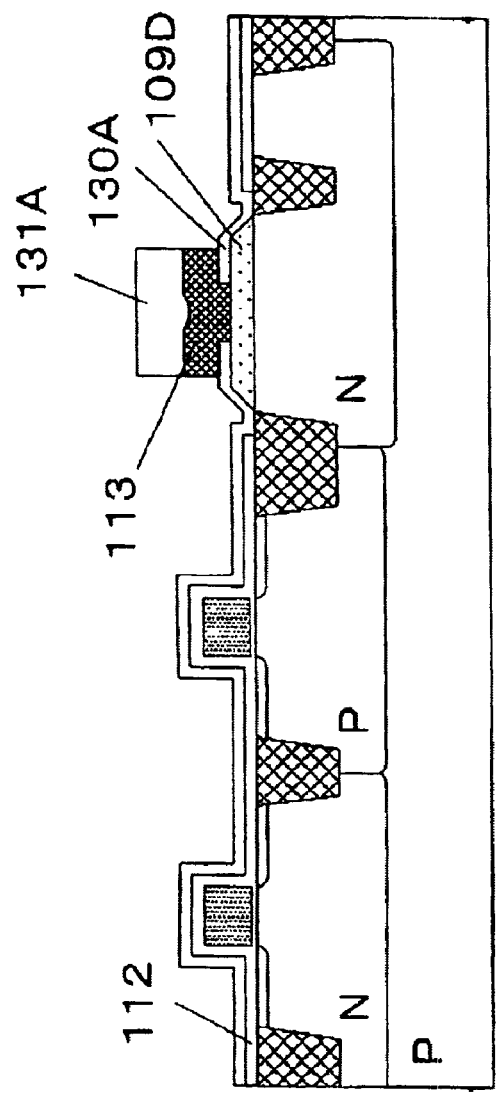
Figure 16E:
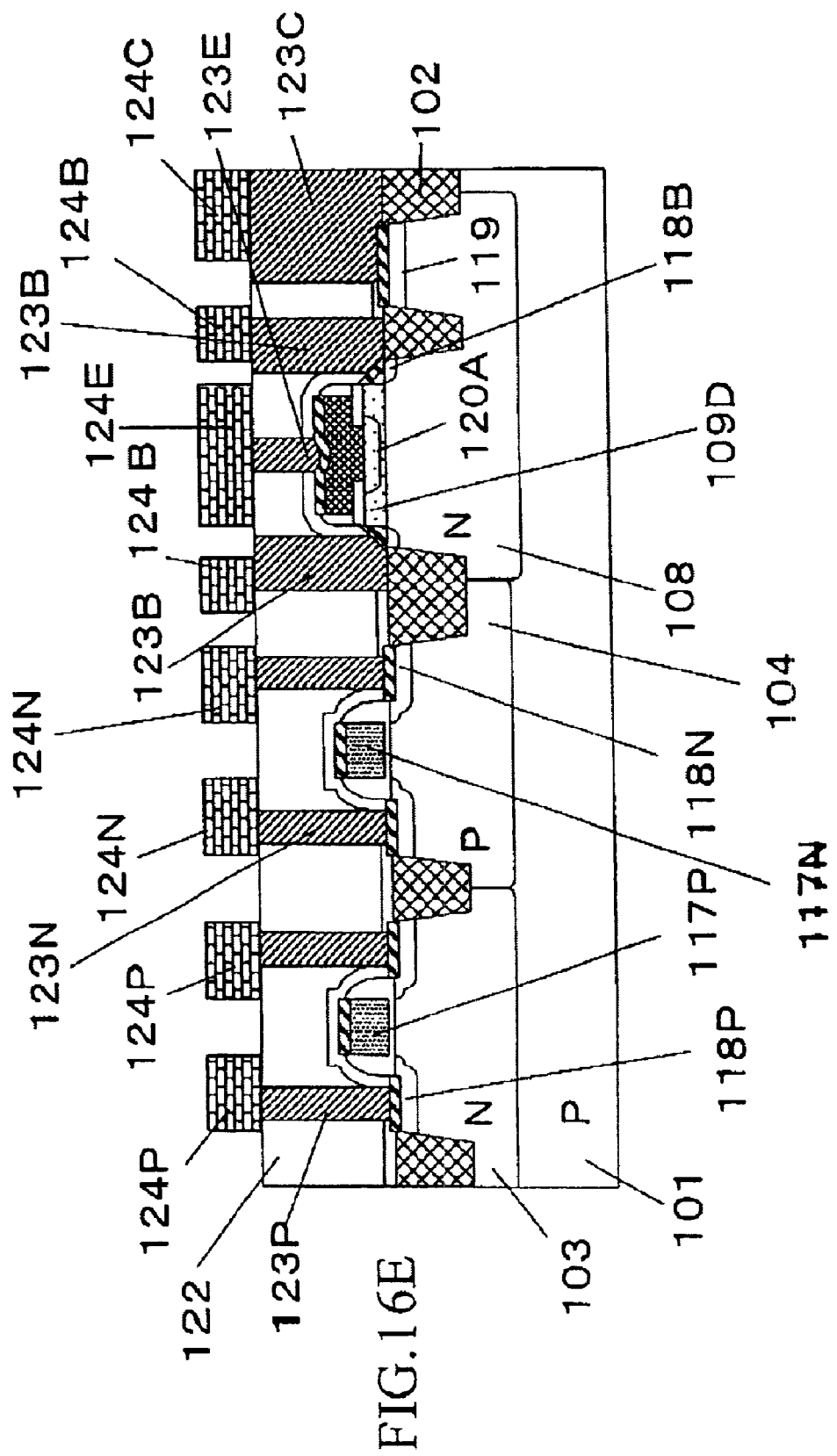

In the step of FIG. 16D, a first LDD oxide layer 112 with a thickness of 20 to 80 nm is formed on the surface of the substrate 101 to cover the gate electrodes 107N and 107P. A window is then formed in the layer 112 at a specific location for the intrinsic and graft base regions 109D and 118A (i.e., the emitter/base region) by known photolithography and etching methods. Thus, the surface of the n-type well region 108 is selectively exposed from the layer 112.

Thereafter, the Si layer 109D is epitaxially grow over the whole substrate 101. The layer 109D is doped with a p-type dopant (e.g., B or In) at a concentration of $1 \times 10^{18}$ to $5 \times 10^{20}$ cm$^{-3}$. The layer 109D has a thickness of 20 to 100 nm. The dielectric layer 130 is formed on the Si layer 109D over the whole substrate 101. Thereafter, by using known photolithography and etching techniques, the dielectric layer 130 is selectively removed to form as emitter window that exposes the Si layer 109D.

A second conductive layer with a thickness of 150 to 300 nm, which is made of an amorphous Si, polysilicon, or a doped polysilicon with P, or As, is formed on the layer 130. This conductive layer is patterned by known photolithography and etching techniques using a patterned photoresist film 131, thereby forming the emitter extraction electrode 113. The intrinsic base region is formed by the Si layer 109D.

The subsequent steps are the same as those of the seventh embodiment of FIGS. 9E to 9I.

As seen from FIG. 16E, the BiCMOS semiconductor device of the eleventh embodiment comprises the BJT according to the twelfth embodiment of FIGS. 15A and 15B and the PMOS and NMOS on the same substrate 101. Accordingly, with the semiconductor device of the thirteenth embodiment, the same advantages as those in the seventh embodiment are obtainable.

There is an additional advantage that the parasitic capacitance of the base extraction section is reduced, because the Si layer 109D is selectively formed on the exposed surface of the n-type well region 108.

Moreover, since none of SiGe and SiGe—C layers are used in this embodiment, the problem that crystal defects are likely to occur due to the difference of crystal lattice size even if it is subjected to a heat-treatment process at 1000° C. or higher for a short time does not occur.

Variations

Needless to say, the present invention is not limited to the above-described embodiments. Any change or modification may be added to them within the spirit of the invention. For example, the layout pattern of the contact plugs and wiring lines can be changed optionally.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A semiconductor device with a bipolar transistor, comprising:

(a) a semiconductor substrate;

(b) an isolation dielectric formed on the substrate to define a transistor section for a bipolar transistor;

the transistor section being divided into an emitter/base subsection and a collector extraction subsection by the isolation dielectric;

(c) an intrinsic base region formed in the emitter/base subsection;

(d) a graft base region formed in the emitter/base subsection;

the graft base region being contacted with the isolation dielectric;

(e) an emitter region formed in the emitter/base subsection to overlap with the intrinsic base region;

(f) a collector extraction region formed in the collector extraction subsection;

(g) a stopper dielectric layer formed on the substrate to cover the transistor section and the isolation dielectric; and (h) an interlayer dielectric layer formed on the stopper dielectric layer to cover the transistor section and the isolation dielectric;

the interlayer dielectric layer having an emitter contact plug for electrical connection to the emitter region, a base contact plug for electrical connection to the graft base region, and a collector contact plug for electrical connection to the collector extraction region;

the base contact plug being located over the isolation dielectric in such a way as to contact the graft base region near its bottom end corner.

2. The device according to claim 1, wherein a n-channel MOEFET and a p-channel MOSFET are additionally provided on the substrate, thereby forming the BiCMOS configuration.

3. The device according to claim 1, wherein an additional base contact plug is formed in the interlayer dielectric layer in such a way as to be apart from the base contact plug.

4. The device according to claim 1, wherein the base contact plug has an elongated plan shape extending in a first direction and the emitter contact plug has an elongated plan shape extending in a second direction different from the first direction.

5. The device according to claim 4, wherein the base contact plug is approximately perpendicular to the emitter contact plug.

6. The device according to claim 1, wherein an additional base contact plug is formed in the interlayer dielectric layer between the emitter contact plug and the collector contact plug.

7. The device according to claim 1, wherein the base contact plug has a plan shape like E.

8. The device according to claim 1, wherein the intrinsic base region is formed in a single-crystal Si layer.

9. The device according to claim 1, wherein the intrinsic base region is formed in a combination of a SiGe layer and a single-crystal Si layer.

10. The device according to claim 1, wherein the base contact plug is connected with the graft base region by way of a metal silicide layer.

* * * * *